(12) United States Patent
Turner et al.

(10) Patent No.: US 11,519,989 B2
(45) Date of Patent: Dec. 6, 2022

(54) HIGH-RESOLUTION MAGNETIC FIELD FINGERPRINTING OF INTEGRATED CIRCUIT ACTIVITY WITH A QUANTUM DIAMOND MICROSCOPE

(71) Applicants: President and Fellows of Harvard College, Cambridge, MA (US); The MITRE Corporation, Bedford, MA (US)

(72) Inventors: Matthew James Turner, Cambridge, MA (US); Edlyn Victoria Levine, Bedford, MA (US); Pauli Kehayias, Albuquerque, NM (US); Daniel T. Walters, Bedford, MA (US); Ronald L. Walsworth, Cambridge, MA (US); Marko Loncar, Cambridge, MA (US); Nicholas Ryan Langellier, Cambridge, MA (US)

(73) Assignees: The MITRE Corporation, McLean, VA (US); President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 17/163,476

(22) Filed: Jan. 31, 2021

(65) Prior Publication Data
US 2021/0239779 A1 Aug. 5, 2021

Related U.S. Application Data

(60) Provisional application No. 63/032,026, filed on May 29, 2020, provisional application No. 62/968,109, filed on Jan. 30, 2020.

(51) Int. Cl.
*G01R 33/389* (2006.01)
*G01R 33/56* (2006.01)
*G01R 33/00* (2006.01)

(52) U.S. Cl.
CPC ..... *G01R 33/5608* (2013.01); *G01R 33/0017* (2013.01); *G01R 33/389* (2013.01)

(58) Field of Classification Search
CPC .............. G01R 33/543; G01R 33/5608; G01R 33/4828; G01R 33/3415; G01R 33/283;
(Continued)

(56) References Cited

U.S. PATENT DOCUMENTS

2011/0062957 A1* 3/2011 Fu ........................ G01N 24/088
324/307
2016/0313408 A1* 10/2016 Hatano ................ G01R 33/032
(Continued)

*Primary Examiner* — Jermele M Hollington
*Assistant Examiner* — Taqi R Nasir
(74) *Attorney, Agent, or Firm* — Morrison & Foerster LLP

(57) ABSTRACT

Devices for determining a state of a magnetic field-generating article are provided. In various embodiments, a device comprises: a single crystal diamond having a plurality of NV centers, the single crystal diamond configured to be disposed adjacent to a magnetic field-generating article, and configured to generate a fluorescent signal in response to being illuminated by a light source; a coherent light source configured to generate a light beam directed at the single crystal diamond; a microwave (MW) radiation source configured to irradiate the single crystal diamond with a MW signal; a magnetic field source configured to apply a bias magnetic field to the single crystal diamond; a photosensor configured to collect the fluorescent signal generated by the single crystal diamond; and a computing node operatively coupled to each of the coherent light source, the MW radiation source, the magnetic field source, and the photosensor.

64 Claims, 43 Drawing Sheets

(58) Field of Classification Search
CPC .... G01R 33/307; G01R 33/60; G01R 33/282; G01R 33/302; G01R 33/305; G01R 33/5605; G01V 3/32; E21B 49/08; E21B 2049/085; G01N 24/10; A61K 49/1833
See application file for complete search history.

(56) References Cited

U.S. PATENT DOCUMENTS

2016/0356863 A1\* 12/2016 Boesch .................. G05D 1/101
2018/0284026 A1    10/2018 Shao et al.

\* cited by examiner

Fig. 2

HIGH-RESOLUTION MAGNETIC FIELD FINGERPRINTING OF INTEGRATED CIRCUIT ACTIVITY WITH A QUANTUM DIAMOND MICROSCOPE

CROSS-REFERENCE TO RELATED APPLICATIONS

This application claims the priority of U.S. Provisional Application No. 62/968,809, filed Jan. 31, 2020, and to U.S. Provisional Application No. 63/032,026, filed May 29, 2020, the entire contents of each of which are incorporated herein by reference.

STATEMENT REGARDING FEDERALLY SPONSORED RESEARCH OR DEVELOPMENT

This invention was made under government support under DE-NA0003525 awarded by the U.S. Department of Energy. The government has certain rights in the invention.

FIELD OF THE DISCLOSURE

Embodiments of the present disclosure relate to quantum diamond microscopy, and more specifically, to high-resolution magnetic field fingerprinting of integrated circuit activity with a quantum diamond microscope (QDM).

BACKGROUND OF THE DISCLOSURE

Advanced diagnostics for integrated circuit (IC) analysis are important for applications ranging from design validation, identification, security, and failure analysis. Assurance of the security, identification, and function of ICs is of critical importance due to the pervasiveness of ICs in all modern electronics, ranging from critical civilian and military infrastructure, information technology systems, and the internet of things. Rising security concerns range from supply chain risk management (SCRM), physical protection of cryptographic information, and analysis of failures (e.g., failures occurring during manufacture of integrated circuits).

Achieving assurance of IC security and performance is becoming increasingly difficult due the globalization of the semiconductor industry, as well as the growing complexity of ICs themselves. Industry and supply chain offshoring has resulted in a complex network of IC design shops, foundries (fabs), assembly and testing plants, and second hand market players that contribute to the manufacture and distribution of ICs, making complete oversight impossible. The health and proper function of an IC is therefore dependent on post-fabrication analysis techniques. These techniques afford additional protection of ICs from functional attacks that leverage side channels, fault injections, and malware, and can also be used for forensic means to discover failures. However, the efficacy of these techniques is challenged by the growing complexity of integrated circuits, including the diminution of IC feature size, growth of transistor densities, and advancements in packaging technologies, necessitating increasing sensitivities and spatial resolutions of diagnostic tools.

BRIEF SUMMARY OF THE DISCLOSURE

According to embodiments of the present disclosure, devices for determining a state of a magnetic field-generating article are provided. In various embodiments, a device comprises: a single crystal diamond having a plurality of nitrogen vacancy (NV) centers, the single crystal diamond configured to be disposed adjacent to a magnetic field-generating article, and configured to generate a fluorescent signal in response to being illuminated by a light source; a coherent light source configured to generate a light beam directed at the single crystal diamond; a microwave (MW) radiation source configured to irradiate the single crystal diamond with a MW signal; a magnetic field source configured to apply a bias magnetic field to the single crystal diamond; a photosensor configured to collect the fluorescent signal generated by the single crystal diamond; and a computing node operatively coupled to each of the coherent light source, the MW radiation source, the magnetic field source, and the photosensor. The computing node is configured to sweep at least one control parameter selected from: the MW signal power, MW signal frequency, MW signal duration, or the strength of the bias magnetic field; based on the control parameters and the fluorescent signal generated by the single crystal diamond, compute the magnetic vector field of the magnetic field-generating article; and provide the magnetic vector field to a trained classifier and receive therefrom a state of the magnetic field-generating article.

In some embodiments, the coherent light source is pulsed, and the computing node is configured to vary the coherent source pulse duration.

In some embodiments, the magnetic field-generating article comprises an integrated circuit. In some embodiments, the integrated circuit is decapsulated. In some embodiments, the state comprises a number of active ring oscillators of the integrated circuit.

In some embodiments, the trained classifier comprises a Support Vector Machine (SVM). In some embodiments, the trained classifier comprises a convolutional neural network. In some embodiments, the computing node is further configured to perform dimensionality reduction of the magnetic vector field. In some embodiments, performing dimensionality reduction comprises principal component analysis (PCA).

In some embodiments, determining the state of the integrated circuit further comprises providing linewidth, contrast, and/or temperature of the integrated circuit to the trained classifier.

According to embodiments of the present disclosure, methods of and computer program products for determining a state of a magnetic field-generating article are provided. In various embodiments, a single crystal diamond having a plurality of NV centers is disposed adjacent to a magnetic field-generating article, the single crystal diamond being configured to generate a fluorescent signal in response to being illuminated by a light source, wherein the magnetic field-generating article comprises an integrated circuit. A light beam is directed from a coherent light source to the single crystal diamond. The single crystal diamond is irradiated with a microwave (MW) signal from a MW radiation source. A bias magnetic field is applied to the single crystal diamond from a magnetic field source. The fluorescent signal generated by the single crystal diamond is collected by a photosensor. At least one control parameter is swept, selected from: the MW signal power, MW signal frequency, MW signal duration, or the strength of the bias magnetic field. Based on the control parameters and the fluorescent signal generated by the single crystal diamond, the magnetic vector field of the magnetic field-generating article is computed. The magnetic vector field is provided to a trained classifier and a state of the magnetic field-generating article is received therefrom.

In some embodiments, the coherent light source is pulsed, and the computing node is configured to vary the coherent source pulse duration.

In some embodiments, the magnetic field-generating article comprises an integrated circuit. In some embodiments, the integrated circuit is decapsulated. In some embodiments, the state comprises a number of active ring oscillators of the integrated circuit.

In some embodiments, the trained classifier comprises an SVM. In some embodiments, the trained classifier comprises a convolutional neural network. In some embodiments, dimensionality reduction of the magnetic vector field is performed. In some embodiments, performing dimensionality reduction comprises PCA.

In some embodiments, determining the state of the integrated circuit further comprises providing linewidth, contrast, and/or temperature of the integrated circuit to the trained classifier.

In some embodiments, a first device is provided, the first device comprising: a single crystal diamond having a plurality of NV centers, the single crystal diamond configured to be disposed adjacent to a magnetic field-generating article, and configured to generate a fluorescent signal in response to being illuminated by a light source; a coherent light source configured to generate a light beam directed at the single crystal diamond; a microwave (MW) radiation source configured to irradiate the single crystal diamond with a MW signal; a magnetic field source configured to apply a bias magnetic field to the single crystal diamond; a photosensor configured to collect the fluorescent signal generated by the single crystal diamond; a computing node operatively coupled to each of the coherent light source, the MW radiation source, the magnetic field source, and the photosensor, the computing node configured to: sweep at least one control parameter selected from: the MW signal power, MW signal frequency, MW signal duration, or the strength of the bias magnetic field, and based on the control parameters and the fluorescent signal generated by the single crystal diamond, compute the magnetic vector field of the magnetic field-generating article.

In some embodiments of the first device, the coherent light source is pulsed, and the computing node is configured to vary the coherent source pulse duration.

In some embodiments of the first device, the magnetic field-generating article comprises an integrated circuit.

In some embodiments of the first device, the integrated circuit is decapsulated.

In some embodiments of the first device, the computing node is further configured to perform dimensionality reduction of the magnetic vector field.

In some embodiments of the first device, performing dimensionality reduction comprises PCA.

In some embodiments of the first device, the state comprises a number of active ring oscillators of the integrated circuit.

In some embodiments of the first device, an incidence angle of the light beam on the single crystal diamond causes total internal reflection of the light beam within the single crystal diamond.

In some embodiments of the first device, a power of the coherent light source is selected so as to saturate the photosensor.

In some embodiments of the first device: a polarization of the coherent light source is aligned with a predefined NV crystal axis of the single crystal diamond; and the computing node is configured to monitor a single resonance.

In some embodiments of the first device: a polarization of the coherent light source is configured to be equalized across a plurality of crystal axes of the single crystal diamond; and the computing node is configured to monitor the plurality of crystal axes for vector measurements.

In some embodiments of the first device, the light beam is shaped by a flat-top beam shaper.

In some embodiments of the first device, the microwave radiation source is configured to modulate the MW signal to provide robustness to external noise.

In some embodiments of the first device, the microwave radiation source is configured to simultaneously drive multiple MW frequencies.

In some embodiments of the first device, the multiple MW frequencies are selected based on spacing of NV resonances of the single crystal diamond.

In some embodiments of the first device, the MW signal has a frequency of greater than or equal to 2 GHz and less than or equal to 4 GHz.

In some embodiments of the first device, the magnetic field source comprises a permanent magnet.

In some embodiments of the first device, the permanent magnet is configured to project the bias magnetic field onto each of a plurality of NV axes of the single crystal diamond in a different respective direction for each of the NV axes.

In some embodiments of the first device, the bias magnetic field has a strength of greater than or equal to 1 mT and less than or equal to 100 mT.

In some embodiments of the first device, the magnetic field source comprises a Helmholtz coil.

In some embodiments of the first device, the computing node is configured to differentiate a ferromagnetic component of the magnetic vector field of the magnetic field-generating article from a paramagnetic component of the magnetic vector field of the magnetic field-generating article.

In some embodiments of the first device, the photosensor is configured to detect wavelengths in a range of greater than or equal to 600 nm and less than or equal to 800 nm.

In some embodiments of the first device, the photosensor has a sampling rate of greater than or equal to 10 MHz and less than or equal to 100 MHz.

In some embodiments of the first device, the photosensor comprises one or more selected from the group of: a CMOS, a CCD, a photodiode array, and a single photodiode.

In some embodiments of the first device, the single crystal diamond comprises an NV layer having a thickness of less than or equal to 100 nm.

In some embodiments of the first device, the single crystal diamond has a footprint of greater than or equal to 4 mm by 4 mm.

In some embodiments of the first device, the single crystal diamond has a footprint of less than or equal to 100 µm by 100 µm.

In some embodiments of the first device, the single crystal diamond comprises an NV layer comprising Nitrogen-15.

In some embodiments of the first device, the single crystal diamond comprises Carbon-12.

In some embodiments of the first device, the single crystal diamond is configured to be disposed in contact with the magnetic field-generating article.

In some embodiments of the first device, the single crystal diamond is configured to be disposed spaced apart from the magnetic field-generating article.

In some embodiments of the first device, the single crystal diamond is disposed in a movable mount configured to move the single crystal diamond through a plurality of positions adjacent the magnetic field-generating article.

In some embodiments of the first device, the single crystal diamond has a ppm of NV of greater than or equal to 0.1 and less than or equal to 10.

In some embodiments of the first device, the single crystal diamond has a fractional lattice strain of less than or equal to 0.000001.

In some embodiments of the first device, the computing node is configured to sweep at least one of the control parameters selected from the group: environmental temperature of the device and environmental humidity of the device.

In some embodiments of the first device, the computing node is configured to sweep one or more control parameters selected from the group: a position of the single crystal diamond relative to the magnetic field-generating article and an orientation of the single crystal diamond relative to the magnetic field-generating article.

In some embodiments of the first device, the computing node is configured to sweep one or more control parameters selected from the group: an intensity of the light beam, a wavelength of the light beam, a beam shape of the light beam, a spot size of the light beam, a duration of the light beam, and an angle of incidence of the light beam.

In some embodiments of the first device, the computing node is configured to sweep one or more control parameters selected from the group: a direction of the bias magnetic field a temporal pattern of the bias magnetic field.

In some embodiments of the first device, the computing node is configured to sweep one or more control parameters selected from the group: photosensor gain, photosensor position, photosensor orientation, photosensor exposure time, photosensor temporal exposure pattern, photosensor sensitivity, and photosensor spectral range.

In some embodiments of the first device: the magnetic field-generating article comprises an integrated circuit; and the computing node is configured to cause the integrated circuit to execute a computer program.

In some embodiments of the first device, the computing node is configured to cause a predefined current to be passed through one or more wires of the magnetic field-generating article.

In some embodiments of the first device, the sweeping of at least one of the control parameters by the computing node is performed in accordance with one or more measurement protocols selected from the group: CW ODMR, pulsed ODMR, Ramsey, Hahn echo, Dynamical decoupling, Rabi, and T1 relaxometry.

In some embodiments of the first device, the computing node is further configured to provide to the magnetic vector field of the magnetic field-generating article to an algorithm and receive therefrom a state of the magnetic field-generating article.

In some embodiments of the first device, the state of the magnetic field-generating article comprises an indication of one or more selected from the group: whether the magnetic field-generating article was in an operating state during the time the fluorescent signal was collected, an identity of the magnetic field-generating article, whether the magnetic field-generating article has been tampered with following fabrication, whether the magnetic field-generating article matches a predetermined profile within a predefined tolerance; information processed by the magnetic field-generating article during the time the time the fluorescent signal was collected, materials with which the magnetic field-generating article is fabricated, and whether one or more defects are present in the magnetic field-generating article.

In some embodiments of the first device, the algorithm comprises one or more selected from the group: a trained classifier, a convolutional neural network, a principal component analysis algorithm, and a support vector machine model.

In some embodiments of the first device, the computing node is further configured to provide temperature data pertaining to the magnetic field-generating article to the algorithm.

In some embodiments of the first device, the computing node is further configured to provide data representing the fluorescent signal to the algorithm.

In some embodiments of the first device, the computing node is further configured to provide data representing the structure of the magnetic field-generating article to the algorithm.

In some embodiments of the first device, determining the state of the integrated circuit further comprises providing linewidth, contrast, and/or temperature of the integrated circuit to the algorithm.

In some embodiments, a first method is provided, comprising: directing a light beam from a coherent light source at a single crystal diamond, wherein the a single crystal diamond comprises a plurality of NV centers and is disposed adjacent to a magnetic field-generating article, wherein the single crystal diamond is configured generate a fluorescent signal in response to being illuminated; irradiating the single crystal diamond with a MW signal generated by a microwave (MW) radiation source; applying a bias magnetic field to the single crystal diamond by a magnetic field source; collecting the fluorescent signal generated by the single crystal diamond by a photosensor; sweeping, by a computing node operatively coupled to each of the coherent light source, the MW radiation source, the magnetic field source, and the photosensor, at least one control parameters selected from the group: the MW signal power, MW signal frequency, MW signal duration, and strength of the bias magnetic field, and based on the control parameters and the fluorescent signal generated by the single crystal diamond, computing, by the computing node, a magnetic vector field of the magnetic field-generating article.

In some embodiments, a first non-transitory computer-readable storage medium is provided, the first non-transitory computer-readable storage medium storing instructions that, when executed by a system comprising a computing node operatively coupled to each of a coherent light source, a microwave (MW) radiation source, and a magnetic field source, cause the system to: directing a light beam from the coherent light source at a single crystal diamond, wherein the a single crystal diamond comprises a plurality of NV centers and is disposed adjacent to a magnetic field-generating article, wherein the single crystal diamond is configured generate a fluorescent signal in response to being illuminated; irradiate the single crystal diamond with a MW signal generated by the MW radiation source; apply a bias magnetic field to the single crystal diamond by the magnetic field source; collect the fluorescent signal generated by the single crystal diamond by a photosensor; sweep at least one control parameters selected from the group: the MW signal power, MW signal frequency, MW signal duration, and strength of the bias magnetic field, and based on the control parameters and the fluorescent signal generated by the single crystal diamond, compute a magnetic vector field of the magnetic field-generating article.

In some embodiments, a second method is provided, the second method being for determining a state of a magnetic field-generating article, the second method comprising: disposing a single crystal diamond having a plurality of NV centers adjacent to a magnetic field-generating article, the single crystal diamond being configured to generate a fluorescent signal in response to being illuminated by a light source; directing a light beam from a coherent light source to the single crystal diamond; irradiating the single crystal diamond with a microwave (MW) signal from a MW radiation source; applying a bias magnetic field to the single crystal diamond from a magnetic field source; collecting the fluorescent signal generated by the single crystal diamond by a photosensor; sweeping at least one control parameter selected from: the MW signal power, MW signal frequency, MW signal duration, or the strength of the bias magnetic field; based on the control parameters and the fluorescent signal generated by the single crystal diamond, computing the magnetic vector field of the magnetic field-generating article; and providing the magnetic vector field to a trained classifier and receiving therefrom a state of the magnetic field-generating article.

In some embodiments of the second method, the coherent light source is pulsed, and the computing node is configured to vary the coherent source pulse duration.

In some embodiments of the second method, the magnetic field-generating article comprises an integrated circuit.

In some embodiments of the second method, the integrated circuit is decapsulated.

In some embodiments of the second method, the trained classifier comprises an SVM.

In some embodiments of the second method, the second method further comprises performing dimensionality reduction of the magnetic vector field.

In some embodiments of the second method, performing dimensionality reduction comprises PCA.

In some embodiments of the second method, the trained classifier comprises a convolutional neural network.

In some embodiments of the second method, determining the state of the integrated circuit further comprises providing linewidth, contrast, and/or temperature of the integrated circuit to the trained classifier.

In some embodiments of the second method, the state comprises a number of active ring oscillators of the integrated circuit.

In some embodiments, a third method is provided, comprising: receiving fluorescence data representing a fluorescent signal generated by a single crystal diamond comprising a plurality of NV centers and disposed adjacent a magnetic field-generating article; receiving parameter data representing one or more of a plurality of parameters, wherein the plurality of parameters characterize one or more selected from: a microwave signal irradiating the single crystal diamond, a bias magnetic field applied to the single crystal diamond, a light beam incident on the single crystal diamond, and a photosensor used to collect the fluorescent signal; and processing the received fluorescence data and the received parameter data to generate magnetic vector field data representing a magnetic vector field of the magnetic field-generating article.

In some embodiments of the third method, the third method further comprises applying one or more algorithms to generate, based the magnetic vector field data, state data representing a state of the magnetic field-generating article.

In some embodiments of the third method, generating the state data is further based on temperature data pertaining to the magnetic field-generating article.

In some embodiments of the third method, generating the state data is further based on the fluorescence data.

In some embodiments of the third method, generating the state data is further based on data representing a structure of the magnetic field-generating article.

In some embodiments of the third method, the one or more algorithms comprise one or more selected from the group: a trained classifier, a convolutional neural network, a principal component analysis algorithm, and a support vector machine model.

In some embodiments of the third method, the generated state data indicates whether the magnetic field-generating article was in an operating state during a predetermined time period.

In some embodiments of the third method, the generated state data indicates an identity of the magnetic field-generating article.

In some embodiments of the third method, the generated state data indicates whether the magnetic field-generating article has been tampered with following fabrication.

In some embodiments of the third method, the generated state data indicates whether the magnetic field-generating article matches a predetermined profile within a predefined tolerance.

In some embodiments of the third method, the generated state data indicates information processed by the magnetic field-generating article during a predetermined time period.

In some embodiments of the third method, the generated state data indicates materials with which the magnetic field-generating article is fabricated.

In some embodiments of the third method, the generated state data indicates whether one or more defects are present in the magnetic field-generating article.

In some embodiments, any one or more features of the embodiments described above may be combined, in whole or in part, with any one or more features or one another and or of any other embodiment or example disclosed herein.

BRIEF DESCRIPTION OF THE SEVERAL VIEWS OF THE DRAWINGS

The patent or application file contains at least one drawing executed in color. Copies of this patent or patent application publication with color drawings will be provided by the Office upon request and payment of the necessary fee.

FIG. 2 is a table summarizing measurement protocols according to embodiments of the present disclosure.

DETAILED DESCRIPTION

Figure 1:
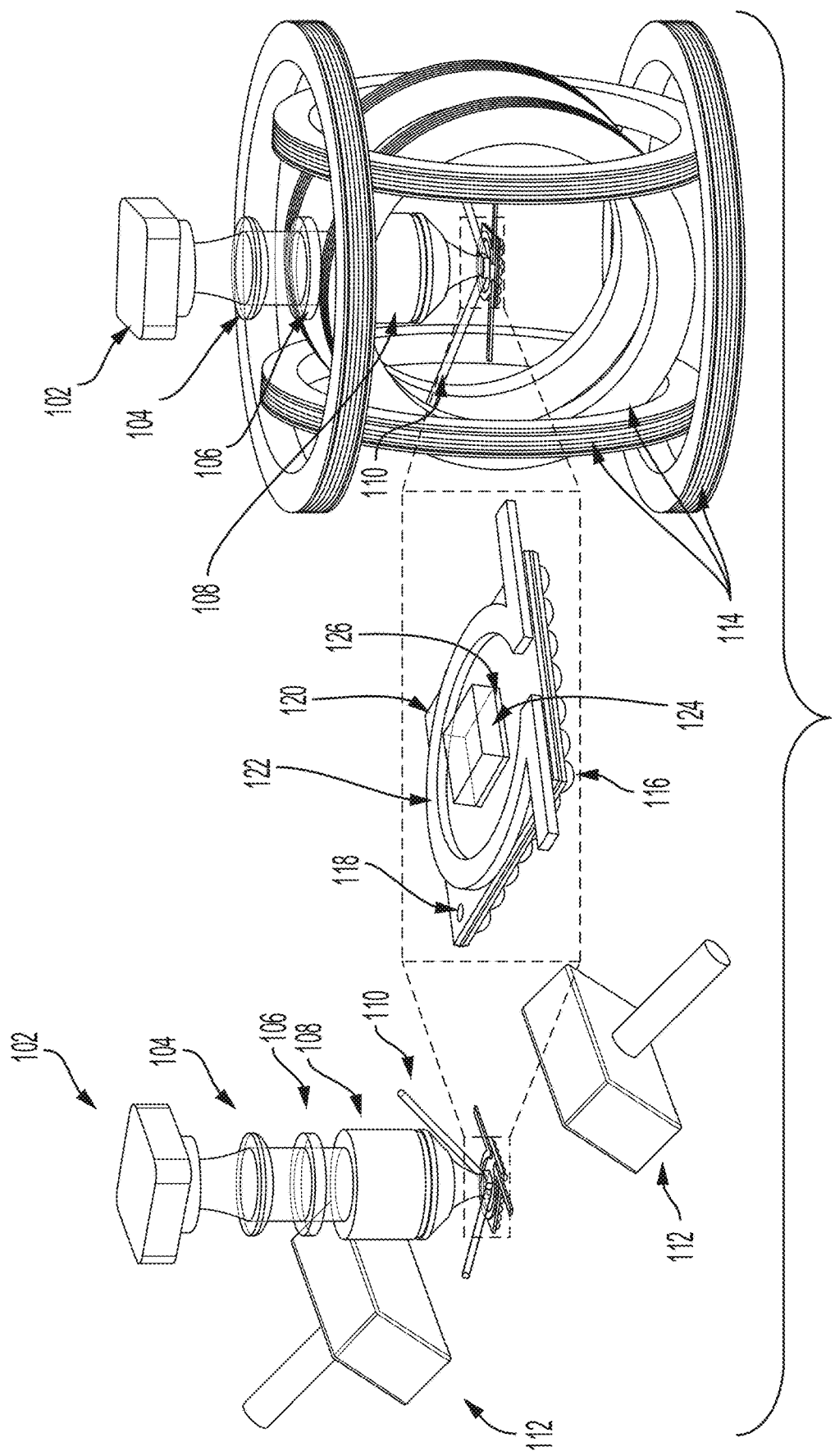
FIG. 1 is a schematic view of a magnetometer apparatus according to embodiments of the present disclosure.

The present disclosure relates generally to analysis of magnetic field-generating articles, including but not limited to digital and analog integrated circuits (ICs), particularly to detection, measurement, and imaging of static and dynamic vector magnetic fields generated by current densities flowing within said articles, such as current densities flowing within an operating IC with application to IC design analysis and testing, failure analysis, identification and fingerprinting of ICs, electromagnetic side channel analysis, reverse engineering and all other types of IC analysis that can leverage information from IC magnetic field emanations. It should be noted that, while the present disclosure refers to integrated circuits, the same or similar techniques as disclosed herein may be applicable to any magnetic field-generating article including any electronic system, electronic device, electronic component, microelectronic, microprocessor, and/or circuit-based article.

As explained above, advanced diagnostics for integrated circuit (IC) analysis are important for applications ranging from design validation, identification, security, and failure analysis. However, achieving assurance of IC security and performance is becoming increasingly difficult due the globalization of the semiconductor industry, as well as the growing complexity of ICs themselves. The efficacy of known techniques for IC analysis is challenged by the growing complexity of integrated circuits, including the diminution of IC feature size, growth of transistor densities, and advancements in packaging technologies, necessitating increasing sensitivities and spatial resolutions of diagnostic tools.

Measuring the magnetic field emanations of an IC is an especially desirable analysis approach given that it yields simultaneous information about the structure and function over a large area of the IC. Magnetic fields are generated by current densities in the integrated circuit that result from current flow in input/output lines, clock and power distribution networks, word and bit lines, and switching transistors. These currents are present in all operating logic ICs and memory ICs and can be leveraged for studying the operational behavior of an IC during execution of functional tasks. The current method for measuring magnetic field emanations from ICs requires use of magnetic field sensors such as induction loops or Hall effect probes. These sensors are macroscopic, with very low spatial resolution and provide little to no structural information about the device under study.

Accordingly, there is a need for improved techniques for inspecting and analyzing ICs to determine and validate the security, identification, function, and/or state of an IC. More specifically, there is a need for improved techniques for measuring magnetic fields of ICs (and of other magnetic field-generating articles) using systems, methods, and techniques that provide a wide field of view, high spatial resolution, sensitive imaging capabilities, effective measurement protocols, and effective application of data analysis and machine learning techniques. Development of a passive, high-sensitivity, high-spatial resolution, wide field of view method for magnetic field detection, measurement, and imaging is a critical enabling technology for next-generation IC analysis that does not currently exist in the industry. Disclosed herein are systems, methods, and techniques that may address the needs described above.

In various embodiments, the present disclosure enables passive detection, measurement, and imaging of magnetic field emanations from integrated circuits, and to leverage information carried by the magnetic field emanations for IC analysis, including determination of structure and function of the ICs. The system of this invention encompasses the novel combination of the magnetometer apparatus, the measurement protocol, and the analysis techniques used to measure and analyze magnetic field emanations as a diagnostic for ICs.

Referring to FIG. 1, a schematic view of magnetometer apparatuses according to embodiments of the present disclosure is provided.

In various embodiments, a magnetometer apparatus employs an ensemble of nitrogen vacancy (NV) centers in a diamond chip to achieve wide-field magnetic field measurement and mapping. NV centers in diamond are a modality for sensitive, high-spatial resolution, wide field of view imaging of microscopic magnetic fields, and may be employed to measure magnetic fields of magnetotactic bacteria, paleomagnetism in rocks, and magnetic fields emanated by propagating action potentials in neurons. The apparatus for measuring magnetic fields from integrated circuits (ICs) consists of an optical microscope and a photodetector (such as a photo-diode or a camera) to measure the fluorescence emitted by a thin ensemble NV layer at the surface of the diamond sensor chip, with the IC placed near to or in contact with the diamond. The choice of photodetector is dependent on the desired IC diagnostic analysis technique. A photodiode is used for fast sampling of the magnetic field, whereas a camera is used for mapping the magnetic field onto an image. Three driving fields are used in the apparatus—optical, bias magnetic, and microwave (MW)—that manipulate the NV electronic- and spin-state populations in a controlled manner. The optical field is generated by a coherent light source (e.g., a laser), the bias magnetic field by one or more Helmholtz coils and/or one or more permanent magnets, and the MW field by a microwave source (e.g., microwave resonators or a microwave loop).

In some embodiments, systems such as those provided herein, including but not limited to systems including a magnetometer such as that shown in FIG. 1, particularly when used in accordance with the techniques disclosed herein, may achieve high spatial resolution (e.g., higher spatial resolution than in known approaches), wide field of view (e.g., wider field of view than in known approaches), and highly sensitive imaging capabilities (e.g., more sensitive than in known techniques). In some embodiments, said improved performance is enabled by one or more of: improved diamond substrates as described herein, improved magnet stability and/or control as described herein, improved magnet engineering as described herein, improved laser stability and/or control as described herein, and/or synchronization of an inspected IC with one or more other components of the system as described herein.

As shown in the example of the multiple views of FIG. 1, a system may include camera 102, tube lens 104, interference filter 106, microscope objective 108, excitation laser 110, bias magnets 112, Helmholtz coils 114, solder balls 116, pin identifier 118, plastic casing 120, microwave loop 122, diamond substrate 124, and NV layer 126.

In some embodiments, systems such as those provided herein may provide for spatial resolution of less than or equal to 10 µm, 5 µm, 1 µm, 0.5 µm, 0.1 µm, or 0.05 µm. In some embodiments, systems such as those provided herein may provide for spatial resolution of greater than or equal to 10 µm, 5 µm, 1 µm, 0.5 µm, 0.1 µm, or 0.05 µm. In some embodiments, systems such as those provided herein may provide for sub-micron spatial resolution that approaches the optical diffraction limit.

In some embodiments, systems such as those provided herein may provide for a field of view that extends in one or two dimensions by greater than or equal to 2 mm, 4 mm, 5 mm, 1 cm, or 2 cm. In some embodiments, systems such as those provided herein may provide for a field of view that extends in one or two dimensions by less than or equal to 2 mm, 4 mm, 5 mm, 1 cm, or 2 cm. In some embodiments, systems such as those provided herein may provide for a field of view that is greater than or equal to 4 mm by 4 mm.

In some embodiments, systems such as those provided herein may provide for imaging sensitivity that is capable of detecting magnetic fields from the magnetic field-generating article that are less than or equal to 10 nT, 1 nT, 0.1 nT, 0.01 nT, 1 pT, or 0.1 pT in strength. In some embodiments, systems such as those provided herein may provide for imaging sensitivity that is capable of detecting magnetic fields from the magnetic field-generating article that are greater than or equal to 10 nT, 1 nT, 0.1 nT, 0.01 nT, 1 pT, or 0.1 pT in strength.

In some embodiments, said improved performance of the systems described herein may be enabled by one or more characteristics of the coherent light source configured to irradiate the single crystal diamond.

In some embodiments, an incident angle of the light beam generated by the light source on the diamond may be tuned to achieve total internal reflection within the diamond so as to avoid illuminating the magnetic field-generating article. This may be advantageous because illumination of the magnetic field-generating article could yield to interactions between the laser and magnetic field-generating article yielding unwanted changes in characteristics of the magnetic field-generating article.

In some embodiments, a power of the light beam generated by the light source may be selected so as to sufficiently saturate the photosensor; the power level required to sufficiently saturate the photosensor may depend on one or more characteristics of the single crystal diamond (e.g., the intensity at which the diamond fluoresces in response to the light source).

In some embodiments, a polarization of the light beam may be configured according to one or more experimental needs. For example, if only one resonance is being monitored by the system, a laser polarization of the light beam may be rotated to be aligned in accordance with for that NV crystal axis. If multiple crystal axes are being monitored (e.g., monitoring of at least three of the four crystal axes of a diamond may be necessary for unique extraction of the Cartesian vector field), then equal polarization of the light beam over all of the crystal axes being monitored may be desired.

In some embodiments, a beam shape of the light beam may be configured according to experimental needs. For example, the light beam may be shaped by a beam shaper, such as a flat-top beam shaper, to provide a uniform illumination power over the field of view.

In some embodiments, one or more additional or alternative techniques may be employed to ensure that a uniform light beam (e.g., uniform laser light) is provided by the coherent light source. Uniformity of the light beam may be important to achieving the desirable characteristics set out above in applications with a large field of view.

In some embodiments, said improved performance of the systems described herein may be enabled by one or more characteristics of the microwave source as disclosed herein.

In some embodiments, the microwave source may be configured to modulate the generated microwaves in order to improve robustness to laser noise and/or to other external noise sources.

In some embodiments, the microwave source may be configured to simultaneously drive multiple MW frequencies. The multiple MW frequencies may be selected based on the spacing of NV resonances (e.g., hyperfine resonances). This technique (which may be referred to as "hyperfine driving") may improve contrast over known techniques.

In some embodiments, a frequency of an MW signal driven by the microwave source may be greater than or equal to 0.5 GHz, 1 GHz, 2 GHz, 3 GHz, 4 GHz, 5 GHz. Or 10 GHz. In some embodiments, a frequency of an MW signal driven by the microwave source may be less than or equal to 0.5 GHz, 1 GHz, 2 GHz, 3 GHz, 4 GHz, 5 GHz. Or 10 GHz. In some embodiments, a frequency of an MW signal driven by the microwave source may be greater than or equal to 2 GHz and less than or equal to 4 GHz. In some embodiments, NVs in the single crystal diamond may be driven with frequencies ranging from about 1 MHz to 100s of GHz, depending on the strength and/or direction of the bias magnetic field source.

In some embodiments, one or more additional or alternative techniques may be employed to ensure that a uniform MW field is provided by the microwave source. Uniformity of the MW field may be important to achieving the desirable characteristics set out above in applications with a large field of view.

In some embodiments, said improved performance of the systems described herein may be enabled by one or more characteristics of the bias magnetic field source as disclosed herein.

As stated above, in some embodiments the bias magnetic field may be provided by one or more Helmholtz coils and/or by one or more permanent magnets.

In some embodiments, a permanent magnet may be used to apply a ~mT scale magnetic field at a chosen direction that has a different projection on all the NV axes of the single crystal diamond being analyzed. Using a permanent magnet may be advantageous due to its high stability and ability to provide uniform bias fields. Use of a bias field that projects differently onto each of a plurality of NV axes may be beneficial to vector magnetic field imaging as disclosed herein.

In some embodiments, one or more Helmholtz coils may be used in applications in which remnant magnetization of sources inside the magnetic field-generating article (e.g., inside an IC) are to be analyzed. For example, in some circuits with nickel and/or other magnetic materials incorporated in part of the fabrication process, having fine control over the magnitude and direction of the bias field, which may be provided by use of one or more Helmholtz coils, may be advantageous in providing the ability to differentiate ferromagnetic and paramagnetic components of the field-generating article's magnetic field (e.g., the IC's magnetic field).

In some embodiments, a combined approach may be applied in which permanent magnets and Helmholtz coils are simultaneously applied to generate a combined bias field. For example, one or more permanent magnets may be used to apply most of a bias magnetic field while one or more Helmholtz coils may be used to create modifications/perturbations in the bias magnetic field.

In some embodiments, one or more additional or alternative techniques may be employed to ensure that a uniform bias magnetic field is provided by the magnetic field source. Uniformity of the bias magnetic field may be important to achieving the desirable characteristics set out above in applications with a large field of view.

In some embodiments, said improved performance of the systems described herein may be enabled by one or more characteristics of the photosensor as disclosed herein.

In some embodiments, the photosensor used in the system may comprise a CMOS, CCD, photodiode array, and/or single photodiode. In some embodiments, photosensor wavelength sensitivity may span the range of NV fluorescence, e.g. from about 600 nm-800 nm.

In some embodiments, the photosensor may be arranged with respect to the single crystal diamond such that NV fluorescence from the single crystal diamond is focused onto the photosensor either to form an image on a camera (e.g., in the case of a CMOS, CCD, or photodiode array) or to focus onto a single photodiode.

In some embodiments, the choice of sensor type may be selected in order to increase the number of photons that are collected. In some embodiments, one or more characteristics of the photosensor may be selected and/or configured to allow for a large number of photons to be collected, thereby improving the sensitivity of the measurements and allowing for faster sampling of magnetic fields. In some embodiments, using a photodiode may provide a faster maximum sampling rate (e.g., about 10 MHz to about 100 MHz) than when using a conventional cameras (e.g., about 100s of Hz to about 10s of kHz).

In some embodiments, a data transfer link from the photosensor to one or more computing nodes (or other computer processors of the system) may be configured to minimize or eliminate degradation and/or delay of data captured by the photosensor.

In some embodiments, said improved performance of the systems described herein may be enabled by one or more characteristics of the single crystal diamond as disclosed herein.

In some embodiments, magnetic field resolution may depend on the thickness of an NV layer in the single crystal diamond. For example, if the NV layer is too thick, then the magnetic field images may be blurred out by thickness of the layer. Accordingly, NV layers of the single crystal diamonds used may be sufficiently thin.

In some embodiments, NV layers may be sufficiently thin to ensure that imaging is near the optical diffraction limit. In some embodiments, an NV layer may be greater than or equal to 100 nm, 200 nm, 300 nm, 400 nm, or 500 nm in thickness. In some embodiments, an NV layer may be less than or equal to 100 nm, 200 nm, 300 nm, 400 nm, or 500 nm in thickness.

In some embodiments, for example in cases where an intact (e.g., not decapped) IC is being imaged and/or in which a distance between current sources in the magnetic-field generating article and the single crystal diamond are otherwise sufficiently large, thinner NV layers than those contemplated the paragraph above may be used. For example, an NV layer may be thinner than those contemplated in the above paragraph by a factor of 2-5.

In some embodiments, a wide field of view may be enabled by a single crystal diamond having a sufficiently large footprint. In some embodiments, a single crystal diamond having a footprint of greater than or equal to 2 mm by 2 mm, 3 mm by 3 mm, 4 mm by 4 mm, or 5 mm by 5 mm may be used. In some embodiments, the single crystal diamond may extend in one or two dimensions by greater than or equal to 2 mm, 4 mm, 5 mm, 1 cm, or 2 cm. In some embodiments, the single crystal diamond may extend in one or two dimensions by less than or equal to 2 mm, 4 mm, 5 mm, 1 cm, or 2 cm.

In some embodiments, micron-scale and/or nanometer-scale diamonds may be used in point probe modality measurements.

In some embodiments, an NV layer thickness may to be selected and/or configured in accordance with one or more conditions of the magnetic field-generating article to be measured, such as circuit geometries and/or and conditions.

In some embodiments, if a circuit has been prepared to minimize distance between the NV layer and current traces in the circuit (e.g., a "decapped" circuit), then NV layers may be thin (e.g., about 100 nm to about 10 um) to maximize spatial resolution and signal amplitude. In some embodiments, if a circuit is fully intact (or if there is otherwise a large standoff distance between the NV sensing layer and one or more current carrying traces of the integrated circuit) then a thicker NV layer may be used. (In said cases, there may be minimal decrease in spatial resolution, but there may be increased fluorescence signal from the diamond which may improve measurements.)

In some embodiments, an isotope of nitrogen in an NV layer may be important to improving performance. The isotope may be 15N (nuclear spin=½) or 14N (nuclear spin=1). In some embodiments, use of 15N may simplify and improve measurement quality.

In some embodiments, isotopic purity of carbon in the single crystal diamond (12C, spin=0) may be important to improving performance. In some embodiments, the single crystal diamond may have an isotopic purity of greater than or equal to 99.9%, 99.99%, or 99.999%. In some embodiments, a diamond having 99.999% 12C (and 0.001% 13C) may be used. In some embodiments, a diamond having 99.95% 12C (0.05% 13C) may be used. In some embodiments, a diamond having natural isotopic abundance (e.g., 13C 1.1%) may be used.

In some embodiments, the single crystal diamond may be placed in contact with (e.g., on top of) the magnetic field-generating article (e.g., an integrated circuit). In some embodiments, the single crystal diamond may be placed proximate to but not in contact with the magnetic field-generating article (e.g., an integrated circuit). In some embodiments, the single crystal diamond may be disposed in a mount that allows for movement of the diamond through a plurality of positions and/or a plurality of orientations (relative to the magnetic field-generating article and/or relative to one or more other system components); in some embodiments, the diamond may be moved and/or reoriented before and/or during measurement.

In some embodiments, an NV density of the single crystal diamond may be greater than or equal to 0.01 ppm, 0.1 ppm, 1 ppm, 10 ppm, or 100 ppm. In some embodiments, an NV density of the single crystal diamond may be less than or equal to 0.01 ppm, 0.1 ppm, 1 ppm, 10 ppm, or 100 ppm. In some embodiments, an NV density of the single crystal diamond may be greater than or equal to 0.1 ppm and less than or equal to 10 ppm; in some embodiments, this regime may balance the amount of NV fluorescence and the quantum coherence properties of the defects in diamond.

In some embodiments, homogeneity of the single crystal diamond may be important in improving performance of the system. In some embodiments, defects in the diamond lattice may be less than or equal to 1 ppm, 0.1 ppm, or 0.01 ppm. In some embodiments, defects in the diamond lattice may be greater than or equal to 1 ppm, 0.1 ppm, or 0.01 ppm.

In some embodiments, strain in the diamond lattice, in particular heterogeneous strain, may degrade quality of measurements. In some embodiments, diamonds used in the systems disclosed herein may have minimal strain gradients across the field of view. In some embodiments, fractional lattice strain in the diamond may be less than or equal to 0.00001, 0.000001, or 0.0000001. In some embodiments, fractional lattice strain in the diamond may be greater than or equal to 0.00001, 0.000001, or 0.0000001.

In some embodiments, the system may be configured and the strain in the single crystal diamond may be small enough such that NV linewidth and T2* are not significantly degraded. In some embodiments, the strain may be small enough such that linewidth broadening is less than or equal to 500 kHz, 100 kHz, or 50 kHz. In some embodiments, linewidth broadening may be greater than or equal to 500 kHz, 100 kHz, or 50 kHz. In some embodiments, the strain may be small enough such that T2* contributions are less than or equal to 50 µs, 10 µs, 5 µs, 1 µs, or 0.5 µs. In some embodiments, the T2* contributions may be greater than or equal to 50 µs, 10 µs, or 5 µs, 1 µs, or 0.5 µs. The total T2* of a system may be composed of different contributions (see, e.g., Bauch, et al., *Ultralong Dephasing Times in Solid-State Spin Ensembles via Quantum Control*, PHYSICAL REVIEW X 8, 031025 (2018), Equation 1). In general, the different contributions to T2* add through their inverse, so it may be desirable for the strain component to not be limiting relative all the other terms.

Figure 2:
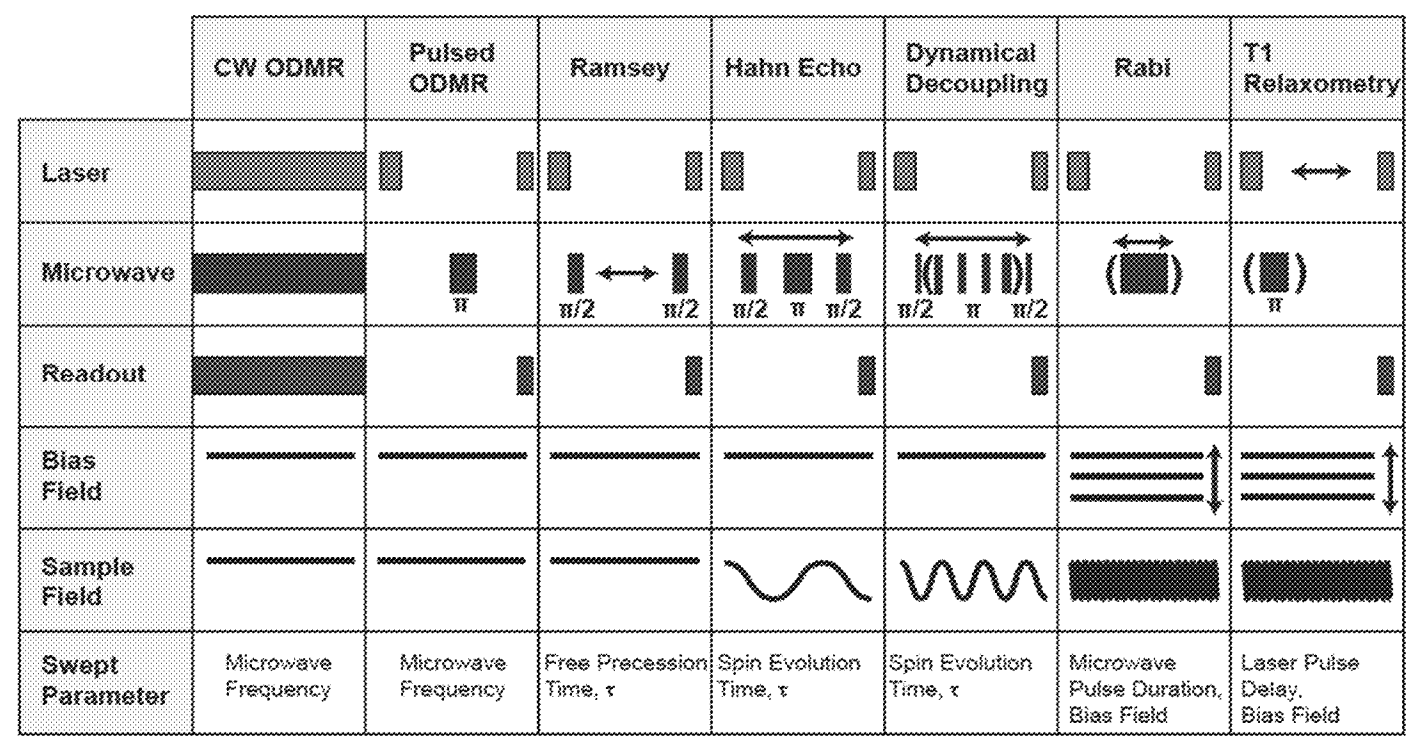

Referring to FIG. 2, measurement protocols according to embodiments of the present disclosure are provided.

In general, a measurement protocol may dictate any one or more experimental configurations that are set and/or varied during (and/or before) measurement. For example, experimental configurations that may be set (and/or varied) in accordance with one or more measurement protocols include (but are not limited to): MW signal power, MW signal frequency, MW signal duration, MW signal temporal pattern, MW signal coherence, MW signal spatial geometry and/or orientation, light beam power, light beam frequency, light beam signal duration, light beam temporal pattern, light beam coherence, light beam spatial geometry and/or orientation, bias magnetic field strength, bias magnetic field duration, bias magnetic field temporal patter, bias magnetic field spatial geometry and/or orientation, photosensor exposure time/pattern, photosensor sensitivity, photosensor spectral range, photosensor orientation, crystal diamond location, crystal diamond orientation, environmental humidity, environmental temperature, ambient light, other environmental factors, magnetic field-generating article position, magnetic field-generating article orientation, magnetic field-generating article operational state (e.g., whether current is passing through the magnetic field-generating article, including whether a known current (e.g., as generated by an external function generator) is being passed through one or more predetermined wires in the article and/or including whether the magnetic field-generating article is executing one or more computer programs (e.g., in the case where the article is a circuit)), and/or magnetic-field generating article sample field (e.g., the magnetic field generated by the article, which is to be measured). In some embodiments, any one or more experimental configurations may be set and/or varied over time during a time period immediately preceding and/or coinciding with collection of fluorescent emission from the single crustal diamond. In some embodiments, any one or more experimental configurations may be controlled by an automated control system of the systems disclosed herein, for example by being controlled by one or more computing nodes and/or other computer processors.

As used herein, the term "sweep" or "swept" may refer to any variation or configuration of an experimental configuration. Thus it may be said that a measurement protocol dictates "sweeping" the laser power, in that the laser power may be varied before and/or during the time period during which a fluorescence signal is collected.

Different measurement protocols are used in order to select for and measure different characteristic magnetic field emanated by the IC at different frequencies. Measurement of low-frequency, broad-band magnetic fields emanated by the IC leverages continuous wave (CW) optically detected magnetic resonance (ODMR), pulsed ODMR, and Ramsey; measurement of high-frequency, narrow-band magnetic fields leverages Dynamical Decoupling (e.g., Hahn Echo and CPMG), Rabi, and T1 relaxometry.

In various measurement modalities as described below, a green (e.g., 532 nm) laser is used for initialization and readout of the NV spin state, a controlled external microwave (MW) or radiofrequency (RF) magnetic field is used to drive electronic spin state transitions, an external bias magnetic is used to control the resonant frequency positions, a detector is used to readout the fluorescence, and a control element is used to coordinate all of these elements relative to one another.

CW ODMR is the first of a class of techniques (CW ODMR, Pulsed ODMR, Ramsey) known as DC magnetometry, which are sensitive to fields slower than the sampling rate, analogous to an oscilloscope-like protocol.

Laser excitation, microwave control, and red fluorescence readout are performed simultaneously in CW ODMR, which enables the most straightforward realizations of NV magnetic field sensing. In this method, the red NV fluorescence is optically monitored as the frequency of the external MW control field is swept. When the external MW frequency is resonant with a given NV electronic spin state transition the fluorescence decreases. Through monitoring the position of the resonance frequency (the line-center of the Lorentzian profile that defines the resonance), one can measure the external magnetic field. This method is broadband and sensitive to fields slower than the time it takes to repeat measurements of the fluorescence and is ultimately limited by how fast the NV can be optically pumped (~MHz).

Extensions of this technique include vector magnetic field measurements and "lock-in" measurements. In vector magnetic field measurements, an external bias field is aligned such that the position of all 8 resonance groupings (8=4 crystal axes, and 2 transitions for ms=0↔ms=1 and ms=0↔−1) can be monitored. Through "lock-in" measurements a sparse list of MW resonance frequencies are chosen which are maximally sensitive to changes in an external magnetic field.

Generally, higher intensity laser light and higher power MWs are desirable to increase fluorescence and measurement contrast. One downside of CW ODMR is that the simultaneous application of lasers and microwaves while sensing magnetic fields spoils some the spin relaxation and spin dephasing properties of the NVs.

Pulsed ODMR temporally separates the spin initialization, MW driving, and readout, thereby allowing for the use of high optical intensity without spoiling the NV properties. This process is repeated rapidly for each individual measurement. When sensing magnetic fields, the microwave frequency is modified and the resonance frequency is extracted.

Rather than sensing magnetic fields based on the determination of a resonance frequency, Ramsey magnetometry is the first of a class of protocols that utilize phase accumulation and preparation of different spin states to sense magnetic fields. Following initialization of the NV spin state into the ms=0 state with the application of green laser pulse, a calibrated MW pulse is applied to create a superposition of the ms=0 and $m_s$=−1 or the $m_s$=0 and $m_s$=+1 spin state (when operating in the "Single Quantum" basis.) The $m_s$=0 state and the $m_s$=±1 acquire phase at different rates. At the end of the sensing time, τ, the accumulated phase difference is projected onto the NV population with another calibrated MW pulse. This spin state population difference is read out through the intensity of red fluorescence. The speed in sensing external magnetic fields is limited by how fast this process can be repeated (can be ~100 kHz-1 MHz). Repeatability is normally limited by optimal green pulse times and sensing duration r. The optimal sensing duration is generally in the neighborhood of the spin sensing time, T2*.

An extension enabled by Ramsey magnetometry is operating in the "Double Quantum" basis which is doubly sensitivity to magnetic fields and robust to changes in temperature and the effects of strain. In this double quantum basis, the NV electronic spin state is prepared in a superposition of the $m_s$=−1 and $m_s$=+1 spin state.

Hahn Echo is the start of a class of measurements which are "narrowband" sensors of magnetic fields, also known as AC Magnetometry techniques. They are sensitive to higher frequency magnetic fields, but only responsive to narrow frequencies around a given center frequency.

Hahn Echo is similar to Ramsey, but another calibrated MW pulse, known as a pi pulse, is applied in the middle of the sequence. This pi pulse reverses the direction of phase accumulation which cancels out the influence of magnetic fields much slower than the spacing between pulses. This cancellation of slow fields allows one to have sensing times out to the spin decoherence time T2 (T2>T2*.)

By adding multiple pi pulses in the middle of a measurement sequence, the method of dynamic decoupling restricts the spread of frequencies to which the NV is sensitive. This allows the extension of the T2 time and can enable high sensitivity measurements of a specific frequency band.

There is a large class of measurements under this category that depends on the phase relationship between different pi pulses.

Rabi is most analogous to contrast imaging, however, it is done in a coherent modality. Rather than looking at how the application of MW and RF fields alter the contrast of the ODMR feature (contrast imaging/protocol), Rabi protocols measure the coherent population transfer between the $m_s$=0 and $m_s$=±1. Electronic spin state population is transferred coherently back and forth between the spin states and the rate of this transfer is linearly proportional to the amplitude of the external MW field.

This method is applicable for sensing fast external magnetic fields (~100 MHz→10 GHz.)

The mechanism for T1 Relaxometry is different than the other techniques discussed previously. Rather than probing electronic spin transition locations and phase accumulation, T1 measurements probe the delay in the purity of the initialized spin state after an optical initialization pulse. After being initialized into the $m_s$=0 state with an intense green pulse, the NV spin state will decay into a mixed state with equal populations of spin states at a characteristic time T1 (spin relaxation time, T1~ms timescale.) The presence of high frequency magnetic fields can accelerate this decay. Through probing differences in this decay, one can determine the presence of external high frequency fields.

It will be appreciated that various analysis techniques may be used in conjunction with these exemplary measurement protocols, including PCR, SCA, and other techniques known in the art.

In some embodiments, the one or more analysis techniques may include using fluorescence data collected by the photosensor based on fluorescence emission of the single crystal diamond (alone and/or in combination with other data) to compute a magnetic vector field of the magnetic field-generating article. In some embodiments, the computed vector field may be a field for a single point in time. In some embodiments, the computed vector field may represent a time-varying vector field over a period of time. In some embodiments, the computation of the magnetic vector field may be based on the collected fluorescence data and/or on data representing any one of the experimental configurations (which may be referred to as "control parameters").

In some embodiments, the system may be configured to provide the computed magnetic vector field (alone or in combination with one or more additional inputs) to an algorithm (e.g., a classifier algorithm such as a machine learning algorithm). The algorithm may be configured to process the input data (e.g., the magnetic vector field) to generate state data indicating information regarding a state of the magnetic field-generating article.

In some embodiments, the state of the magnetic field-generating article may include an indication of one or more of the following: whether the magnetic field-generating article was in an operating state during the time the fluorescent signal was collected, an identity of the magnetic field-generating article, whether the magnetic field-generating article has been tampered with following fabrication, whether the magnetic field-generating article matches a predetermined profile within a predefined tolerance, information processed by the magnetic field-generating article during the time the time the fluorescent signal was collected, materials with which the magnetic field-generating article is fabricated, and/or whether one or more defects are present in the magnetic field-generating article In some embodiments, the classifier algorithm may comprise one or more artificial intelligence, machine learning, and/or deep learning algorithms. In some embodiments, the classifier algorithm may include one or more of the following: a convolutional neural network, a principal component analysis algorithm, and a support vector machine model. In some embodiments, the classifier algorithm may be trained using a corpus of labeled and/or unlabeled data pertaining to various magnetic field-generating articles (e.g., various integrated circuits) in various states, and the algorithm may thus be configured to determine a state of an article based on information regarding its magnetic vector field and/or other input data regarding the article.

In some embodiments, in addition to magnetic vector field data, the classifier algorithm may accept as input data pertaining to the fluorescence data collected by the photosensor (and from which the magnetic vector field data was computed). In some embodiments, in addition to magnetic vector field data, the classifier algorithm may accept as input data pertaining to any one or more experimental configurations (e.g., control parameters) that were used to collect the fluorescence data. In some embodiments, in addition to magnetic vector field data, the classifier algorithm may accept as input additional data pertaining to how the article and the crystal diamond interact, such as temperature data (e.g., a local temperature map), resonance contrast parameters, linewidth parameters, and/or other external and/or ancillary data. In some embodiments, in addition to magnetic vector field data, the classifier algorithm may accept as input additional data characterizing the article, such as data characterizing the article's structure, details about underlying activity of the article, time-scales, spatial scales, magnitudes, and/or additional information. In some embodiments, additional data provided as an input to the classifier algorithm may help correct for systemic effects and may improve the accuracy of determination of state information.

Current density distributions in active integrated circuits (ICs) result in magnetic fields that contain structural and functional information about the IC. Magnetic fields pass largely undisturbed through standard materials used by the semiconductor industry and as such afford a powerful means to fingerprint IC activity for security and failure analysis applications. The present disclosure provides for high spatial resolution, wide field-of-view, vector magnetic field imaging of static (DC) magnetic field emanations from an IC in different active states using a Quantum Diamond Microscope (QDM). The QDM employs a dense layer of fluorescent nitrogen-vacancy (NV) quantum defects near the surface of a transparent diamond chip placed on the IC to image magnetic fields. QDM imaging achieves simultaneous ~10 µm resolution of all three vector magnetic field components over the 3.7 mm×3.7 mm field-of-view of the diamond. This simultaneous wide-field, high spatial resolution, DC vector field IC activity imaging capability is unprecedented. Activity in both intact and decapsulated field programmable gate arrays (FPGAs) is shown, demonstrating that QDM images can determine pre-programmed IC active states with high fidelity utilizing machine-learning classification methods.

Securing integrated circuits (ICs) against hardware attacks is of vital importance to the semiconductor industry. Hardware attacks consist of modifying the physical layout of an integrated circuit, thereby changing its function. This type of attack can occur at any stage of the globalized semiconductor supply chain, and can range from insertion of malicious trojan circuitry during the design and fabrication stages, to modification or counterfeiting during packaging and distribution stages. Horizontal integration of the industry has led to contracting of IC fabrication, packaging, and testing to offshore facilities, resulting in a reduction of secure oversight and quality control. Additional growth of the second hand electronics market has led to a drastic increase in the incidence of counterfeit ICs. Detection of IC tampering or counterfeiting has consequently become essential to ensure hardware can be trusted.

Magnetic field emanations from integrated circuits afford a powerful means for non-destructive physical testing of integrated circuits. IC magnetic fields are generated by current densities in ICs resulting from power and clock distribution networks, input/output lines, word and bit lines, and switching transistors. These currents are present in all operating logic and memory chips and can be leveraged for studying the operational behavior of an IC during task execution. In general, the resulting IC magnetic fields pass largely unaltered through standard IC materials, and will vary spatially and temporally in ways that correlate with both IC architecture and operational state. Thus, high-resolution mapping of magnetic fields may yield simultaneous structural and functional information, and may be suitable for identification of malicious circuitry or Trojans, counterfeit detection, and fault detection. However, leveraging magnetic field emanations is challenging due to the increasing complexity and decreasing feature sizes of modern ICs. Multi-layered metal interconnects and three dimensional stacking give rise to complex magnetic field patterns that are difficult to reverse engineer, and large stand-off distances of magnetometers reduce magnetic field sensitivity and spatial resolution.

The present disclosure shows how these challenges can be approached using a Quantum Diamond Microscope (QDM). Simultaneous wide field-of-view, high spatial resolution, and vector magnetic field imaging of an operational field programmable gate array (FPGA) is provided. FPGAs are configurable ICs that are commonly used for diverse electronics applications. Systematic and controlled variation of the circuit activity on the FPGA generates complex magnetic field patterns which are imaged with the QDM. The QDM employs a dense surface layer of fluorescent nitrogen-vacancy (NV) quantum defects in a macroscopic diamond chip placed on the IC. NVs provide a combination of excellent sensitivity and high spatial resolution magnetometry via optically detected magnetic resonance (ODMR).

Static magnetic fields from a decapsulated, operational FPGA are imaged with the QDM using continuous wave (CW) ODMR spectroscopy, giving rise to DC magnetic field maps that are distinguishable between operational states over a 3.7 mm×3.7 mm field-of-view with a 20 nT noise floor, and ~10 µm magnetic field resolution, limited by the thickness of the NV surface layer in the diamond chip and the distance to the nearest metal layer. Non-invasive QDM images of an intact, operational FPGA also yield DC magnetic field maps with a 2 nT noise floor, and ~500 µm magnetic field resolution. The operational states of these maps are distinguishable, albeit with worsened SNR and spatial resolution due to the 500 µm stand-off distance between the diamond chip and the IC die. In various embodiments, principal component analysis (PCA) and machine learning methods are used to demonstrate state classification via field pattern correlation for both decapsulated (decapped) and through-package (intact) field measurements. This provides meaningful IC characterization that can be leveraged to fingerprint IC activity.

QDM magnetic field imaging may be used to measure microscopic current distributions from a wide variety of sources in both the physical and life sciences. Compared to alternative scanning techniques for characterizing IC magnetic field emanations, which include wire loops, probe antennas, magnetic force microscopy, SQUID magnetometers, and Vapor Cell Magnetometers, the QDM provides simultaneous high-resolution (micron-scale) and wide-field (millimeter-scale), vector magnetic imaging, monitoring of transient behavior and studies of correlations in signal patterns that can evolve more quickly than a single sensor scan time. With these distinctive advantages, QDM-based technique described provide means for non-destructive physical testing of ICs.

Referring to FIG. 3, an exemplary QDM setup is illustrated according to embodiments of the present disclosure. In FIG. 3A, a schematic of a Quantum Diamond Microscope experimental setup is provided, with insets showing the diamond in contact with the intact and decapsulated FPGAs. In FIG. 3B, a diamond crystal lattice with nitrogen 321 vacancy 322 defect is illustrated. Lab frame coordinates (X, Y, Z) and NV frame coordinates for a single defect (x,y,z) are shown. In FIG. 3C, the ground state energy level diagram for $^{14}N$ with fine structure and Zeeman splitting is shown. In FIG. 3D, ODMR spectral data for an applied bias field of (X,Y,Z)=(2.04 1.57 0.65) mT is provided, showing resonant frequencies of $f_{\pm,i}$ with i=1, 2, 3, 4 indicating each of the four NV axes.

Figure 3A:
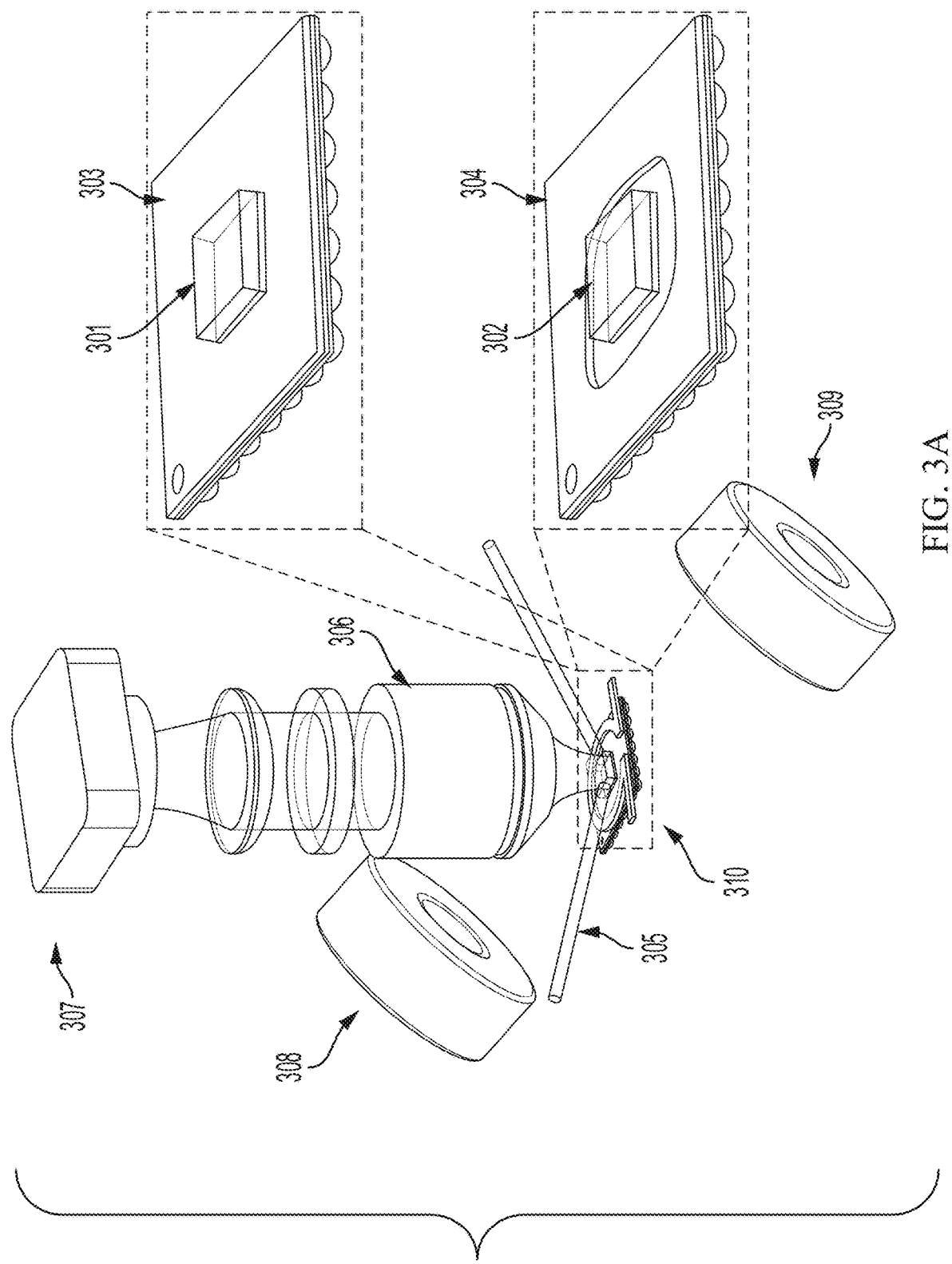
FIGS. 3A-D illustrate an exemplary QDM setup according to embodiments of the present disclosure.

A schematic of the QDM according to an exemplary embodiment is shown in FIG. 3A. The magnetic field sensor consists of a 4 mm×4 mm×0.5 mm diamond substrate 301, 302 with a 13 um surface layer of NV centers. The diamond is placed directly on the IC 303, 304 with the NV layer in contact with the IC surface. In this example, the diamond was grown to have an isotopically pure NV layer consisting of [$^2$C]~99.999%, [$^{14}$N]~27 ppm, and [NV]~2 ppm. A 532 nm, CW laser 305 (Lighthouse Photonics Sprout-H-10 W) was used to optically address the NV layer with 400 mW uniformly distributed over the 4 mm×4 mm diamond area. A flat-top beam shaping element (Eksma Optics GTH-5-250-4-VIS) and a cylindrical lens (Thorlabs LJ1558RM-A) were used to create a rectangular beam profile (6 mm×6 mm) incident on the top face of the diamond at a sufficiently shallow angle of incidence (4°) relative to the top diamond surface to illuminate the entire NV layer. NV fluorescence is collected with a low magnification objective 306 (Olympus UPlanFL N 4x 0.13 NA) to interrogate a large field of view. The fluorescence is filtered with a 633 nm longpass filter (Semrock LP02-633RU-25) and imaged onto a CMOS camera 307 (Basler acA1920-155 um) where the information is processed and analyzed with custom software utilizing LabVIEW and MATLAB.

Figure 3B:
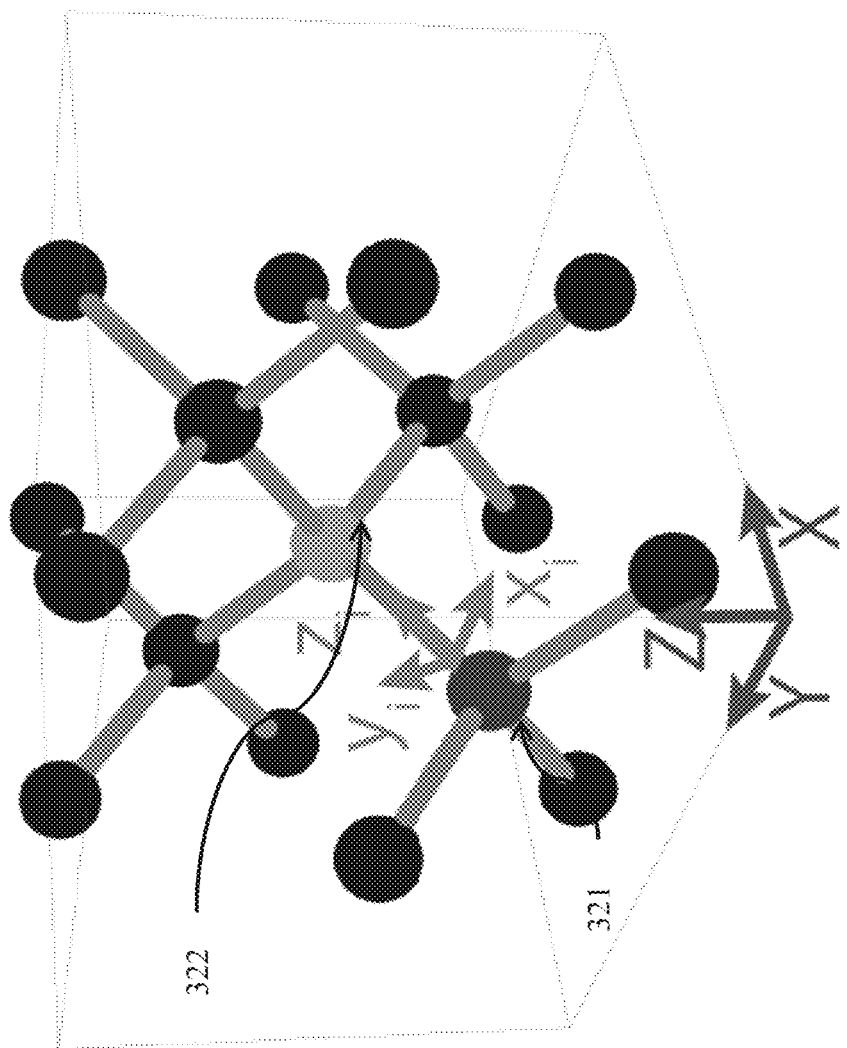

In this example a pair of 5 cm diameter SmCo permanent magnets 308,309 were used on opposing sides of the diamond to apply the uniform magnetic fields needed for full-vector and single-axis measurements. The magnetic field $B_0$ induces a $\pm g_e \mu_B B_0 \cdot n$ Zeeman splitting of the spin triplet NV m=1 and m=−1 ground states along each of four tetrahedrally defined NV symmetry axes, n, with Landé g-factor $g_e$, and Bohr magneton $\mu_B$. Hyperfine interaction between the NV and the $^{14}$N isotope nuclear spin results in an additional triplet level splitting. The four symmetry axes of the NV, shown in FIG. 3B, are leveraged for vector magnetic field imaging using $B_0$ projection onto all four NV axes. The ground state energy level diagram of a single NV axis is depicted in FIG. 3C, neglecting hyperfine structure.

Figure 3C:
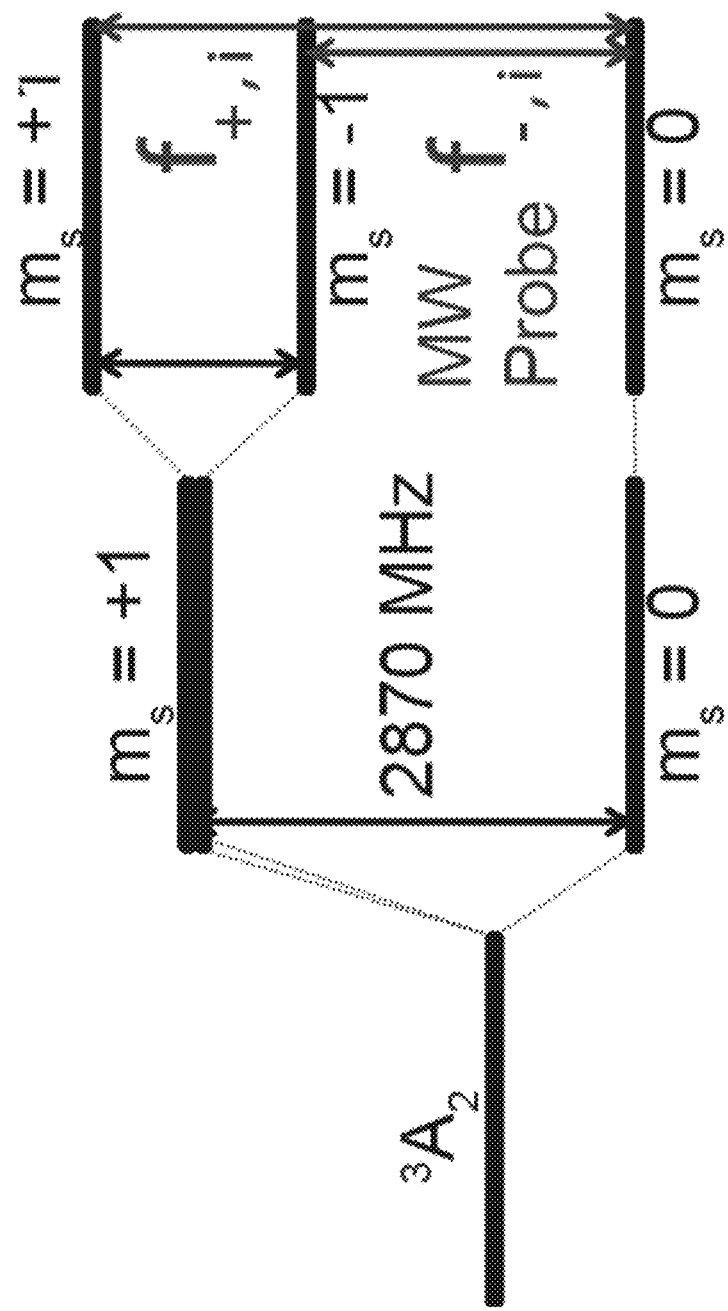

A 6 mm diameter copper wire loop 310 made from 320 μm diameter magnet wire is used to deliver 1 W of GHz frequency microwave (MW) fields (TPI-1001-B and amplified with a Mini-Circuits ZHL-16 W-43S+amplifier) to the NVs to drive the NV electronic spin transitions, $m_S=0 \leftrightarrow -1$ or $m_S=0 \leftrightarrow +1$, denoted by $f_{-,i}$ and $f_{+,i}$, respectively (FIG. 3C). The MW field is modulated on and off through the use of a solid-state switch (ZASWA-2-50DRA+) controlled by a DAQ (NI-USB 6259) and synchronized with the frame acquisition of the camera to correct for laser intensity fluctuations and drift.

Figure 3D:
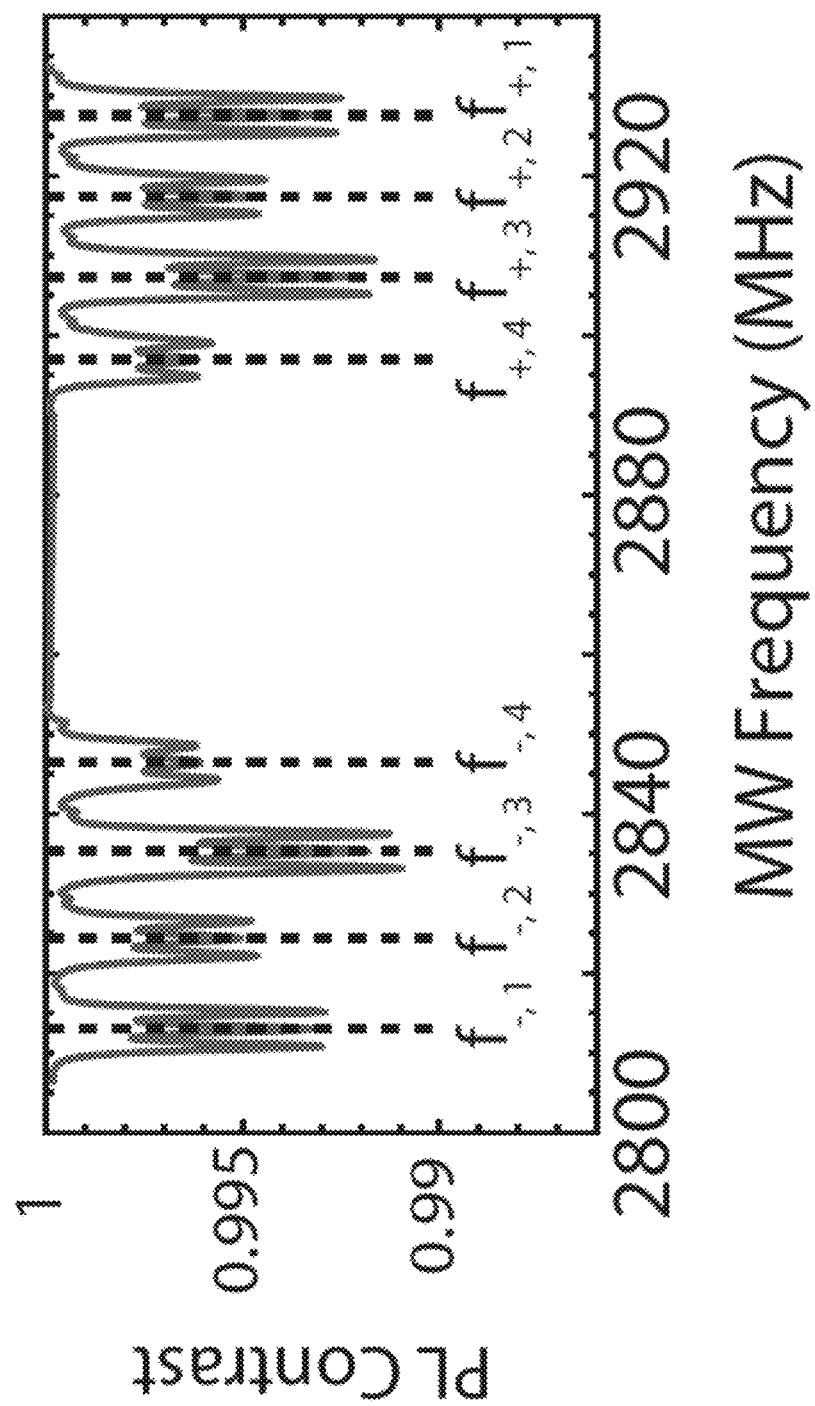

The intensity of optically induced NV fluorescence decreases for MW fields on resonance with one of the spin transition energies. This decrease results from the m=±1 spin-selectivity of the non-optical, intersystem crossing (ISC) mediated decay pathway for optically excited NVs. The resonance frequencies between NV ground-state sublevels are determined from the ground-state Hamiltonian $$H/h = (D+M_z)S_z^2 + \gamma(B_x S_x + B_y S_y + B_z S_z) + M_x(S_y^2 - S_x^2) + M_y(S_x S_y + S_y S_x) \quad \text{Equation 1}$$

for the projection of $B_0$ along a single NV axis, where h is Planck's constant, D≈2870 MHz, $S_k$ are the dimensionless spin-1 Pauli operators, $\gamma=2.803\times10^4$ MHz/T, $B_k$ are the components of $B_0$ in the NV frame, and $M_k$ are crystal stress parameters. Cartesian coordinates k=x, y, z are defined in the NV frame with z along the selected NV axis (FIG. 3B). The contribution of the hyperfine interaction between the NV and $^{14}$N nuclear spins is treated as a constant, 2.158 MHz energy level splitting and is not shown explicitly in Equation 1. Sweeping the frequency of the applied MW fields across the range of resonant frequencies and collecting the NV fluorescence results in an optically detected magnetic resonance (ODMR) spectrum. FIG. 3D depicts the resulting ODMR measurements for a bias field alignment where each NV axis experiences a different projection of the bias magnetic field.

Continuous-wave (CW) ODMR is used to image the static component of the FPGA magnetic fields. CW ODMR leverages continuous application of the laser and MW field. This approach yields wide field of view images with high spatial resolution and good magnetic field sensitivity, while minimally perturbing the sample under study. A diamond is used with a low static strain distribution across the field of view and further suppress strain contributions with application of the static bias field, $B_0$. Thus, the $M_x$ and $M_y$ terms in Equation 1 are negligible. The ground state Hamiltonian along a single NV axis reduces to $$H/h \approx (D+M_z)S_z^2 + \gamma B_z S_z + \gamma B_x S_x + \gamma B_y S_y, \quad \text{Equation 2}$$

and is used to determine the CW ODMR resonance frequencies and extract the magnetic field measured from the sample FPGA.

Referring to FIG. 4, IC preparation, control, and layout is illustrated according to embodiments of the present disclosure. In FIG. 4A, an intact Xilinx 7-series Artix FPGA is provided with die location and dimensions indicated. In FIG. 4B, an X-ray image is provided of the FPGA package determining the position and size of die outlined. In FIG. 4C, a high resolution image is provided of the decapsulated FPGA with the fixed diamond measurement field of view indicated with a box, and the location of ring oscillator clusters indicated by boxes labeled R1-R4. In FIG. 4D, a scanning electron microscope (SEM) image is provided of the FPGA cross-section showing the 500 μm stand-off distance between the chip die and the top layer. In FIG. 4E, a close-up is provided of the SEM focusing on the metal layers of die. The thickness of the passivation layer is 5 μm and sets the minimum stand-off distance for the decapsulated measurements.

Figure 4A:
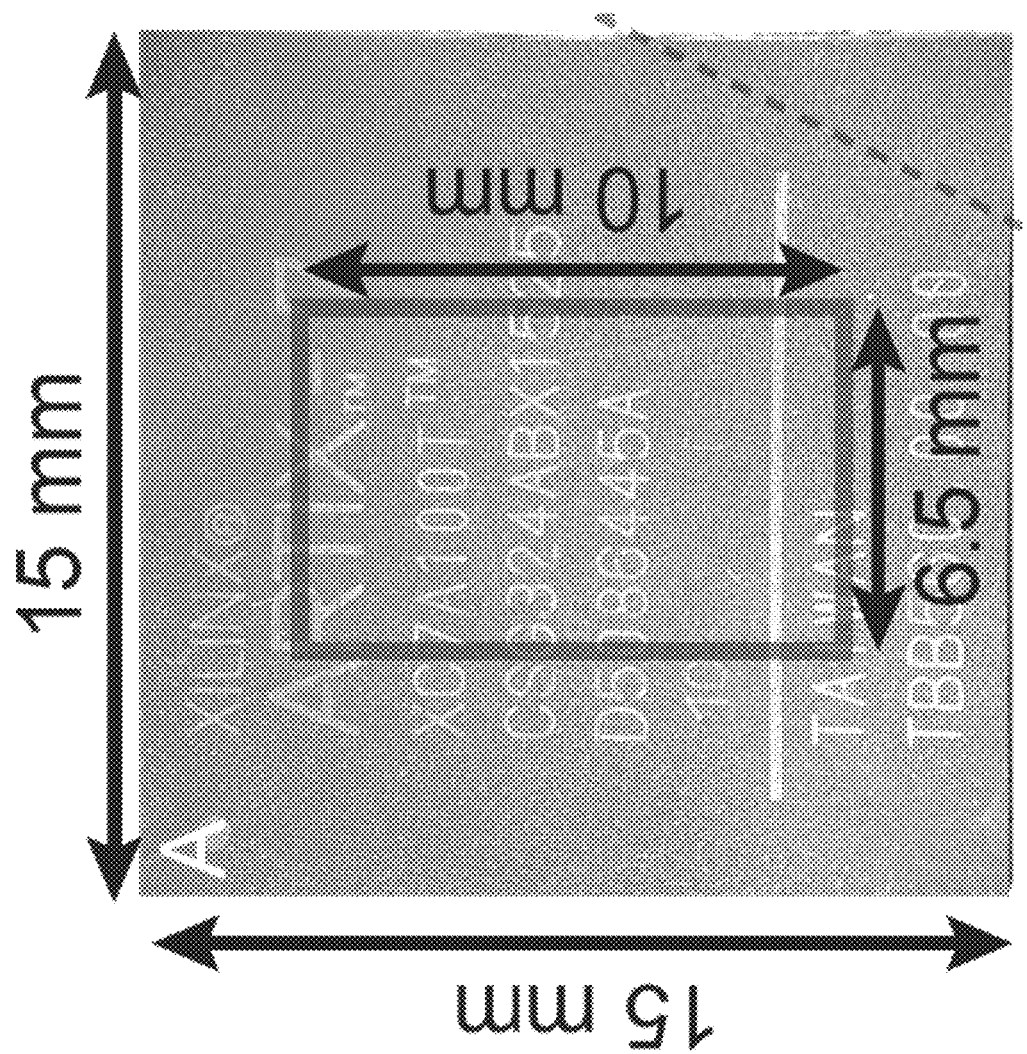
FIGS. 4A-E illustrate IC preparation, control, and layout according to embodiments of the present disclosure.
Figure 4B:
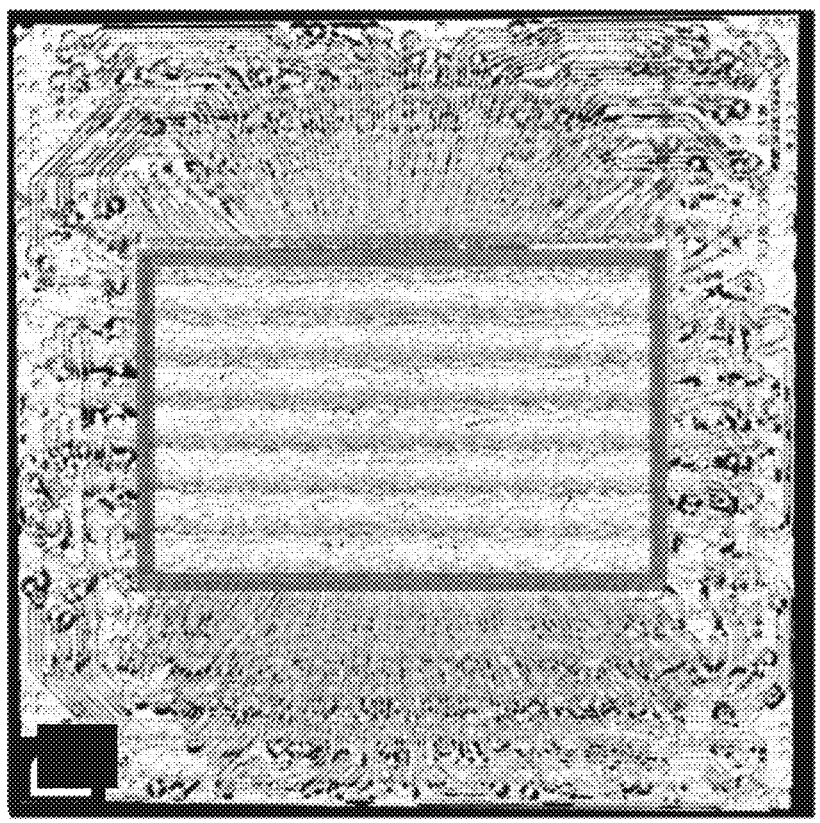

The Xilinx 7-series Artix FPGA (XC7A100T-1CSG324C) shown in FIGS. 4A-B was selected for this study. This FPGA is a 15 mm×15 mm wirebonded chip fabricated in the TSMC 28 nm technology node that has a ~6.5 mm×10 mm silicon die with eight clock regions and over 100,000 logic cells. Digilent Nexys A7 development boards were used to operate and configure the Artix-7 FPGA.

Figure 4C:
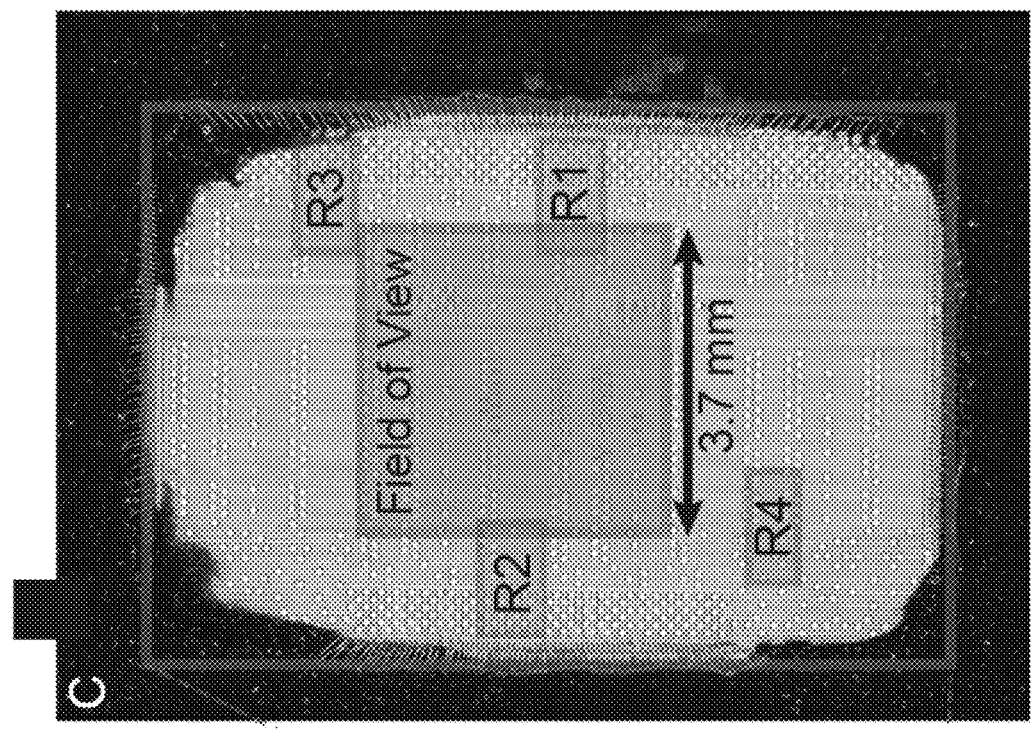

Patterns of ring oscillators (ROs) were implemented using the Xilinx Vivado Design Suite® to create distinguishable current distributions on the FPGAs for measurement by the QDM. The large current draw and controllable location and size of ROs make them ideal for this study. Clusters of three-inverter ROs were synthesized, placed, and routed to four different predefined clock regions on the FPGA with clear spatial separation as shown in FIG. 4C. The clusters consisted of variable numbers of ROs allowing for incremental increase or decrease of the current draw at the different locations on the FPGA. The active states of the FPGA are defined by RO clusters implemented in one of the predefined regions, and the idle state is defined as the FPGA powered on with no implemented ROs. The ordering of states during a series of measurements are randomized to reduce susceptibility to systematic noise sources.

The die of the Artix-7 FPGA is covered by roughly 500 μm of epoxy resin packaging material, separating the diamond from the die. This stand-off distance leads to smaller field amplitude at the NV sensor layer and acts as a low-pass filter decreasing spatial resolution. To bring the diamond closer to the die, one of the Artix-7 FPGAs was chemically decapsulated using a Nisene JetEtch Pro CuProtect decapsulator (FIG. 4C). This process used fuming sulfuric and nitric acid to remove the packaging material, exposing the die while leaving the FPGA electrically functional, including preservation of the copper wirebonds.

Figure 4D:
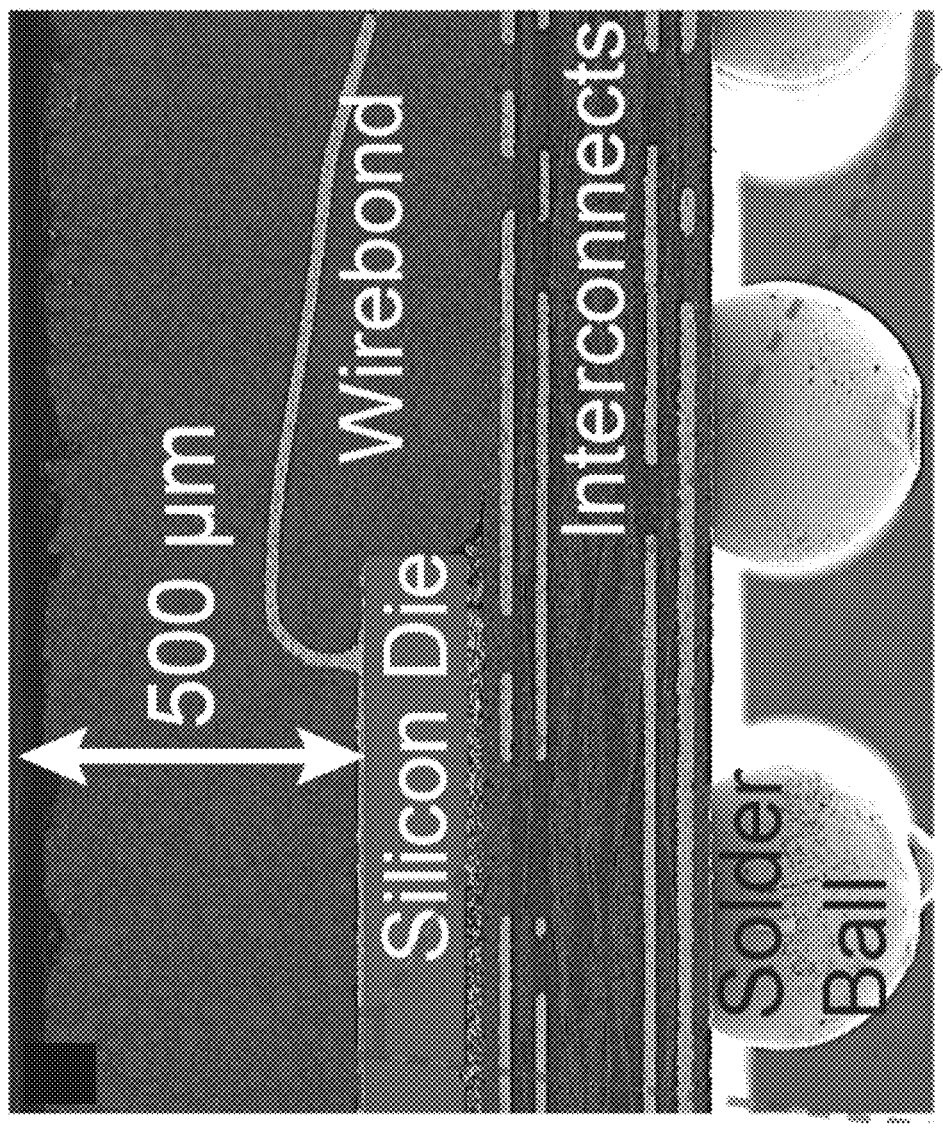
Figure 4E:
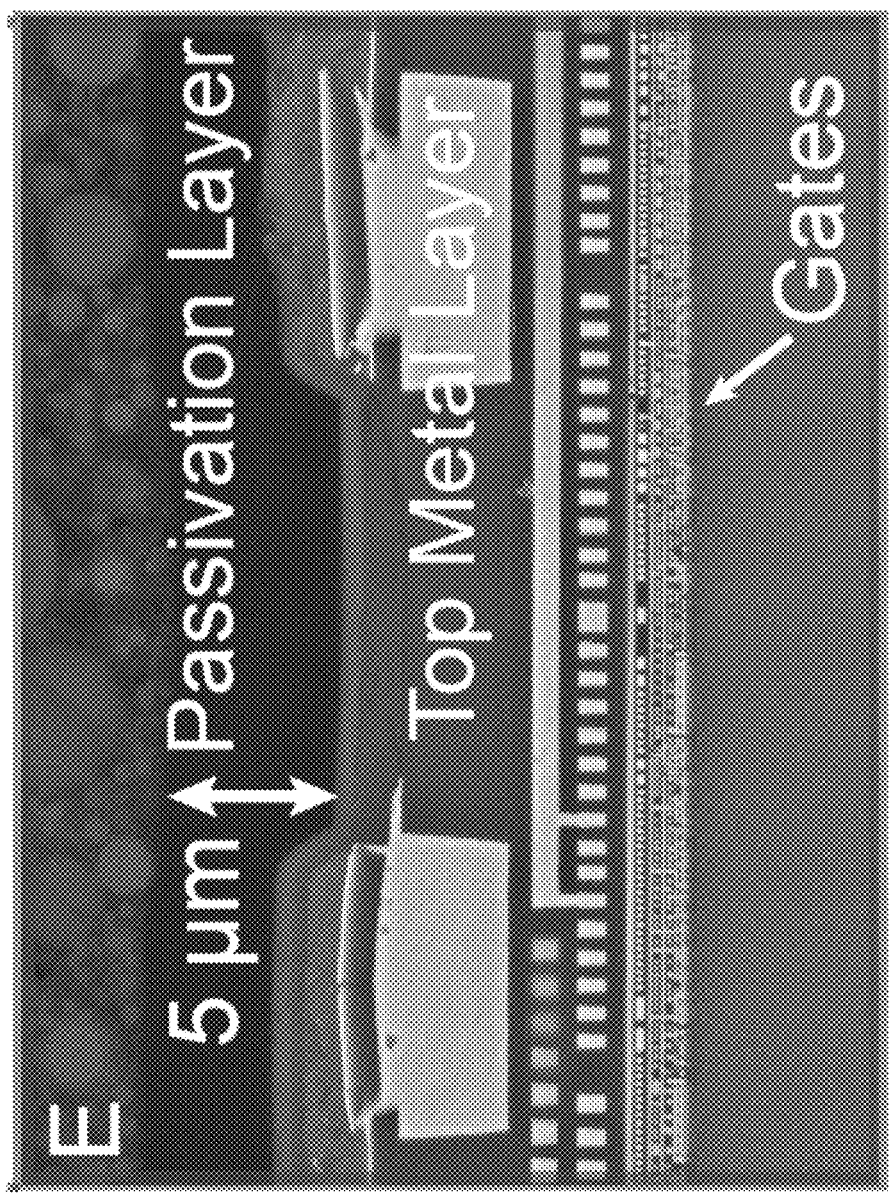

The structure of the wire-bonded Artix 7 die, shown in FIG. 4D, is optimal for studies of power delivery. The thickest layers of the metal stack are usually closest to the top side of the package in wirebonded chips. These thick layers are used for power distribution due to their relatively low resistance characteristics compared to the other layers of the IC. Clock distribution networks and inputs/outputs (I/Os) occupy the next thickest layers, and data signals are in the lowest and thinnest metal layers. Prominent magnetic fields from the current densities in the power distribution network are therefore most easily detected with topside access of a wirebonded device. The lower-level data signals are likely not observable with the present measurement configuration. FIG. 4D reveals large wire interconnects in the package substrate connecting the wirebonds and solder balls. These wires are deeper in the chip and are likely observable as low spatial frequency components in the magnetic field.

CW ODMR measurements were taken with the FPGA in both active and idle states. The magnetic field contributions due to the ROs are determined by subtracting the measured idle-state resonance frequencies from the active-state resonance frequencies, yielding the overall magnetic field due to the presence of the ROs alone. To determine the fields of the active and idle states, the terms in the Hamiltonian originating due to the active FPGA states, denoted by Δ, are separated from the terms accounting for zero-field splitting, bias field, and idle FPGA state, yielding $$H/h \approx \left(D + M_z + \frac{\partial D}{\partial T}\Delta T\right)S_z^2 + \gamma(B_z + \Delta B_z)S_z + \gamma(B_x + \Delta B_x)S_x + \gamma(B_y + \Delta B_y)S_y \quad \text{Equation 3}$$

Following these definitions and treating the off-axis magnetic fields as perturbative, the idle and active-state resonant frequencies of a single NV axis are given by $$f_{\pm,Idle} \approx (D + M_z) + \frac{3\gamma^2}{2D}(B_x^2 + B_y^2) \pm \gamma B_z \quad \text{Equation 4}$$

$$f_{\pm,Active} \approx \left(D + M_z + \frac{\partial D}{\partial T}\Delta T\right) + \frac{3\gamma^2[(B_x + \Delta B_x)^2 + (B_y + \Delta B_y)^2]}{2\left(D + M_z + \frac{\partial D}{\partial T}\Delta T\right)} \pm \gamma(B_z + \Delta B_z). \quad \text{Equation 5}$$

The desired FPGA state-dependent magnetic field projection on each NV axis, $\Delta B_{z,i}$, and the change in local temperature, $\Delta T$, are given by $$\Delta B_{z,i} = \frac{1}{2\gamma}(\Delta f_{+,i} - \Delta f_{-,i}) \quad \text{Equation 6}$$

$$\Delta T = \frac{1}{2\frac{\partial D}{\partial T}}(\Delta f_{+,i} - \Delta f_{-,i})$$

where $\Delta f_{\pm,i} = f_{\pm,i,Active} - f_{\pm,i,Idle}$. The off-axis magnetic fields of the sample are suppressed by the zero-field splitting; thus terms dependent on $\Delta B_x$ and $\Delta B_y$ are sufficiently small to be neglected in Equation 6 (discussed further below). Terms dependent on $B_x$, $B_y$, $B_z$, D, and $M_z$ are canceled by subtracting the idle resonance frequencies from the active state resonance frequencies. Determining the resonance frequencies from all four NV orientations for vector measurements, labeled by i=1, 2, 3, 4 in FIG. 3D, enables solving for the vector magnetic field in the laboratory frame $$\Delta B_X = \frac{\sqrt{3}}{2\sqrt{2}}(\Delta B_{z,2} + \Delta B_{z,4}) \quad \text{Equation 7}$$

$$\Delta B_Y = \frac{\sqrt{3}}{2\sqrt{2}}(\Delta B_{z,1} + \Delta B_{z,3})$$

$$\Delta B_Z = \frac{\sqrt{3}}{4}[(\Delta B_{z,1} - \Delta B_{z,3}) - (\Delta B_{z,4} - \Delta B_{z,2})]$$

where X Y, Z are the laboratory frame Cartesian coordinates with the X-Y plane defined as the surface of the diamond in FIG. 3B.

The ODMR lineshape for NV ensembles is well approximated by a Lorentzian lineshape. ODMR spectra for vector measurements of a $^{14}$N diamond sample contain 24 resonance features, FIG. 3D (3 hyperfine features×2 electronic spin transitions×4 NV axes). The resonance frequencies of Equation 6 are extracted from the data by fitting all the Lorentzian parameters for every pixel in the field of view. Furthermore, the contrast and linewidth of the resonances are determined, giving additional state dependent information that can be used for classification of IC activity. GPU-based fitting algorithms are used to speed up the computationally intensive fitting task and enable analysis of a large number of measurements.

Figure 5A:
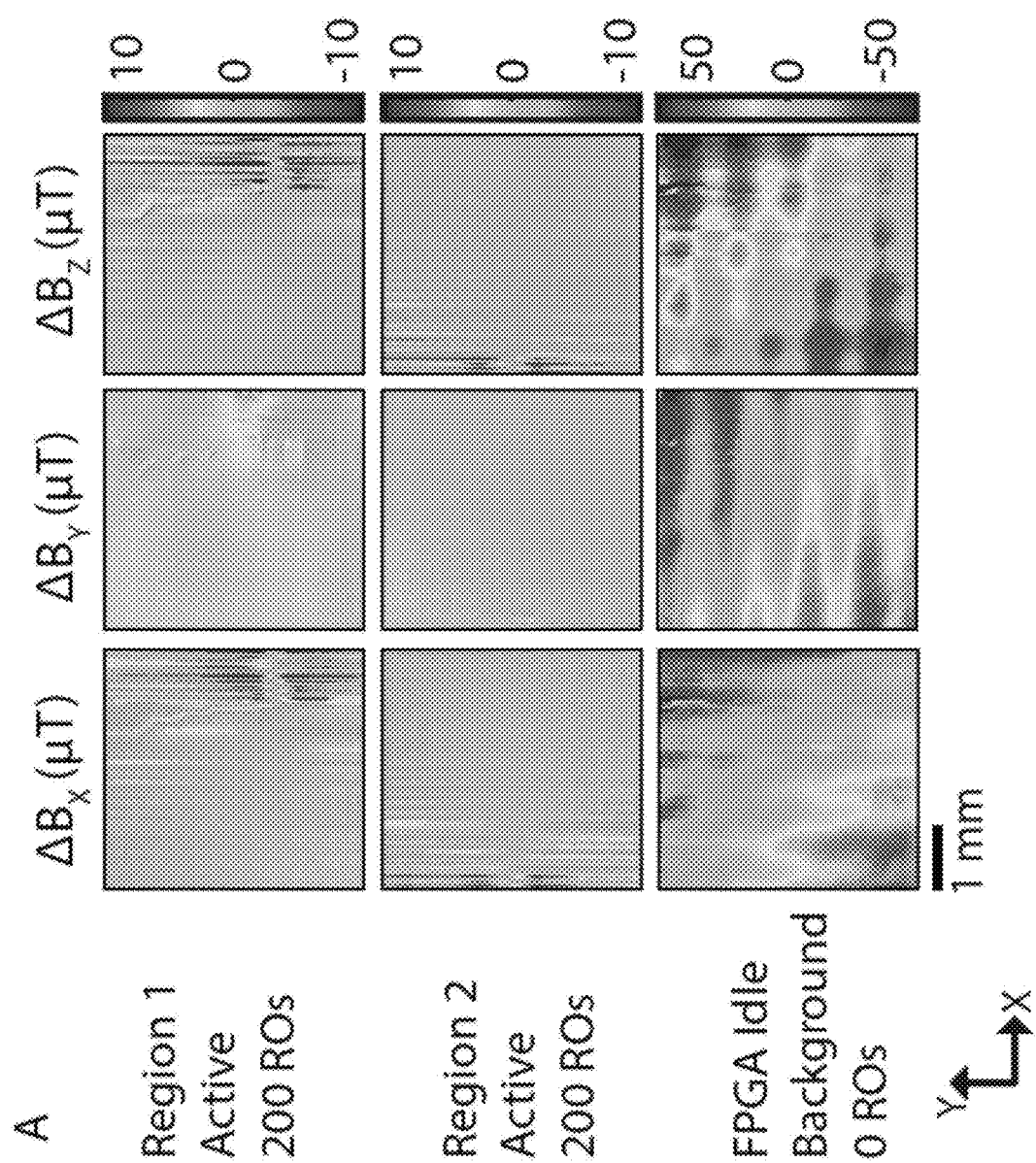
FIGS. 5A-B show vector magnetic imaging results according to embodiments of the present disclosure.
Figure 5B:
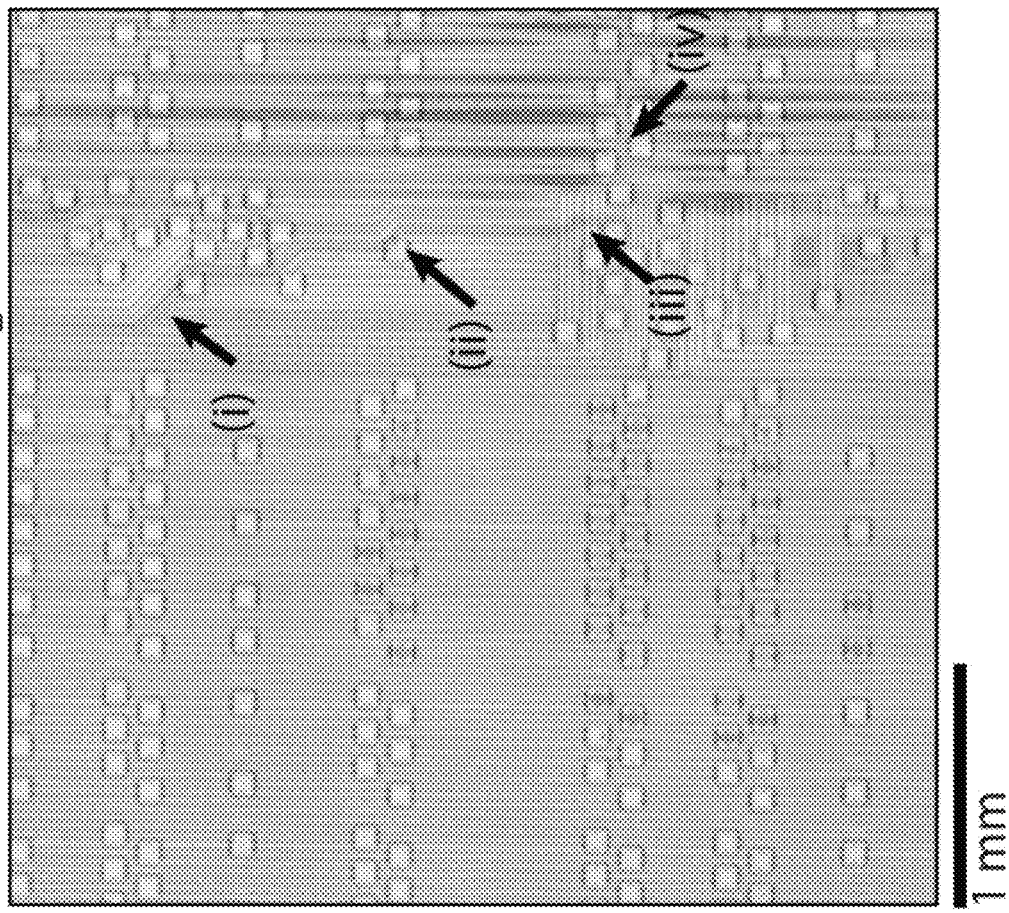

Referring now to FIG. 5, vector magnetic imaging results are provided according to embodiments of the present disclosure. In FIG. 5A, vector magnetic field maps are shown for different regions, R1 and R2, with location locked RO clusters. All images have a 3.7 mm×3.7 mm field of view. Wires on the top metal layer are generally oriented in the Y direction yielding prominent $B_X$ and $B_Z$ fields. $B_Y$ magnetic field maps show contributions from deeper sources. The background magnetic field maps with 0 ROs show variations of the field from the mean. Several different background fields are evident: a gradient from the bias magnet, the distortion of the bias field from the BGA, and background current delivery. In FIG. 5B, $B_Z$ for 200 ROs in R1 is plotted in transparency over a high resolution image of circuit die. Regions of interest discussed in the text are indicated by (i), (ii), (iii), and (iv).

FIG. 5A shows the vector magnetic field images measured on the decapsulated FPGA for clusters of N=200 ROs in two of the predefined regions indicated in the Vivado floor planner. The vector magnetic field measurements were taken with a bias field of $(B_X, B_Y, B_Z)$=(2.04, 1.57, 0.65) mT and calculated using Equation 6 and Equation 7. Observed maximum magnetic fields are on the order of 15 µT with a noise floor of ~20 nT. Spatial variation of the magnetic field is located on the right of the field of view for Region 1 (R1) and on the left for Region 2 (R2). This localization corresponds to the locations of R1 and R2 on the Vivado floor planner, indicating high current densities for power distribution are concentrated to the region of activity on the die. The vector magnetic field measured in the idle state (0 ROs) reveals the structure of the ball grid array (BGA) that connects the FPGA to the Digilent board. The difference fields due to the RO current densities are thus measured in superposition with the spatially inhomogeneous field resulting from magnetic distortion of $B_0$ due to the BGA.

The presence of a non-zero $B_Y$ component in R1 and R2 of FIG. 5A indicates contributions to the magnetic field from current density sources that run underneath and perpendicular to the visible traces of the top metal layer. These sources are likely a combination of currents in the lower layers of the metal stack and in the interconnects between the wirebonds and BGA seen in the SEM image in FIG. 4D. Discontinuities present in the $B_X$ and $B_Z$ fields indicate a change of the current direction guided by through-silicon vias. R3 and R4, seen in FIG. 4C, are both outside the measurement field of view. However, in both cases, state-dependent current is measured in locations corresponding to the direction of current flow to the appropriate location on the die (discussed further below). This increases the effective measurement field of view by capturing chip activity outside the diamond periphery.

An optical image of the die through the diamond is used to spatially align the magnetic field measurement with the high resolution optical images taken of the decapsulated chip. Spatial variation of the $B_X$ and $B_Z$ magnetic field components corresponds well with the physical features of the top metal layer. FIG. 5B shows a zoomed-in overlay of the $B_Z$ field for 200 ROs in R1 with the optical image of the die demonstrating feature alignment. Significant features are visible in the fields that correspond to physical structures including bends in the wires labeled (i) and (ii) in the figure. Some features in the magnetic field map don't correspond to any visible features on the top metal layer, such as the magnetic trace indicated by (iii) or the discontinuity in field direction indicated by (iv). These fields indicate the presence of additional current routing by vias and other structures below of the plane of the top metal layer.

Figure 6A:
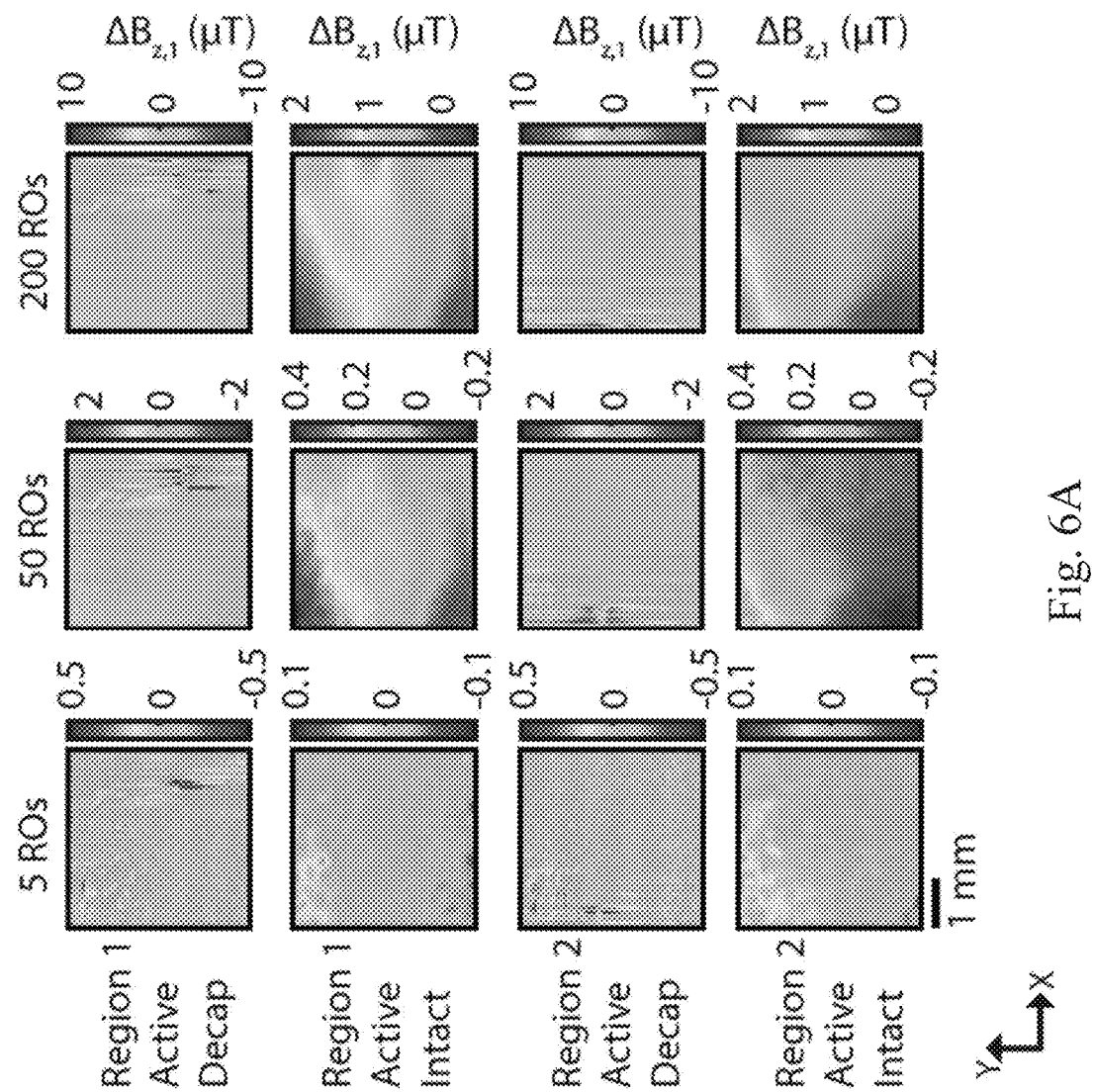
FIGS. 6A-B show single-axis magnetic imaging according to embodiments of the present disclosure.
Figure 6B:
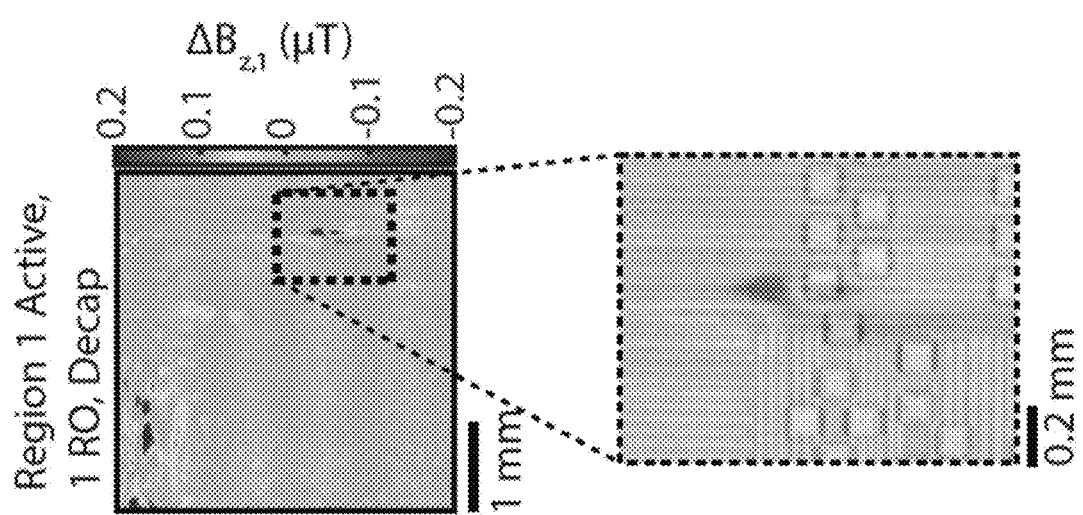

Referring to FIGS. 6A and 6B, single-axis magnetic imaging is illustrated according to embodiments of the present disclosure. FIG. 6A shows sensitivity to changing the number of ROs in different regions for the decapsulated and intact chip when performing overlapped measurements. FIG. 6B shows decapsulated data of $\Delta B_{z,1}$ for a single active RO in Region 1, demonstrating measurement sensitivity to the magnetic field from current supplying 1 RO. An overlay of the magnified single RO magnetic field with the high resolution image of the circuit die is shown in the inset. Each image is the average of 10 different runs.

Single-Axis projection imaging was used to collect a large data set of magnetic field images from RO clusters for classification. These data were taken by monitoring the outermost resonance features ($f_{-,1}$ and $f_{+,1}$) with a bias field in the lab frame of $(B_X, B_Y, B_Z)$=(2.04, 1.57, 0.65) mT. Projection imaging is useful for large data acquisition due to the speedup in measurement time; however, the vector nature of the field is not captured. The laser polarization and MWs are optimized for the single NV axis being monitored. Measuring only a single pair of resonance features results in a ~4× speed up by reducing the number of swept MW frequencies by a factor of four.

FIG. 6 shows example magnetic field images averaged over ten measurements for 5, 50 and 200 ROs in regions 1 and 2 for the decapsulated FPGA and the intact FPGA. The magnetic field reduces with diminishing numbers of ROs, due to the smaller current densities required for power distribution to smaller clusters. The maximum field amplitude does not scale linearly with number of ROs due to the currents being distributed over a differing number of wires on the top metal layer as a function of RO number active.

The ~200 nT magnetic field for single ROs was detectable for the decapsulated chip, FIG. 6B, given the experimental noise floor of 20 nT. The overlay of the measured magnetic field and the top metal layer illustrates potential location of vias where current is routed to deeper metal layers. Magnetic fields measured for the intact chip are decreased in magnitude and have lower spatially resolved features. Due to the suppression of higher spatial frequency signals at large stand-off distances, more aggressive binning and spatial filtering is used on the intact data without sacrificing spatial resolution and field information (discussed further below). This enables a better noise floor of 2 nT for the intact data to partially overcome the loss of field amplitude with distance. For some regions of the field of view the noise floor is limited by state-independent variation in the magnetic field (discussed further below) likely due to long-time power instability of the board. In order to enhance sensitivity and push the speed at which measurements can be taken, diamonds with thicker NV layers can be utilized at the cost of spatial resolution (discussed further below). Such a situation is especially beneficial when performing intact measurements where the spatial resolution is already limited by the package stand-off distance.

The state-dependent temperature of the FPGA was measured and determined using Equation 6. The dependence of current on the RO cluster size leads to state dependent temperature changes. Due to the high thermal conductivity of the monolithic crystal substrate, there is no spatial structure in the resultant temperature maps. However, from temperature measurements over the entire FOV, we are able to determine a scaling of ~0.0075° C. per active ring oscillator (discussed further below) and for the 200 RO state we saw a temperature increase of ~1.5° C.

The magnetic fields shown in FIGS. 5-6 result from the current density sources located at different depths in the FPGA. Current is distributed in the interconnect layers of the silicon die and the package substrate. Each layer acts as a quasi two-dimensional current source contributing to the overall magnetic field detected by the NVs. The stand-off distance between the NV sensing plane and the current sources determines which metal layer dominates the field measurement. Small wire features close to the sensing plane will dominate for small stand-off distance and large wire features far from the sensing plane will dominate for large stand-off distances.

The 21 μm wide wires of the top metal layer contribute to the measured $\Delta B_X$ and $\Delta B_Z$ fields as seen by the spatial features of the fields in FIG. 5. Topside decapsulation removed the 500 μm of epoxy packaging above the die shown in the SEM in FIG. 4E. This resulted in a 5-10 μm stand-off distance between the top metal layer and the NV sensing plane which is sufficiently small to resolve spatial variation of fields resulting from currents in the top metal layer. Fields from smaller wires in the metal stacks below the top metal layer are too distant to contribute to the measured field.

The measured magnetic field distributions seen for the decapsulated and intact chips show evidence of contributions from large sources far from the NV sensing plane. These sources consist of the metal layers of the 400 μm thick package substrate. The 300 μm silicon die separates the NV layer from the top of the package substrate for the decapsulated chip. An additional separation of 500 μm due to the epoxy gives a stand-off distance of 800 μm for the intact chip. These sources result in the broad features of measured $\Delta B_Y$ data for the decapsulated chip in FIG. 5A, and of the measured $\Delta B_{z,1}$ for the intact chip in FIG. 6. The dominant contribution of the substrate layers explains differences in the measured fields of the intact chip compared to those of the decapsulated chip, even when the latter are low pass filtered to account for the difference in measurement stand-off.

Comparison of the measured data with finite element analysis (FEA) simulations support the interpretation of the data as resulting from contributions of current sources in different layers at different depths from the NV plane. The FEA model, constructed in COMSOL Multiphysics, consisted of 21.6 μm wires in the top metal layer with inter-wire spacing of 12.7 μm, and 100 μm thick metal wires in the package substrate layer with inter-wire spacing of 100 μm. An inter-layer separation of 300 μm represented the thickness of the silicon die. A current of 18 mA was applied to the wires in each layer with alternating bias. Plots of $B_Z$ for planes at 25 μm and a 500 μm above the top metal layer are given (discussed further below) for comparison with the NV measurements at stand-offs for decapsulated and intact chips respectively. The spatial features of the small wires are only evident in the $B_Z$ field of the plane with small stand-off, whereas the contribution of the large wires dominates at large stand-off distances.

The measurements presented in FIGS. 5-6 are static magnetic field offsets that result from dynamic RO operation on the IC. This may be interpreted to result from a time-averaged superposition of dynamic current draws from the top metal layer to the transistor level. The ROs used for this experiment each consist of three CMOS inverters that sequentially switch state during RO operation. A small, short-circuit current spike occurs in every inverter that switches state (this is due to simultaneous conduction through the two transistors of the inverter resulting in a transient current path from supply voltage to ground). However, the individual switching of the inverters in the ROs is not temporally synchronized resulting in a time-averaged, steady-state current draw from the top metal layer, and a consequently measurable static magnetic field (discussed further below).

Full-field modeling of the current distributions and resulting magnetic fields for the different RO states programmed on the FPGA is an intractable problem without complete knowledge of wire layout and current paths. Interpretation of these measurements by comparison with simulations is therefore limited to the arguments presented in the previous section. However, the results show that significant spatial features are visually identifiable in the data and can be used to discriminate between and ultimately classify the different operating states. This is possible by leveraging automated machine learning (ML) algorithms. Ideally, a magnetic field image would be used as input to an ML algorithm, and the number of RO's would be determined as the output. This problem is approached with a limited data set of magnetic field images for each FPGA state and incorporate a dimensionality reduction algorithm before applying a classification technique with the Python package scikit-learn.

The data undergoes a series of preprocessing steps in preparation for dimensionality reduction and classification. Only images with Region 1 active are used so that the number of ROs is predicted by the classification scheme. The number of ROs activated for any given image is one of 0, 1, 5, 10, 50, 100, or 200. The data set consists of 40 images per RO state for the decapsulated chip and 32 images per RO state for the intact chip. These M×N images are subsequently binned such that the decapsulated images contain 600×606 pixels and the intact images contain 300×303 pixels, while covering the same field of view. Measurements of the idle state (0 ROs) are randomly taken during data collection to account for long term drifts. These idle state measurements are subtracted from active state images nearest in time. The intact and decapsulated data sets are split into training and test sets so that the prediction accuracy of the trained model can be estimated on data that the training procedure has not encountered. The splits are 75%/25% for the decapsulated images and 64%/36% for the intact images.

Figure 7A:
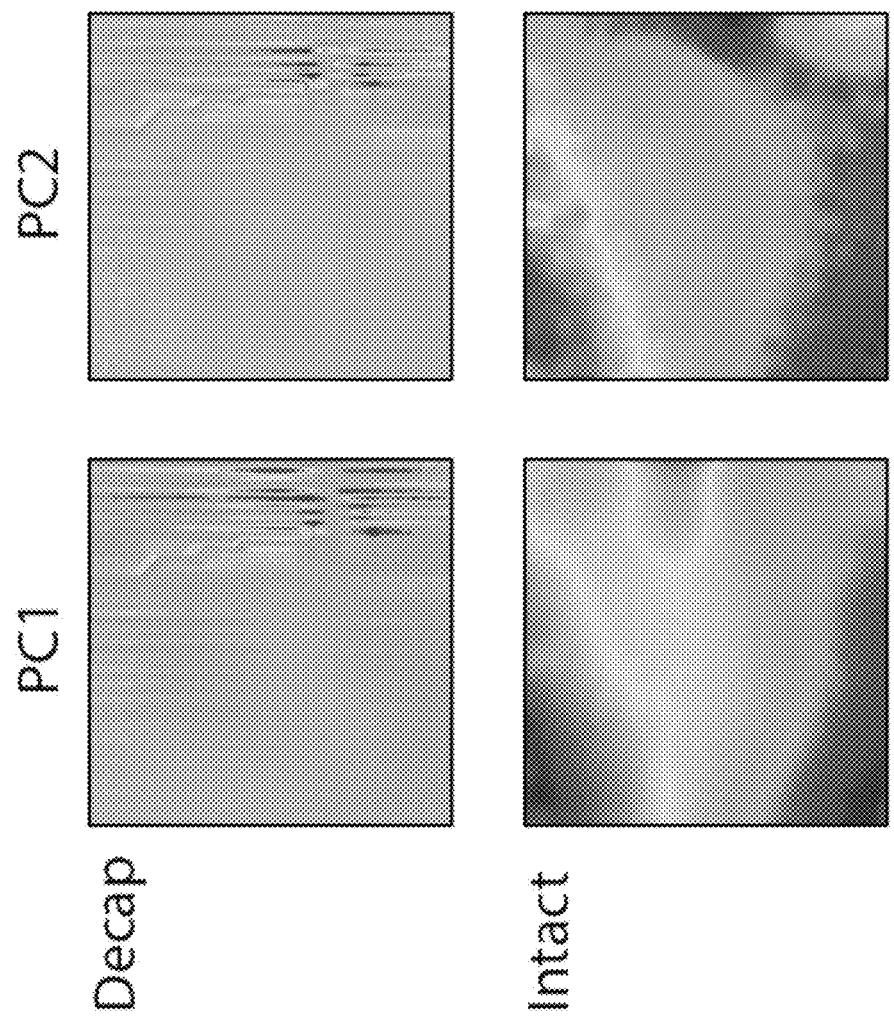
FIG. 7A-C illustrate QDM image dimensionality reduction according to embodiments of the present disclosure.
Figure 7B:
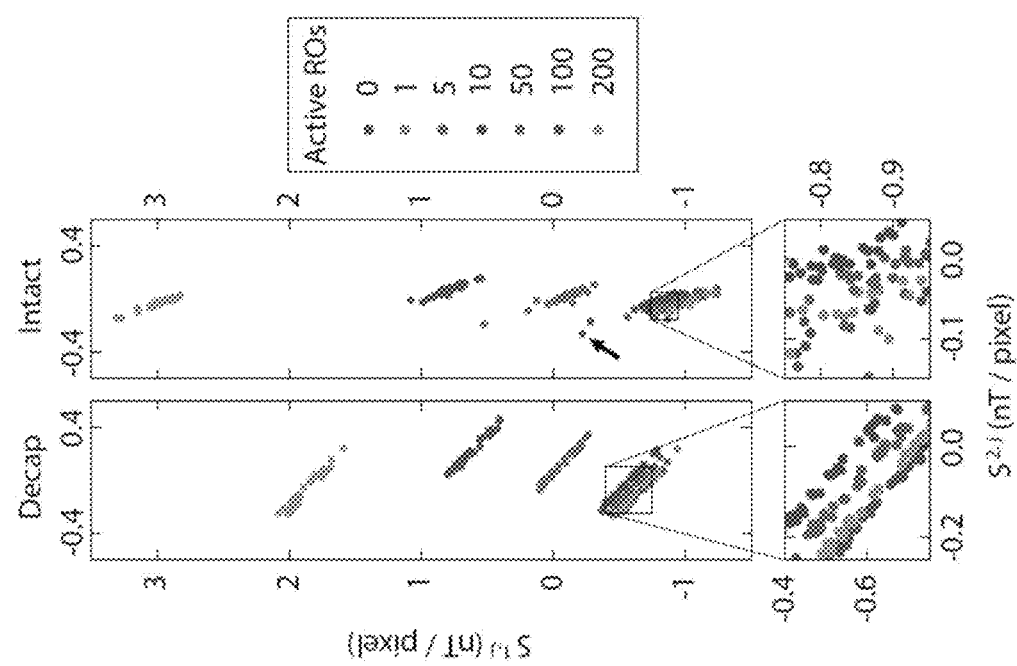
Figure 7C:
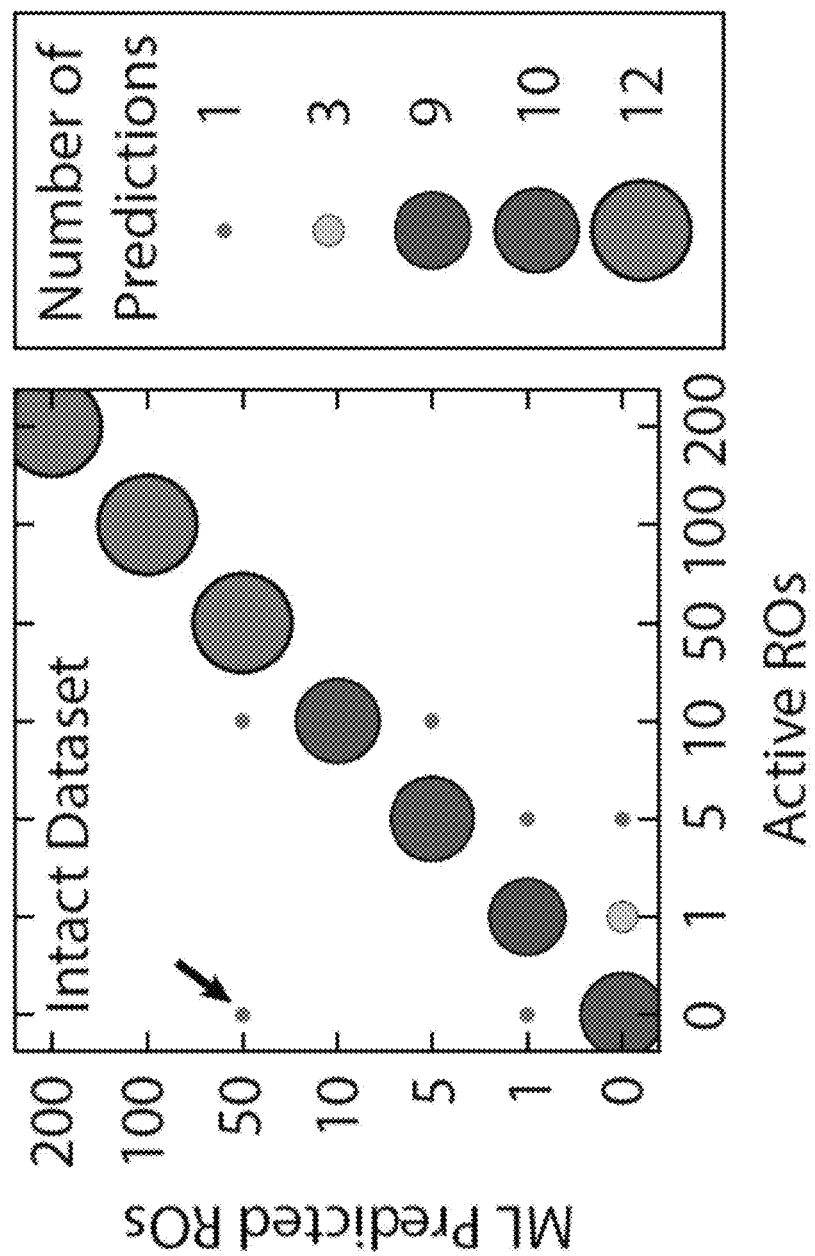

Referring to FIG. 7, QDM image dimensionality reduction is illustrated according to embodiments of the present disclosure. In particular, principal component analysis (PCA) and support vector machine (SVM) classification of B-field images is shown. Region 1 is active with 0, 1, 5, 10, 50, 100, or 200 ring oscillators (ROs). In FIG. 7A, example principal components, PC1 and PC2, are shown for both decapsulated (decap) and intact data sets. In FIG. 7B, for each magnetic field image, $B^j$, the PCA score for PC1, $S^{1,j}$, is plotted against the score for PC2, $S^{2,j}$. State distinguishability is shown by separation of colors representing differing numbers of active ROs. Insets magnify the scores for small numbers of ROs, and show greater fidelity of state separation in the decapsulated data set compared to the intact data set. In FIG. 7C, SVM predictions on the test set for the intact images. The predicted number of ROs is plotted against active number of ROs as a 2D histogram. The number of predictions is represented by the color and size of the points. All but one prediction (indicated by the arrows) lie on or near the main diagonal demonstrating the high predictive power of the SVM classifier. The corresponding plot for the decapsulated data set is not shown as all the points lie on the main diagonal due to perfect separability of each state (see Table 1).

TABLE 1

| | Number of ROs (Region 1) | | | | | | | |
| --- | --- | --- | --- | --- | --- | --- | --- | --- |
| | 0 | 1 | 5 | 10 | 50 | 100 | 200 | Total |
| Decapsulated | 1.00 | 1.00 | 1.00 | 1.00 | 1.00 | 1.00 | 1.00 | 1.00 |
| Intact | 0.83 | 0.75 | 0.83 | 0.83 | 1.00 | 1.00 | 1.00 | 0.89 |

The magnetic field images are composed of ~$10^5$ pixels and thus occupy a high dimensional space for classification. Principal component analysis (PCA) is therefore used to reduce the dimensionality of the classification problem. PCA is a technique that determines the highest variability axes of a high-dimensional data set. PCA amounts to an eigenanalysis where the eigenvectors, called principal components (PC), correspond to the axes of interest and the eigenvalues relate to the amount of data variance along the respective PCs.

PCA is applied separately to the data sets of the decapsulated chip and the intact chip (e.g., with the scikit-learn class decomposition.PCA( )) and yields PCs such as those plotted in FIG. 7A. Spatial patterns evident in the PCs are also present in the magnetic field images of FIG. 6, confirming that these features are physically significant and important for distinguishing between different samples. There exist as many PCs as dimensions in the data set; however, only the first several PCs capture non-noise based information (discussed further below). More than 99% of the variance in the intact and decapsulated data sets is captured by the first n=9 PCs, which are therefore the only 567 PCs used in this analysis.

The dimensionality of the magnetic field images is thereby effectively reduced from ~$10^5$, pixels to these first 9 PCs. Principal component scores, $S^{i,j}$, for each image are determined by taking the dot product of the $i^{th}$ PC, defined as $W^i$, with the $j^{th}$ image, $B^j$, and normalized by the total number of pixels. This gives $$S^{i,j} = \frac{1}{MN} \sum_{m=1}^{M} \sum_{n=1}^{N} W^i_{m,n} B^j_{m,n} \qquad \text{Equation 8}$$

for the first 9 PCs. FIG. 7B shows examples of the PCA scores: the score for PC1 is plotted against the score for PC2 for each magnetic field image of both the decapsulated and intact data (additional principal components and score plots are given below). The plot is color coded by number of active ROs showing that these two scores are useful in distinguishing the number of active ROs on the FPGA for both decapsulated and intact measurements. Classification of the active number of ROs is accomplished by using the first 9 PCA scores as input to a support vector machine classifier algorithm. The spread of data points along a fixed slope for each state in FIG. 7B is consistent with small offsets between different image acquisitions (discussed further below).

In various embodiments, IC Activity State Classification is provided. A support vector machine (SVM) is the supervised classification technique used to classify the magnetic field images, leveraging their key features characterized by the PCA scores. SVMs are a set of algorithms that seek to classify samples by creating a boundary between categories of a training data set that maximizes the gap separating those categories. Samples from a test set are then classified in relation to this boundary. In an exemplary embodiment, the scikit-learn class svm.SVC( ) is used as a multidimension, multi-category classifier. The categories for classification are the chip states given by the number of ROs. The dimensionality is given by the 9 PCA scores recorded for each image. We fit the PCA scores to the known FPGA states with a linear SVM model and a regularization parameter of C=6 (discussed further below).

The full model, including preprocessing, PCA, and SVM, is fit using the training set and subsequently evaluated on the test set. A prior step of cross-validating the model hyperparameters is taken for the intact data set (discussed further below). The model efficacy, summarized in Table 1, is determined by the accuracy of the test set evaluations. The chip states are well separated in PCA-space for the decapsulated data set. Predictions on the test set consequently yield perfect accuracy, even for small numbers of ROs, consistent with expectations (discussed further below).

The images of the intact data set are similarly well separated for large numbers of ROs, resulting in perfect prediction accuracy for >50 ROs. However, the chip states are not well separated for <50 ROs, resulting in imperfect predictions. The trained model achieves 80% accuracy for each of 0, 1, 5, and 10 RO active states. FIG. 7C additionally shows that incorrect predictions are nearly always close to the correct state. For example, the model predicts 5 ROs correctly in 83% of test cases, with misclassifications of 0 or 1 RO otherwise. The arrow in FIG. 7C indicates a case for which the classifier incorrectly predicts 50 ROs for a 0 RO state. An analogous arrow in FIG. 7B shows that the PCA score for this state is an outlier in the data (discussed further below). The positive classification results presented in FIG. 7 give an initial demonstration of the capability to identify chip activity via non-invasive measurements with the QDM. Larger data sets populating machine learning methods have promise to enable classification of chip activity in the context of hardware security applications.

The present disclosure demonstrates NV diamond imaging of the DC component of magnetic field emanations from an integrated circuit. The ensemble NV measurement technique of the QDM yields simultaneous wide-field-of-view images with high resolution that are not achievable using other magnetometry techniques. The present disclosure further demonstrates that these images can be used to quantifiably determine the active state of the integrated circuit with a degree of success dependent on the stand-off distance between the circuit currents and the measurement plane.

NV diamond magnetic fields imaging of integrated circuits is useful as a diagnostic technique in areas ranging from fault detection, Trojan detection, counterfeit detection, watermarking, and electromagnetic side channel characterization. The DC component of the magnetic field from the power distribution network of an IC is a powerful indicator of chip activity. The simultaneous wide-field imaging further enables analysis of spatially resolved or correlated transient events over sequential measurements that is not possible with scanning magnetometry techniques.

A larger data set allows for leveraging the full power of convolutional neural networks for advanced state classification. Further time-resolved measurements also allow for separation of magnetic fields by temporal or frequency profiles. Such measurements may separate power signals from clock signals or even gate signals giving further indication of chip activity.

As set out above, a classifier is used in various embodiments. In some embodiments, the classifier is a support vector machines (SVM). However, it will be appreciated that a variety of other classifiers are suitable for use according to the present disclosure, including linear classifiers, random decision forests, or neural networks such as recurrent neural networks (RNN).

Suitable artificial neural networks include but are not limited to a feedforward neural network, a radial basis function network, a self-organizing map, learning vector quantization, a recurrent neural network, a Hopfield network, a Boltzmann machine, an echo state network, long short term memory, a bi-directional recurrent neural network, a hierarchical recurrent neural network, a stochastic neural network, a modular neural network, an associative neural network, a deep neural network, a deep belief network, a convolutional neural networks, a convolutional deep belief network, a large memory storage and retrieval neural network, a deep Boltzmann machine, a deep stacking network, a tensor deep stacking network, a spike and slab restricted Boltzmann machine, a compound hierarchical-deep model, a deep coding network, a multilayer kernel machine, or a deep Q-network.

The progression from Equation 4 and Equation 5 to Equation 6 can be understood in accordance with the following. Treating the off-axis fields as perturbative, the difference between the active and idle state resonance frequencies is given by:

$$f_{\pm,i,Active} - f_{\pm,i,Idle} \approx \left(D + M_z + \frac{\partial D}{\partial T}\Delta T\right) + \quad \text{Equation 9}$$

$$\frac{3\gamma^2[(B_x+\Delta B_x)^2 + (B_y+_y)^2]}{2\left(D + M_z + \frac{\partial D}{\partial T}\Delta T\right)} \pm \gamma(B_z + \Delta B_z) -$$

$$(D + M_z) - \frac{3\gamma^2(B_x^2 + B_y^2)}{2(D+M_z)} \mp \gamma B_z$$

In the limit of $$D \gg \frac{\partial D}{\partial T}\Delta T, M_Z$$

the denominators in the off-axis magnetic field terms simplify to 2D, giving $$f_{\pm,i,Active} - f_{\pm,i,Idle} \approx \left(D + M_z + \frac{\partial D}{\partial T}\Delta T\right) + \quad \text{Equation 10}$$

$$\frac{3\gamma^2[(B_x+\Delta B_x)^2 + (B_y+\Delta B_y)^2]}{2D} \pm \gamma(B_z + \Delta B_z) -$$

$$(D + M_z) - \frac{3\gamma^2(B_x^2 + B_y^2)}{2D} \mp \gamma B_z =$$

$$\frac{\partial D}{\partial T}\Delta T + \frac{3\gamma^2[2B_x\Delta B_x + \Delta B_x^2 + 2B_y\Delta B_y + \Delta B_y^2]}{2D} \pm \gamma \Delta B_z$$

Terms on the order $\Delta B_x^2$ and $\Delta B_y^2$ are negligible and can be ignored, as are terms dependent on off-axis magnetic fields given that $$\frac{\gamma B_x}{D} < 10^{-2}.$$

These terms only impact the common mode splitting (i.e. temperature measurements) and do not couple into measurements of $B_z$ to first order, allowing for a further simplification to $$\Delta f_{\pm,i} = f_{\pm,i,Active} - f_{\pm,i,Idle} \approx \frac{\partial D}{\partial T}\Delta T \pm \gamma \Delta B_z \quad \text{Equation 11}$$

which is the result presented above.

The center frequencies of the measured ODMR resonance features are determined by fitting the spectra with Lorentzian curves. The relevant measurement parameter for magnetometry is the Lorentzian line center, denoted $x_0$, which is extracted by fitting the data with a Lorentzian function given by:

$$F = 1 + F_0 + \frac{C_1\gamma^2}{(x - x_0 + A)^2 + \gamma^2} + \quad \text{Equation 12}$$

$$\frac{C_2\gamma^2}{(x - x_0)^2 + \gamma^2} + \frac{C_3\gamma^2}{(x - x_0 - A)^2 + \gamma^2}$$

where $F_0$ is an offset, $C_1$, $C_2$, and $C_3$ are the contrast values for the different hyperfine features of a given resonance, $\gamma$ is the resonance linewidth, $x_0$ is the line center, and A is the hyperfine splitting treated as a constant 2.158 MHz. This fit is performed for each of the 8 (4 crystal axes and 2 electronic transitions) different resonance groupings. The contrast is treated as three different parameters for the three hyperfine features to account for differences due extra small peaks from the forbidden hyperfine transitions. The resonances are sufficiently broadened by the MW power and high [N] of the diamond to allow for the linewidth to be treated as one parameter.

Referring to FIG. 8, multimodal imaging is illustrated according to embodiments of the present disclosure, including magnetic field, contrast, linewidth, and temperature. In FIG. 8A, images are provided of the projection of magnetic field onto NV axis one for the idle and 200 ROs activate states in Region 1 (regions are defined above). In FIG. 8B, the resonance linewidth shows a strong dependence on other features like MW power, laser power, strain gradients, time varying magnetic fields, and temporal variations that are fast relative to the measurement time. In FIG. 8C, the resonance contrast contains similar information to the linewidth, but is strongly influence by variations in the laser over the field of view. In FIG. 8D, the change in the average state dependent temperature is shown as a function of the number of active ring oscillators in Region 1.

Figure 8A:
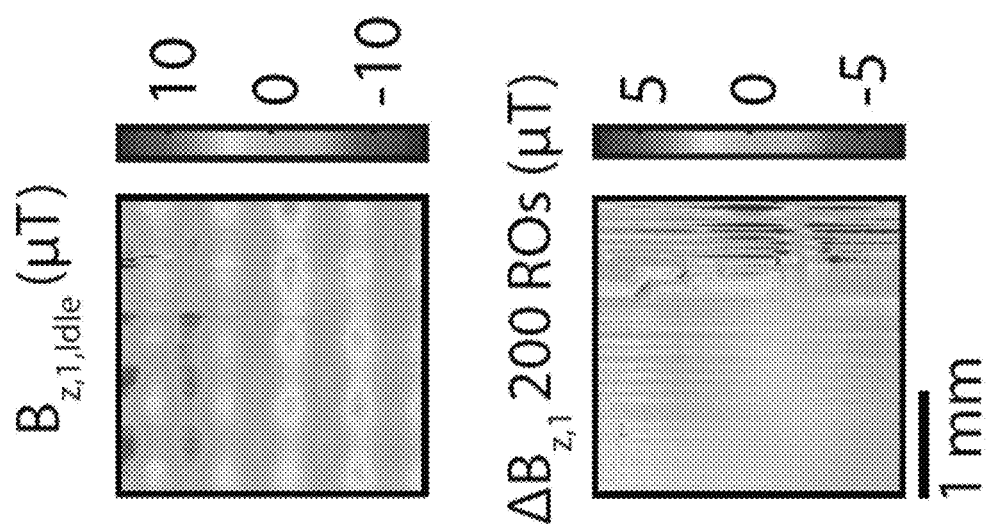
FIGS. 8A-D shows multimodal imaging according to embodiments of the present disclosure.

The above discussion presents DC magnetic field maps of active ICs that are determined from the measured magnetic field-induced splitting of resonance line centers. Determining the value of the resonance line centers requires fitting Lorentzian functions to the measured ODMR resonance features as described in the previous section. An example of the $B_z$ field image determined from fitting to the measured ODMR spectra in each camera pixel is shown in FIG. 8A. Fitting also extracts the Lorentzian linewidth and contrast, which can contain useful information about the properties of magnetic fields emanating from the circuit, and can be used as additional inputs to machine learning models to fingerprint IC activity.

Figure 8B:
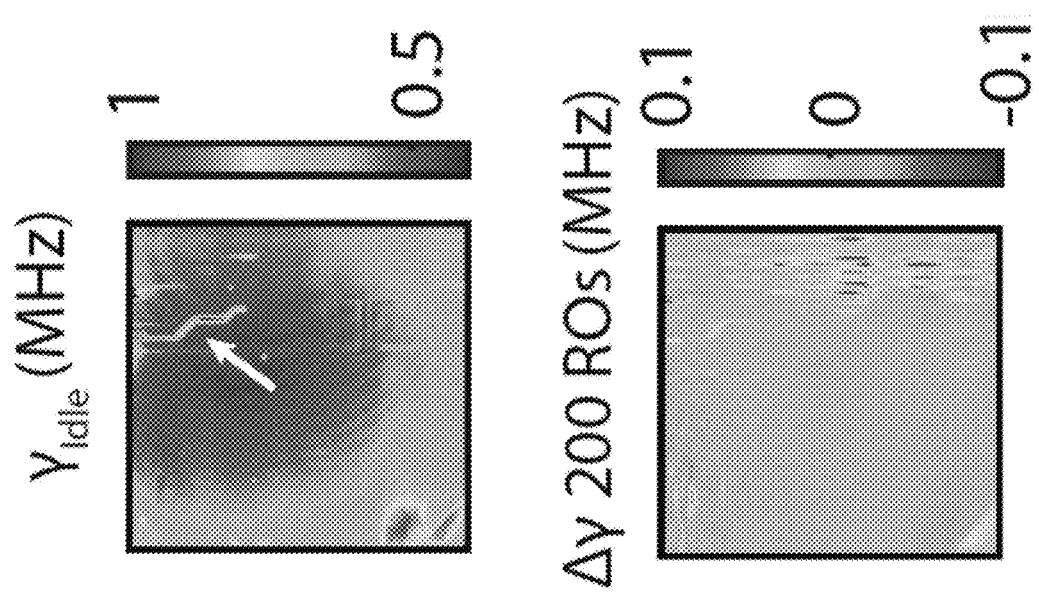
Figure 8C:
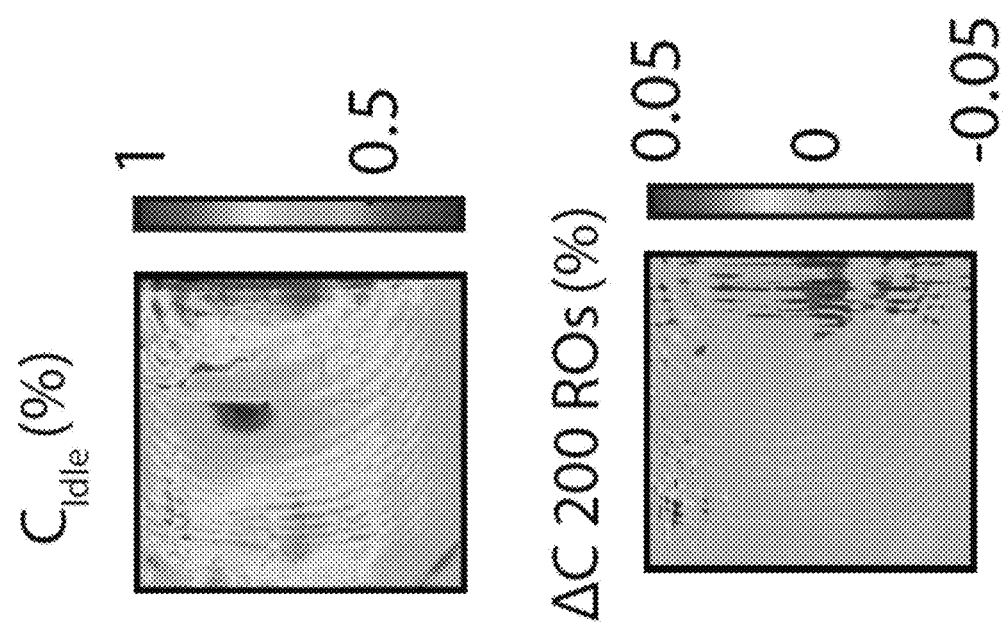
Figure 8D:
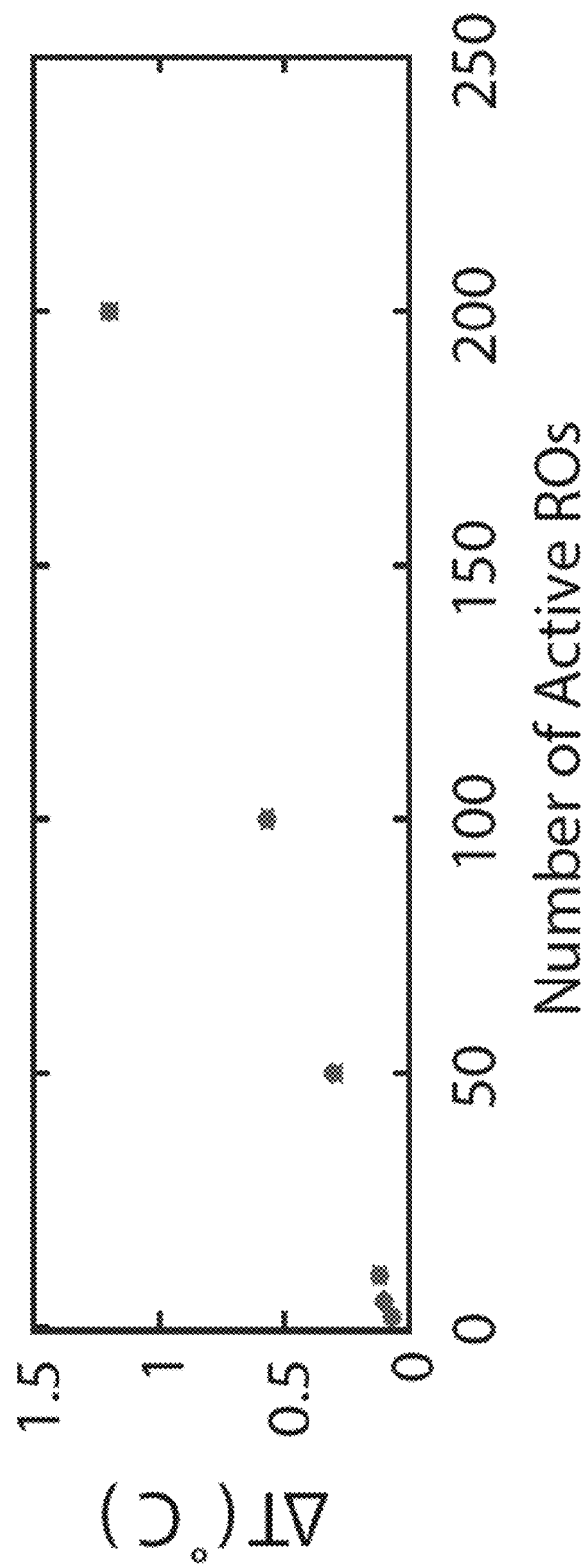

The state-dependent linewidth is dependent on several physical phenomena including magnetic field and strain gradients within a pixel, variations in the magnetic field over the measurement time, and spatial variations in the laser, microwaves, and bias field. FIG. 8B shows an example of the calculated linewidth images for the idle and 200 RO active states. As indicated by a white arrow in FIG. 8B, one can see a strong broadening mechanism which is likely due to strong zero-mean time varying magnetic fields (since this feature doesn't appear in the magnetic field map in FIG. 8A). Similar types of features can be seen in the Lorentzian contrast images of the idle and 200 RO state in FIG. 8C. However, due to the strong dependence of the contrast on optical power these maps are more sensitive to interference fringes. These fringes are likely due to reflections of the green laser from the passivation layer of the decapsulated chip.

Temperature changes in the diamond are determined from common mode shifts of NV resonance line centers. The common mode shift for each pixel is calculated and then all the pixels are averaged together to give a single value for the bulk crystal temperature. The thermal conductivity of single crystal diamond is large enough so the diamond equilibrates to a uniform temperature on time scales much shorter than the measurement time. As such, wide field-of-view ensemble NV measurements in diamond are not well-matched for imaging temperature variations and are not suitable for determining regional activity on the IC based on thermal signatures. The changes in bulk crystal temperature can be used to improve state classification through understanding of power consumption in the chip, but do not allow for spatial selectivity.

Ultimately, the multimodal information from the magnetic field maps, linewidth, contrast, and temperature may be used to create a more detailed fingerprint of IC activity. These physical parameters provide a rich data set of features that afford further dimensionality for characterization and classification.

Figure 9:
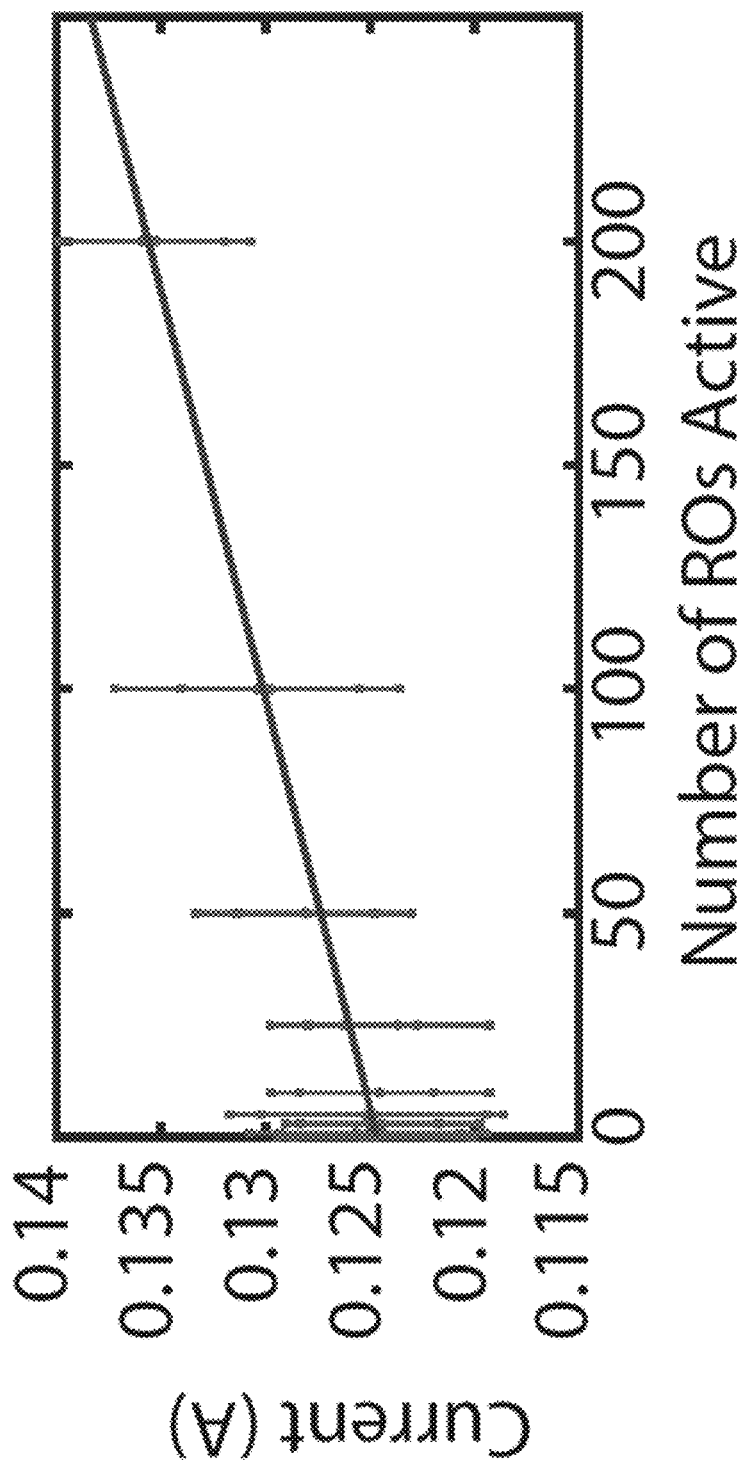
FIG. 9 is a graph of current versus number of active ring oscillators (ROs) in a development board according to embodiments of the present disclosure.

Referring to FIG. 9, state dependent current delivery to a development board is illustrated according to embodiments of the present disclosure. In particular, FIG. 9 provides a plot of the measured DC current delivered to the development board as a function of the number of ROs active in Region 1. The large error bars result from the activity of other components on the development board, independent from the FPGA, that draw varying amounts of current over the duration of a given measurement.

The global DC current delivered to the Nexys A7 development board is measured as a function of the number of active ROs to obtain an approximation of the current required by the integrated circuit for each state. The current was determined by measuring the voltage across a fixed resistance at the input of the development board. The time variation of the voltage was recorded on a fast (1 GHz) oscilloscope.

The Nexys A7 contains many components in addition to the Artix 7 FPGA and has many processes running in parallel to the FPGA. The measured voltage is consequently dependent on other processes executing on the board that are independent of the activity of the integrated circuit. This results in a voltage signal full of extraneous spikes and other information, hurting the measurement confidence in the measurement of DC currents (see FIG. 9). The voltage was measured on the scope for 1 ms at a sampling rate of 1 GHz. The current was calculated through precise measurement of the resistance used.

This process was repeated twice for each state, with ROs activated in Region 1. The resulting data is plotted in FIG. 9. The error bars represent the standard deviation of the voltage over the 1 ms of signal acquisition. The current scales linearly with the number of ROs (0.055 mA per active RO). The resultant linear fit is shown below.

$$I_{tot}=0.055(\text{mA/RO})N_{RO}+120 \text{ mA} \quad \text{Equation 13}$$

Assuming a simple model of the current being confined to a single wire-like structure and a stand-off distance of ~15 μm yields approximate scaling of 500 nT/RO. This is likely an over-estimate because the currents are distributed over many wires and there can additionally be cancellation from neighboring sources.

Figure 10A:
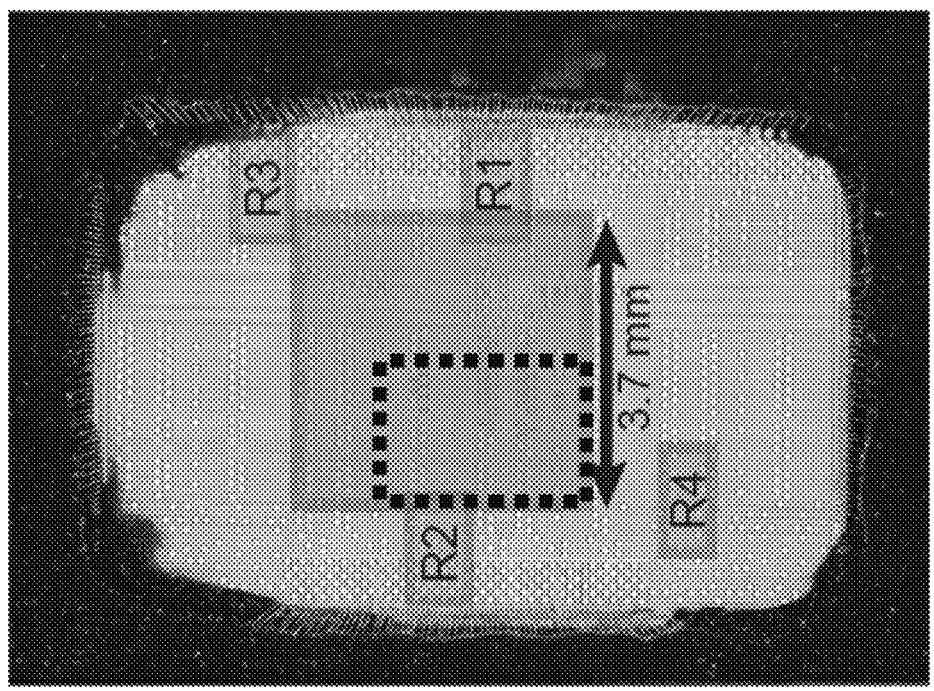
FIGS. 10A-B shows the measured noise floor according to embodiments of the present disclosure.
Figure 10B:
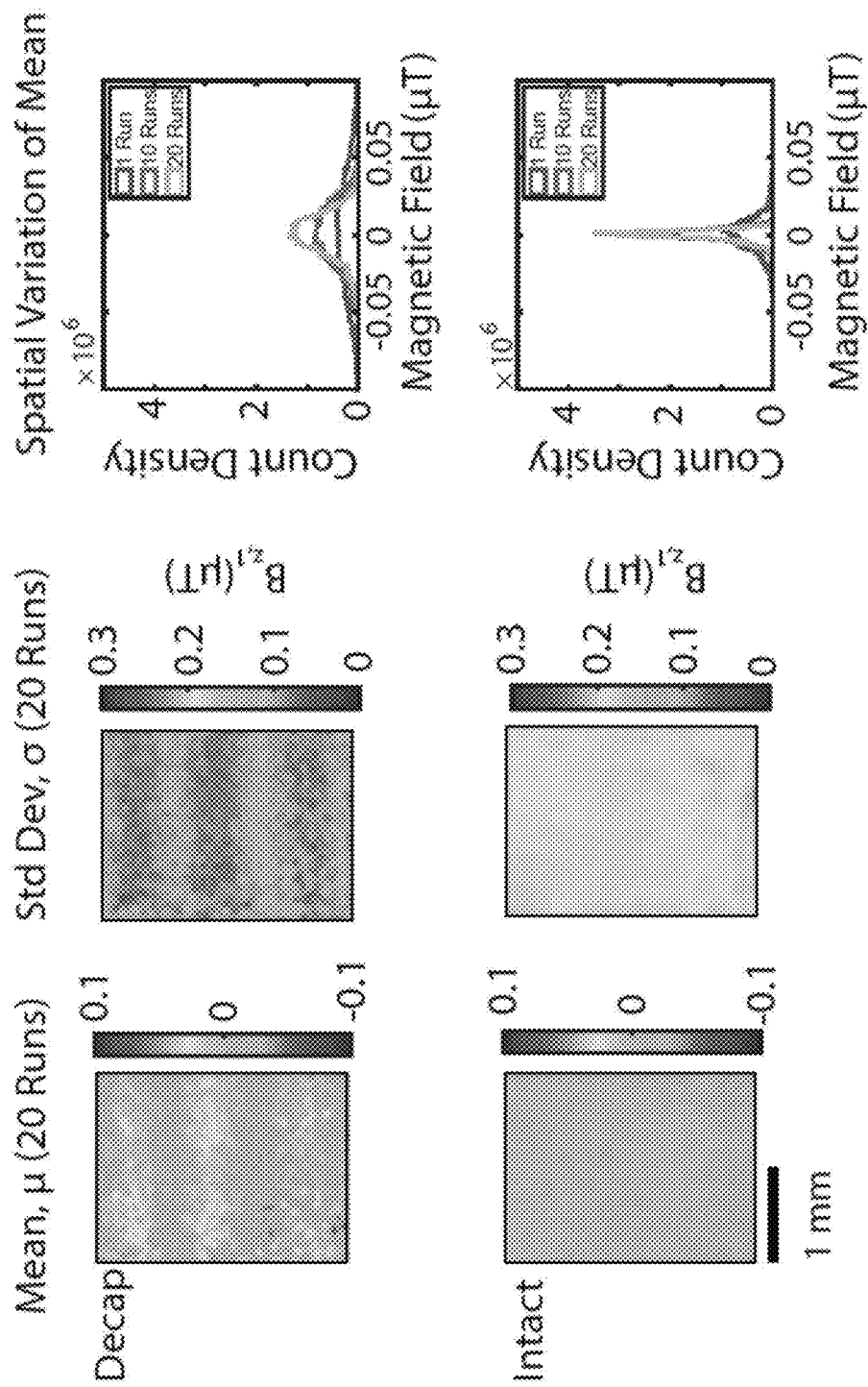

Referring to FIG. 10, the measured noise floor according to embodiments of the present disclosure is illustrated. In FIG. 10A, the subset of pixels used for calculation of mean and standard deviation is shown. The region of board is relatively quiet while in the 0 RO/Idle State. In FIG. 10B, mean distribution and standard deviation are shown over 20 runs and the noise floor achieved in the mean run as a function of number of runs averaged together. Width of the histogram gives the noise floor: ~20 nT for the Decap dataset measurements and ~2 nT for the Intact dataset.

Properly calibrated and corrected measurements of a quiet subregion of the chip should result in a uniform magnetic field in all the pixels of the subregion. Any variation in the measured magnetic field across these pixels is a result of noise (whether it be technical noise or more fundamental noise sources like shot noise.) The dashed line in FIG. 10A indicates one such low-activity subregion that is selected to differentiate the measurement-limited noise floor from the state-independent variations in the idle state of the IC. The spatial noise floor is defined as the full-width-at-half-maximum of the histogram of magnetic field values of all the pixels in the subregion. Measurements over multiple experimental runs are averaged together to determine the magnetic field in each pixel. The histogram is plotted multiple times for a variable number of averaged runs. As the number of averaged runs increases, the width of the histogram narrows, demonstrating the suppression of noise with averaging over many runs.

The spatial noise floor is thus an important figure-of-merit for characterizing QDM performance when measuring spatially varying, quasi-static magnetic fields. Twenty different data collection runs were utilized for this analysis. The mean and standard deviation for each pixel over these 20 measurements were calculated and plotted over the subsection field-of-view in FIG. 10B. The scaling of the noise floor as a function of number of runs for this data set is indicated by a plotted histogram of the mean pixels after 1, 10, and 20 data collection runs. The high frequency spatial variation in the decapsulated (decap) data leads to a broader distribution of mean values. In contrast, the larger stand-off distance of the intact data allowed for more aggressive binning and Gaussian filtering to be utilized. This binning and filtering resulted in a lower noise floor for the intact data (2 nT) compared to the decap data (20 nT). This noise floor is likely due to a combination of photon shot noise, laser intensity noise, and/or electronic noise from the camera.

Figure 11A:
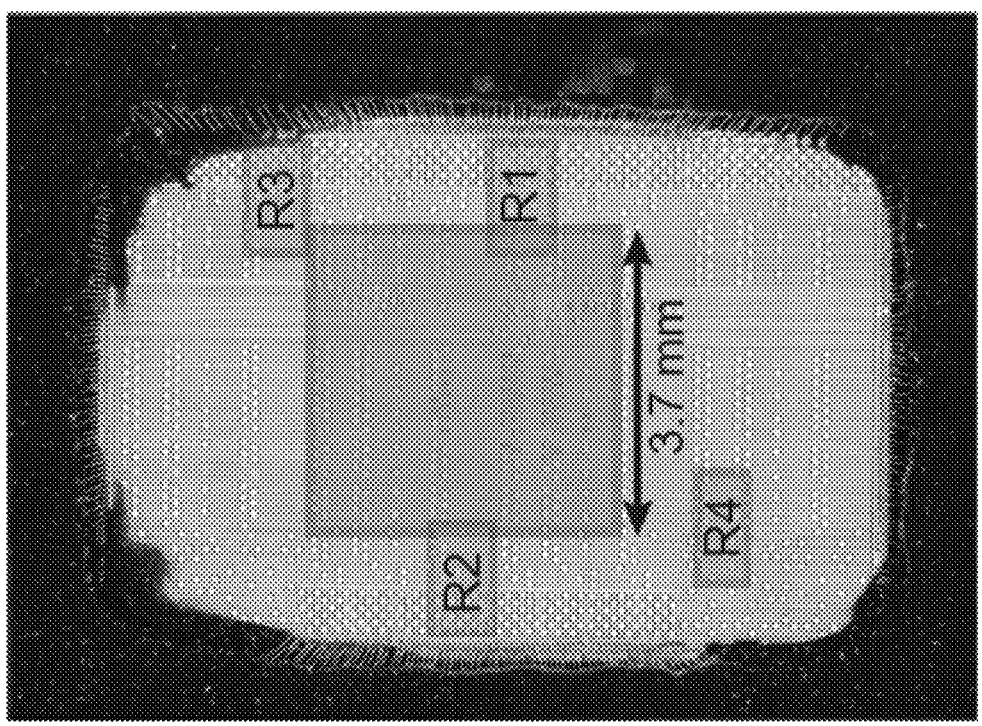
FIGS. 11A-B show vector magnetic field measurements of active regions according to embodiments of the present disclosure.
Figure 11B:
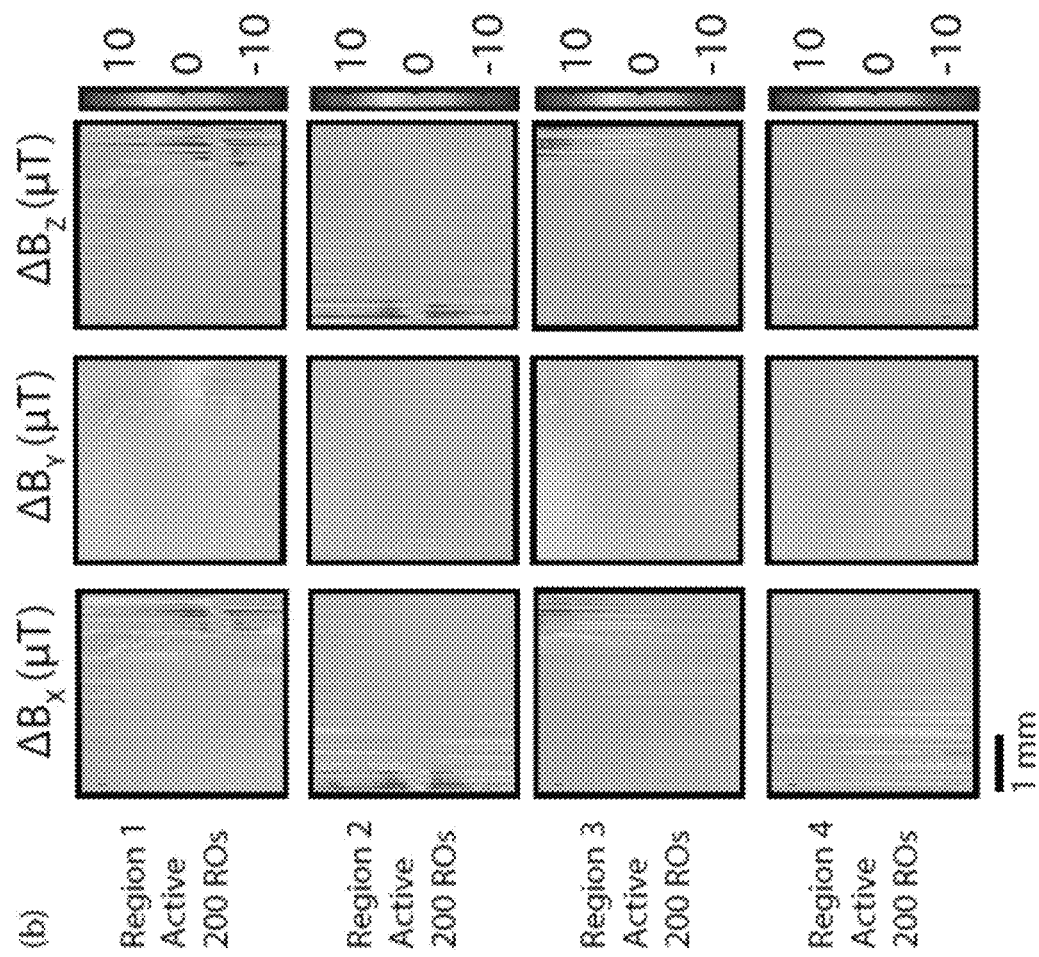

Referring to FIG. 11, vector magnetic field measurements of additional active regions are shown according to embodiments of the present disclosure. In FIG. 11A, the location of the active RO regions (red boxes) relative to the diamond field-of-view (grey box) are shown. In FIG. 11B, the spatial fingerprint of vector magnetic field maps for ROs active in each of the four different regions.

The FPGA was programmed to have clusters of ROs activated in four distinct location-locked regions as shown in FIG. 11A. ROs were active in only one region at any time.

The main text discusses two regions, R1 and R2, that were within the field-of-view of the diamond. The other two regions, R3 and R4, were outside of the diamond field of view, and were activated to search for extended indicators of regional activity.

FIG. 11B shows that state dependent magnetic fields are evident for 200 ROs in R3 and R4, even though both regions are outside the measurement field of view. FIG. 11B also reproduces the fields for 200 ROs in R1 and R2 presented in FIG. 5 for comparison. These measurements take advantage of the extended current routing networks on the chip. One can start to infer some general trends about shared resources on the FPGA. For example, activation of 200 ROs in R1 and R3, both on the right side of the die, gives rise to strong $\Delta B_Y$ fields in similar locations in the field of view.

Figure 12:
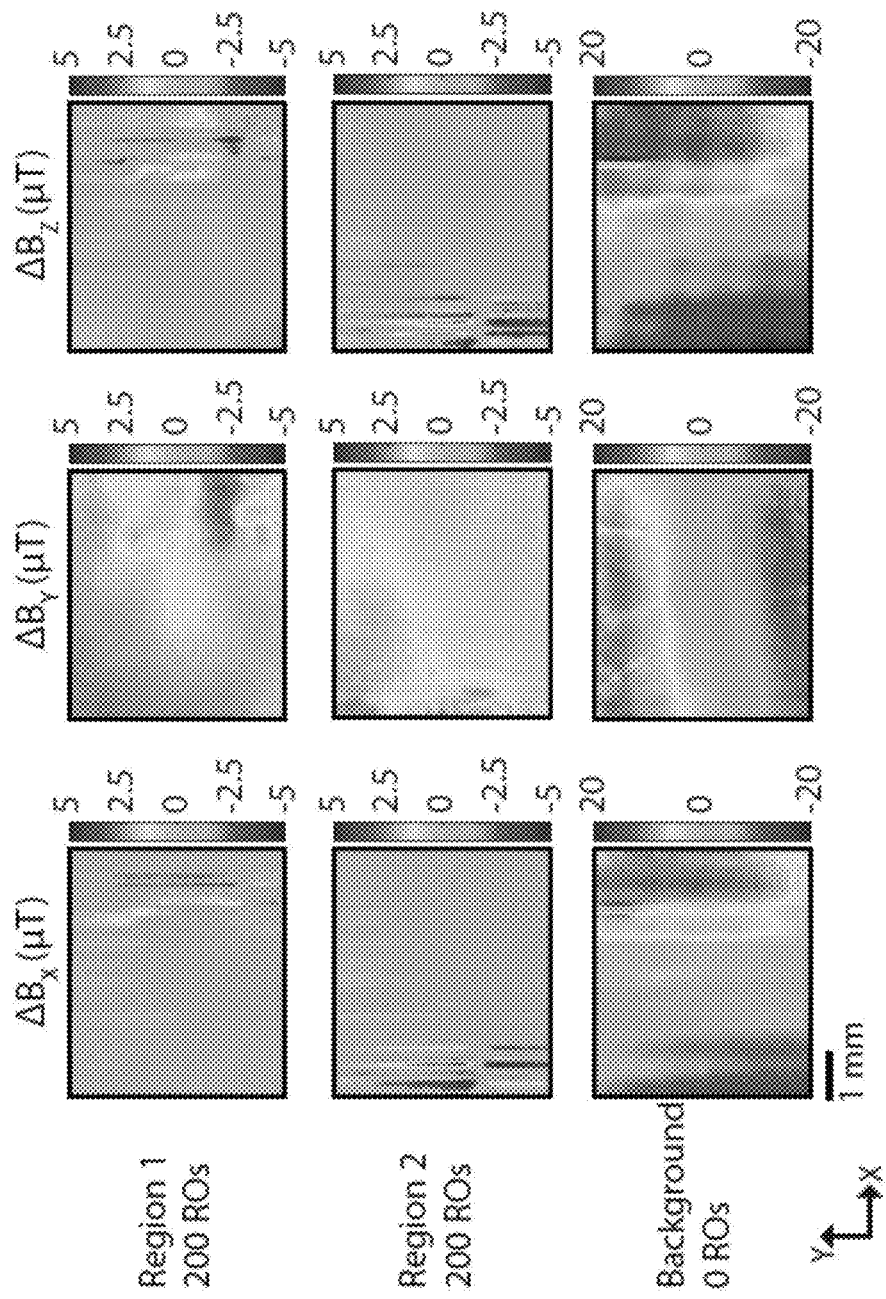
FIG. 12 shows measurement collected with a 40 micron NV layer according to embodiments of the present disclosure.

In FIG. 12, a larger measurement stand-off distance using a 40 micron NV layer is illustrated according to embodiments of the present disclosure. A diamond with a thicker NV layer was used to take the same vector measurements presented in FIG. 5. The thicker NV layer results in a larger effective measurement stand-off distance, resulting in lower resolution images of the spatial variation of the magnetic field.

An additional 5 mm×5 mm×0.5 mm diamond was used to probe an intermediate stand-off measurement distance for both the decapsulated and intact ICs. This diamond had a 40 μm surface layer of NV centers consisting of [$^2$C]~99.95%, [$^{15}$N]~10 ppm, and [NV]~1 ppm. The diamond was placed directly on the IC with the NV layer in contact with the IC surface. The thicker NV layer gives rise to a larger effective stand-off distance because the average NV within the ensemble is farther away from the magnetic field source. The resulting magnetic field maps, shown in FIG. 12, have worsened spatial resolution for the decapsulated measurements due to the larger stand-off distance. Consequently, the subtle features seen in data presented in the main text are no longer evident.

Despite the lower resolution, such a diamond is advantageous for the optimization of measuring intact ICs where the higher spatial frequencies are already suppressed by the large stand-off distance caused by the package and the thicker NV layer will improve sensitivity due to the larger number of total NVs contributing to the signal. Another feature of the diamond that can prove advantageous for future measurements is the larger, 5 mm×5 mm area of the diamond. These larger dimensions allow for a wider field-of-view showing more of the activity from R1 and R2 simultaneously, as shown in FIG. 12 in comparison to the figures in the main text.

Referring to FIGS. 13A-D, COMSOL simulations of magnetic fields are provided from a configuration of two layers of metal wires representing the small top metal layer of the IC die and the large interconnect wires of the package. The simulations reveal that different features show up have an importance that is weighted by the stand-off distance. Small, nearby sources dominate with small stand-off distance, and large, far away sources dominate with large stand-off distance.

The stand-off distance between the NV measurement plane and the magnetic field sources impacts the measurement sensitivity and spatial resolution. The IC contains multiple layers of interconnects: eleven metal layers in the silicon die and additional metal layers in the package of the IC that connect the bond wires to the ball grid array. These structures are visible in the SEM images of the FPGA cross section shown in FIG. 4. The metal layers in the silicon die have micron to sub-micron length scales, whereas the package interconnects have 10-100 μm length scales.

The current densities in these metal layers act as sources of the measured magnetic fields. The stand-off distance of the NV layer and the sources determines which metal layer contributions dominate. The NV layer was within ~5-10 μm of the top metal layer of the die and within 300 μm of the package interconnects for the decapsulated chip. The resulting field measurements were dominated by the close, top metal layer. The resin-epoxy layer of the intact chip increased the stand-off distance of the NV plane to 500 μm from the top metal layer and 800 μm from the package interconnects. The resulting field measurements for the intact chip were dominated by the large and distant package interconnects.

This near- and far-field behavior of static magnetic fields is demonstrated using finite element analysis modeling with the commercial finite element software COMSOL 5.4 (Comsol, Inc.). The model geometry, depicted in FIGS. 13A-D, includes the 21.6 μm wide wires of the top metal layer with 12.6 μm inter-wire spacing and the 100 μm wide wires of the package interconnects with 100 μm inter-wire spacing. The two layers are defined in the X-Y plane and are separated in Z by the 300 μm of the silicon die. The governing magnetostatic equation $\vec{\nabla} \times H = J$ is solved for the model geometry with μH=B, with a magnetic insulation boundary condition, n×A=0 for $B=\vec{\nabla} \times A$, and a current of 180 mA applied with reverse bias on a subset of adjacent wires in each layer. A tetrahedral mesh was used consisting of elements half the size of the 12.6 μm wire spacing in the vicinity of the top metal layer, and scaled up for regions of the computational domain far away from the wires.

Figure 13A:
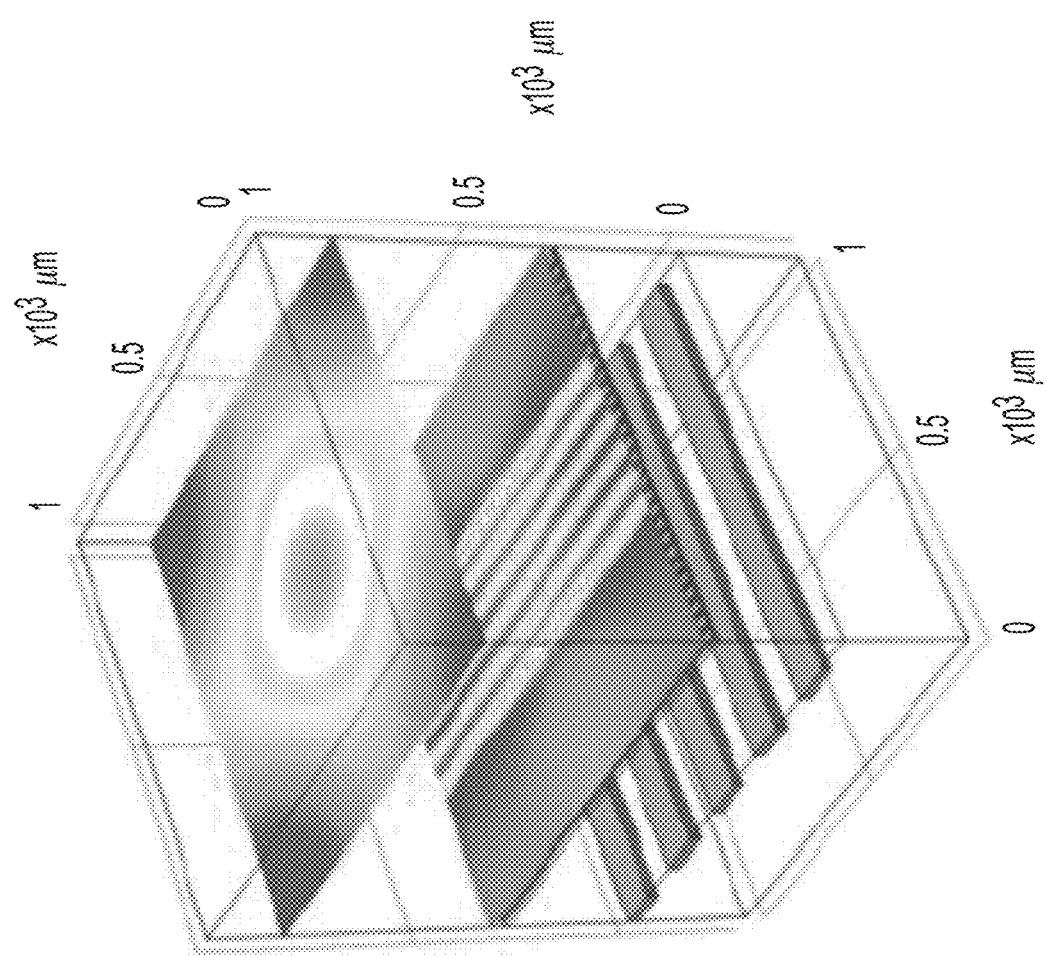
FIGS. 13A-D shows the results of COMSOL simulations of magnetic fields of an exemplary IC according to embodiments of the present disclosure.
Figure 13B:
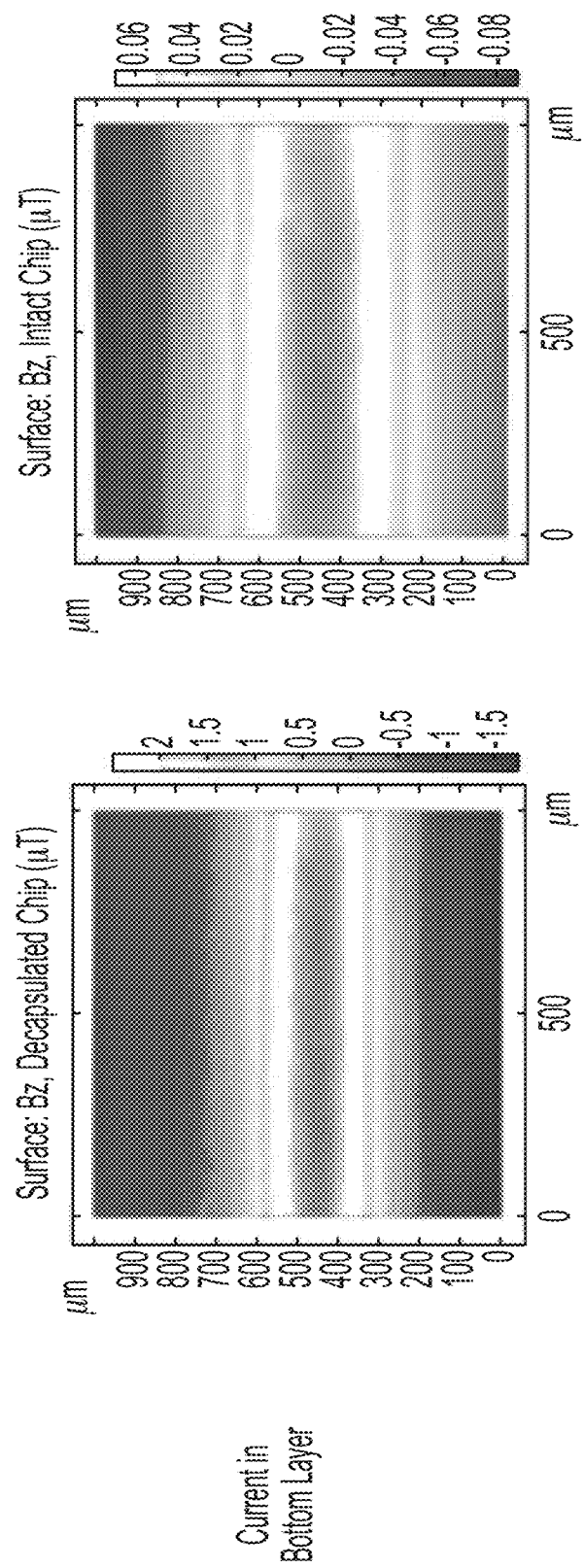
Figure 13C:
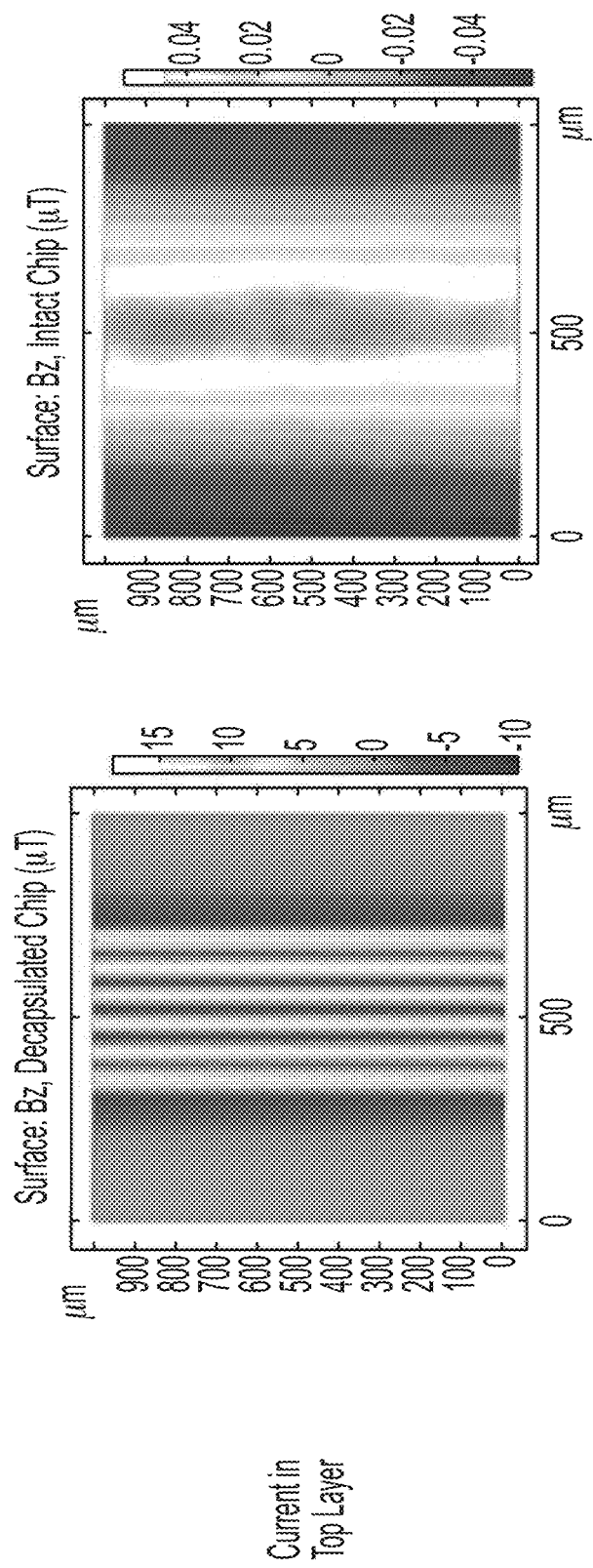
Figure 13D:
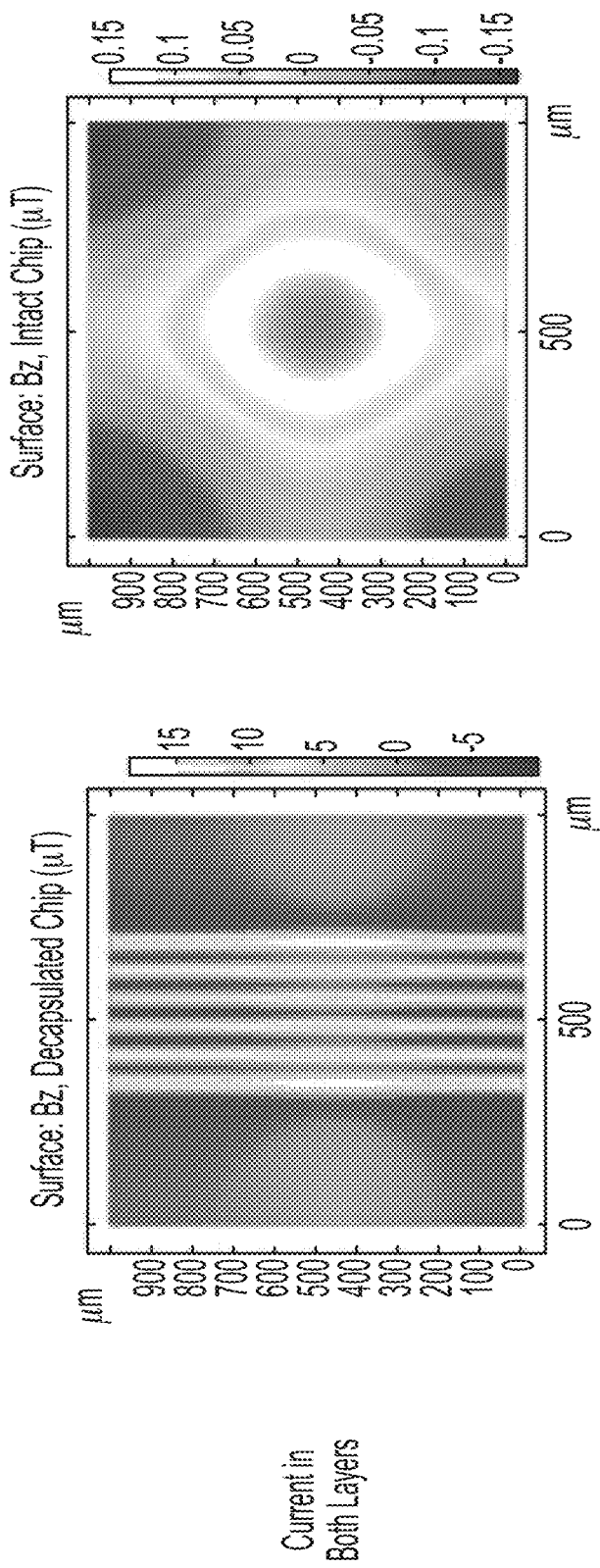

The magnetic inductance B is solved for everywhere in the domain using COMSOL's Magnetic Fields (mf) module. The calculation is completed in two stages: the current density in the wire domains is initially solved for using the applied current condition and the electrical conductivity of the wires, σ=6e7 S/m; the current density is then used as the source term to determine the magnetostatic fields. FIGS. 13A-D plots the resulting magnetic fields for three cases: (i) a current bias applied to the wires in both metal layers (FIG. 13D), (ii) a current bias applied to wires in only the top metal layer (FIG. 13C), (iii) a current bias applied only to wires in the package (bottom) layer (FIG. 13B). The resulting X-Y magnetic fields for each case are plotted at two Z stand-off distances, 25 μm and 500 μm, corresponding to the decapsulated and intact chip measurement configurations respectively. For the case of current applied to both metal layers, the magnetic fields from the small wires of the top metal layer are seen to dominate for the measurement plane with small stand-off distance, whereas the magnetic fields from the wires of the bottom interconnect layer are seen to dominate for the large stand-off distance. This is consistent with our interpretation of the NV measurements presented in the main text.

Figure 14:
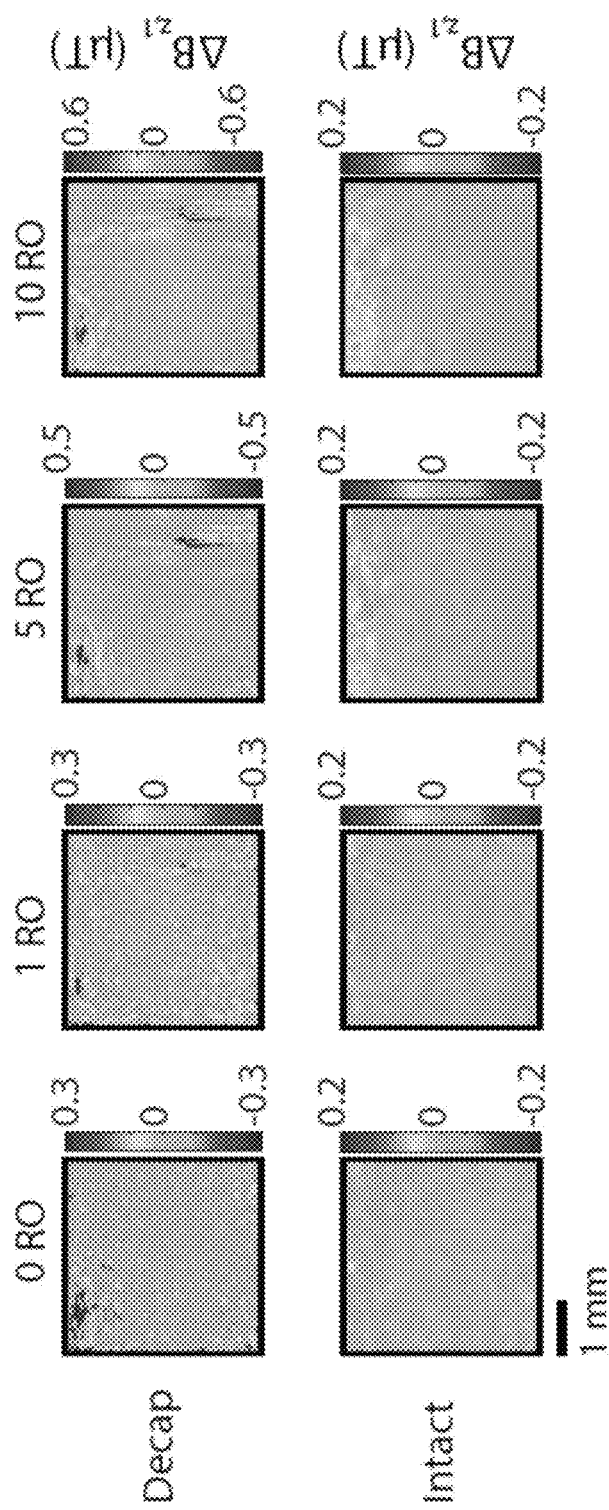
FIG. 14 shows exemplary data images of single runs of states with small numbers of ROs according to embodiments of the present disclosure.

Referring to FIG. 14, representative data images are provided of single runs of states with small numbers of RO that are used as inputs for the machine learning classification. The differences in the decapsulated chip states are observable through inspection, but the intact chip state differences are more subtle.

Representative data taken from a series of measurements for single acquisitions of low numbers of ROs are given in FIG. 14 for decapsulated and intact chips. Long term drift and large background fields are corrected for by subtracting off the nearest idle (0 RO) state in the measurement series. The measured states of the decapsulated chip are relatively easy to classify by visual inspection, consistent with the perfect accuracy in classification presented in the main text. The differences between states are more subtle in the intact data for low number of active ROs. The high classification accuracy (80%) achieved in the main text for these states illustrates the value of machine learning classifier.

Figure 15A:
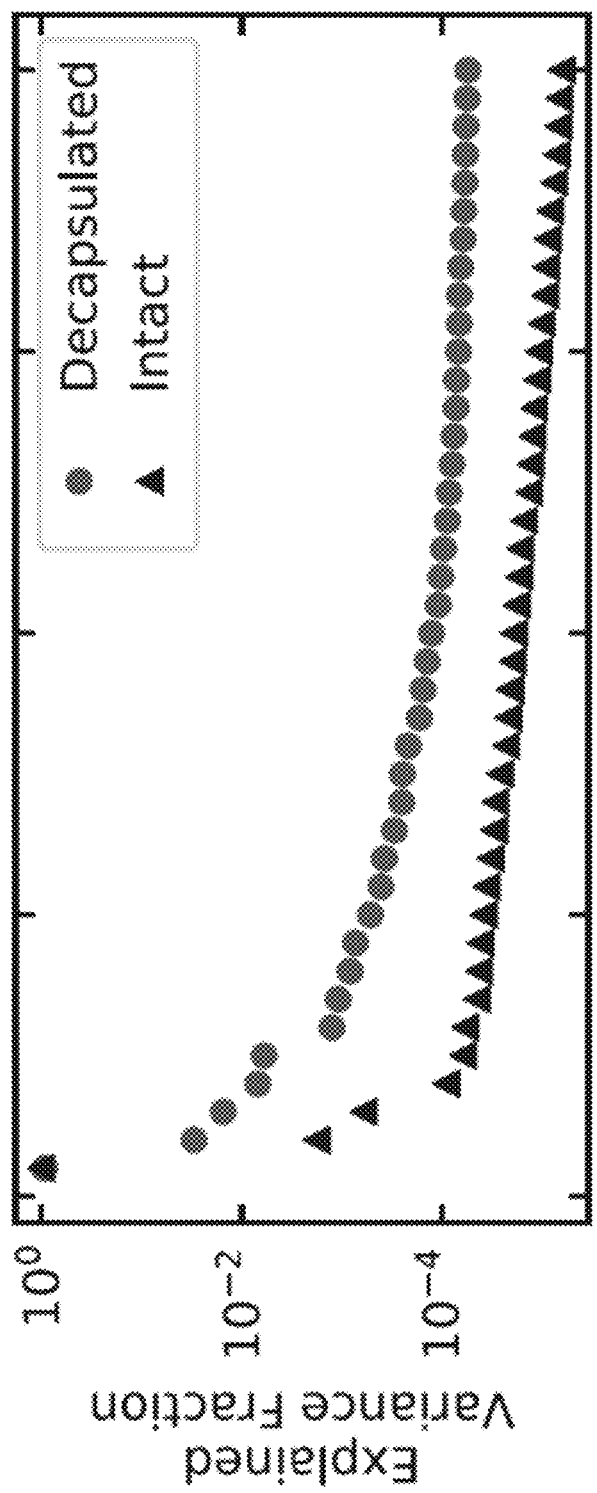
FIGS. 15A-B are graphs of fraction of variance according to embodiments of the present disclosure.
Figure 15B:
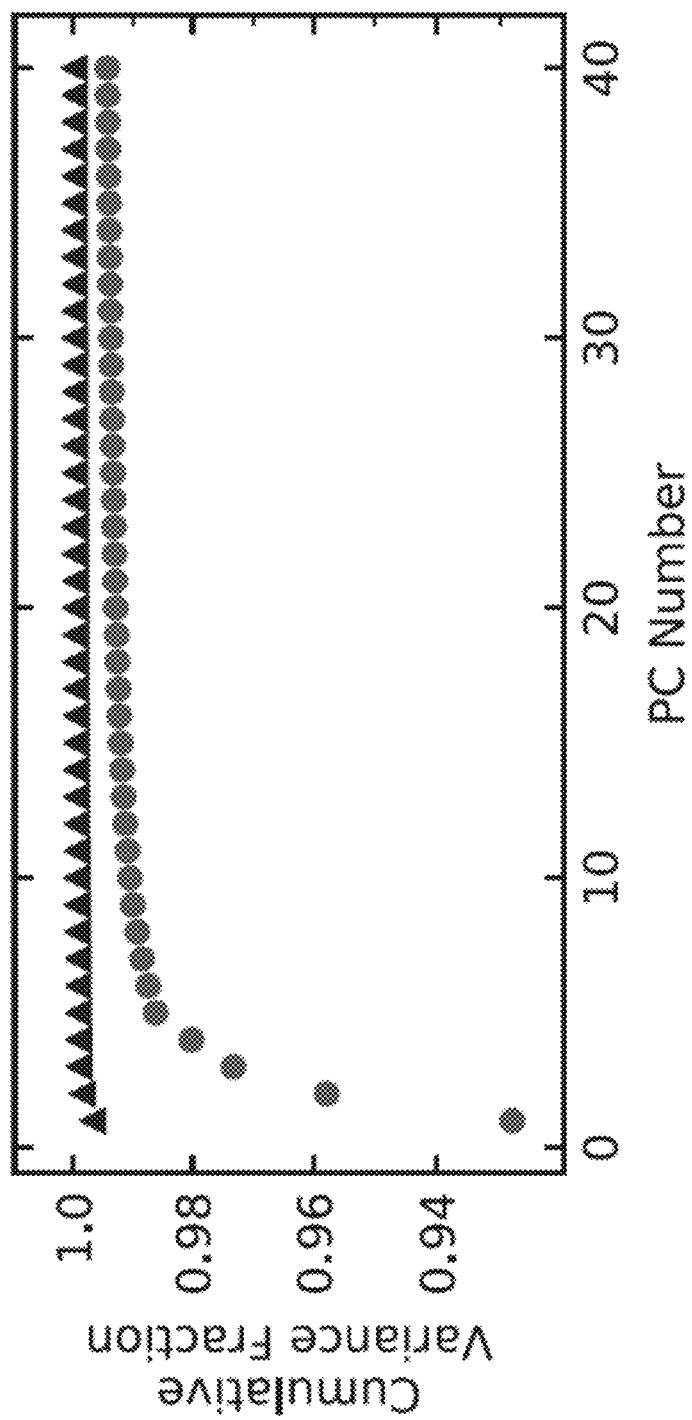

Referring to FIG. 15, the explained variance of principal components is shown according to embodiments of the present disclosure. In FIG. 15A, the fraction of variance explained by the nth principal component (PC) in the decapsulated dataset (green dots) and the intact dataset (blue triangles) are shown. In FIG. 15B, the cumulative fraction of variance explained by the first n PCs as a function of n (colors and markers are same as above). For both datasets, >99% of the variance is explained by the first 9 PCs.

Principal component analysis (PCA) is used as a dimensionality reduction tool to convert magnetic field images to a subset of projections (scores) along the first several principal components (PCs). These PCs are determined by sequentially finding axes that explain the most variance in a high-dimensional dataset such that these axes are orthogonal. Typically only a small number of scores are needed to describe a given instantiation of the dataset. Subsequent scores will only contain information about the noise in the data.

FIG. 15A shows the fraction of variance explained by the $n^{th}$ PC in both the decapsulated and intact datasets for the first 40 PCs. The first PC explains nearly all the variance in the magnetic field images, after which the explained variance drops off rapidly, ultimately depending only on noise and other RO state-independent information. FIG. 15B shows the cumulative variance fraction for the first n PCs as a function of n. For the intact dataset, the first PC alone accounts for >99% of the variance in the magnetic field images. For the decapsulated dataset, the first n=9 PCs account for >99% of the variance. The first n=9 PC scores for each image are therefore used to capture all of the non-noise based information. These 9 scores are used to train the SVM classifier.

Figure 16:
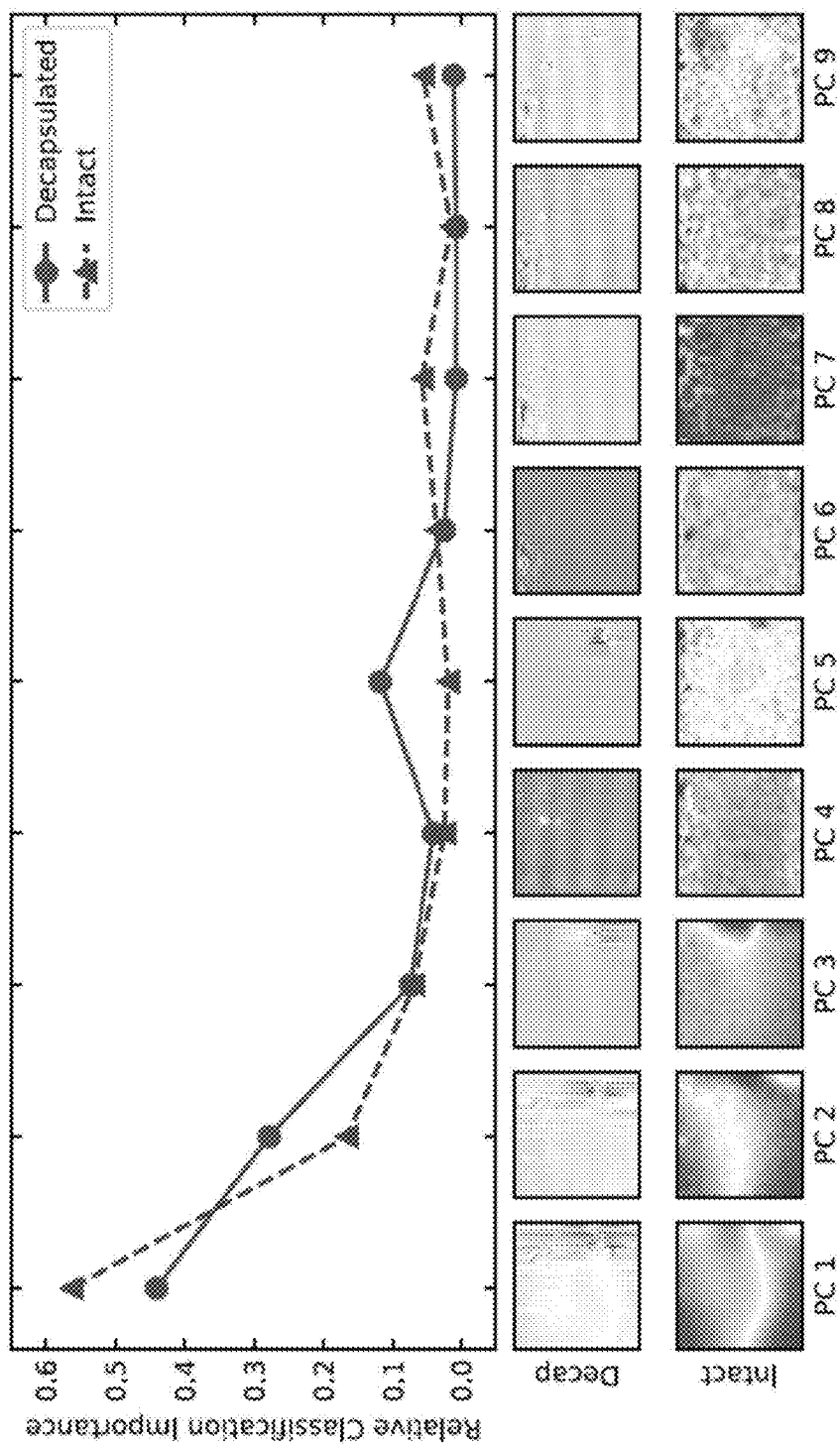
FIG. 16 is a graph of the relative importance of exemplary principal components according to embodiments of the present disclosure.

Referring to FIG. 16, the relative importance for support vector machine (SVM) classification of each of the 9 principal components (PCs) used in both the decapsulated and intact datasets are shown. The PCs that contain the most state dependent information have the most importance. Conversely, the PCs containing state independent information have the least importance.

FIG. 16 shows all of the first 9 PCs used in the chip state classification for both the decapsulated and intact datasets. A relative classification importance (defined below) is also calculated for each PC. The first two PCs of both datasets most strongly resemble the magnetic field images. As such, these PCs can naively be assumed to be the most useful for state classification, which agrees with these PCs having the highest importance factor. Additional PCs that visually capture state-independent information accordingly have low importance. For example, PC 4 in the decapsulated data set nicely captures the solder balls present in all magnetic field images, and PCs 6 through 9 capture activity in the upper left corner that is also present in all images.

In the intact data set, PCs 4 through 9 are appear noisy; however, PCs 7 and 9 both have a slightly elevated importance. The source of this importance is unknown, but given the small fields produced by the ring oscillators on top of a larger background field, it is not surprising that PCs explaining a smaller fraction of data variance carry a higher importance in classification. The overall trend of decreasing importance with PC further strengthens the assertion that 9 PC scores suffice to classify each dataset.

The definition of the relative classification importance requires details of a linear support vector machine (SVM) classifier. As described above, linear SVMs seek to create a boundary between two classes, $y \in \{-1,1\}$, of an N dimensional dataset by finding the N−1 dimensional hyperplane that maximizes the orthogonal distance from both classes. Any hyperplane is defined by its normal vector and a constant offset. For the optimal hyperplane boundary defined by the SVM classifier, we denote its normal vector as w and its constant offset as b. Any point, x, lying in this hyperplane will satisfy the equation $$w \cdot x - b = 0 \qquad \text{Equation 14}$$

The SVM classification, y', of an arbitrary point, x', will then be determined by whether this point lies above or below this plane, written mathematically as $$y'(x') = \text{sgn}(w \cdot x' - b) \qquad \text{Equation 15}$$

We can interpret the normal vector, w, as a weighting vector for each dimension in the N dimensional space and thus define a relative classification importance, $I_j$, of the $j^{th}$ dimension as $$I_j = \frac{|w_j|}{\sum_{j=1}^{N} |w_j|} \qquad \text{Equation 16}$$

Figure 17:
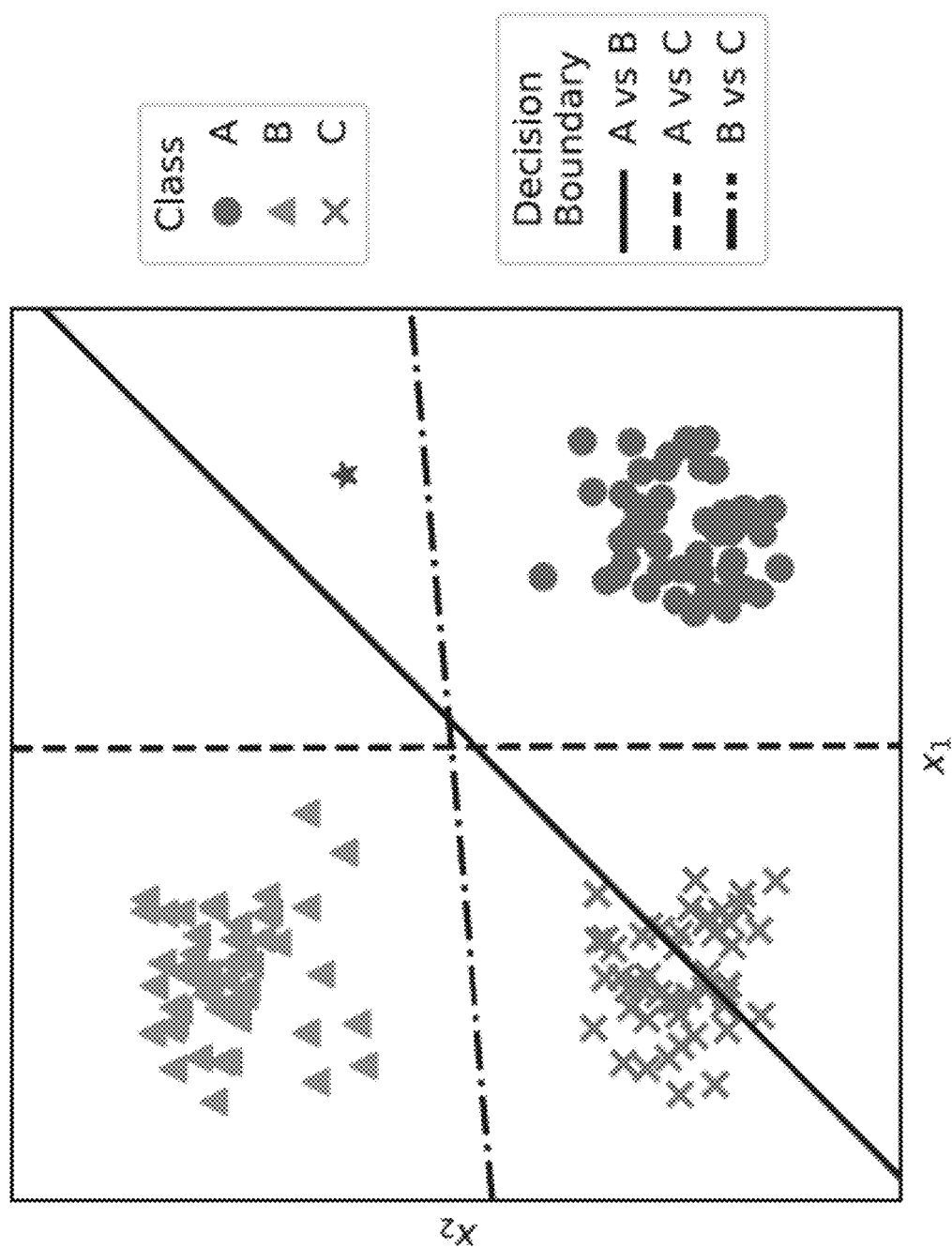
FIG. 17 is a partitioning of exemplary classes according to embodiments of the present disclosure.

In the case of M classes (where M>2), a one-versus-one classification scheme is implemented, whereby each class is compared with every other class. This yields $$K = \frac{1}{2} M(M-1)$$

hyperplane boundaries, each with a normal vector, $w_k$, and a constant, $b_k$, for k=1, 2, . . . , K. A simple example with N=2 dimensions ($x_1$ and $x_2$) and M=3 classes (A, B, and C) is shown in FIG. 17. N=2 gives lines for the hyperplanes, and M=3 gives K=3 decision boundary lines. The red star represents a hypothetical new data point in need of classification. It will get classified as A twice and B once. The red star will consequently receive a final classification of A.

The relative classification importance of the $j^{th}$ dimension for the $k^{th}$ one-versus-one comparison is defined as $$I_j^k = \frac{|w_{k,j}|}{\sum_{j=1}^{N} |w_{k,j}|} \qquad \text{Equation 17}$$

The overall relative classification importance of the $j^{th}$ dimension will then be given by $$I_j = \frac{\sum_{k=1}^{K} I_j^k}{\sum_{j=1}^{N} \sum_{k=1}^{K} I_j^k} \qquad \text{Equation 18}$$

FIG. 17 shows a simple SVM model with N=2 dimensions ($x_1$ and $x_2$) and M=3 classes (A, B, and C). Three lines represent the K=3 hyperplane decision boundaries for each class comparison. The red star represents a new data point in need of classification. It will get two votes for A and one vote for B and thus will get a classification of A.

Figure 18A:
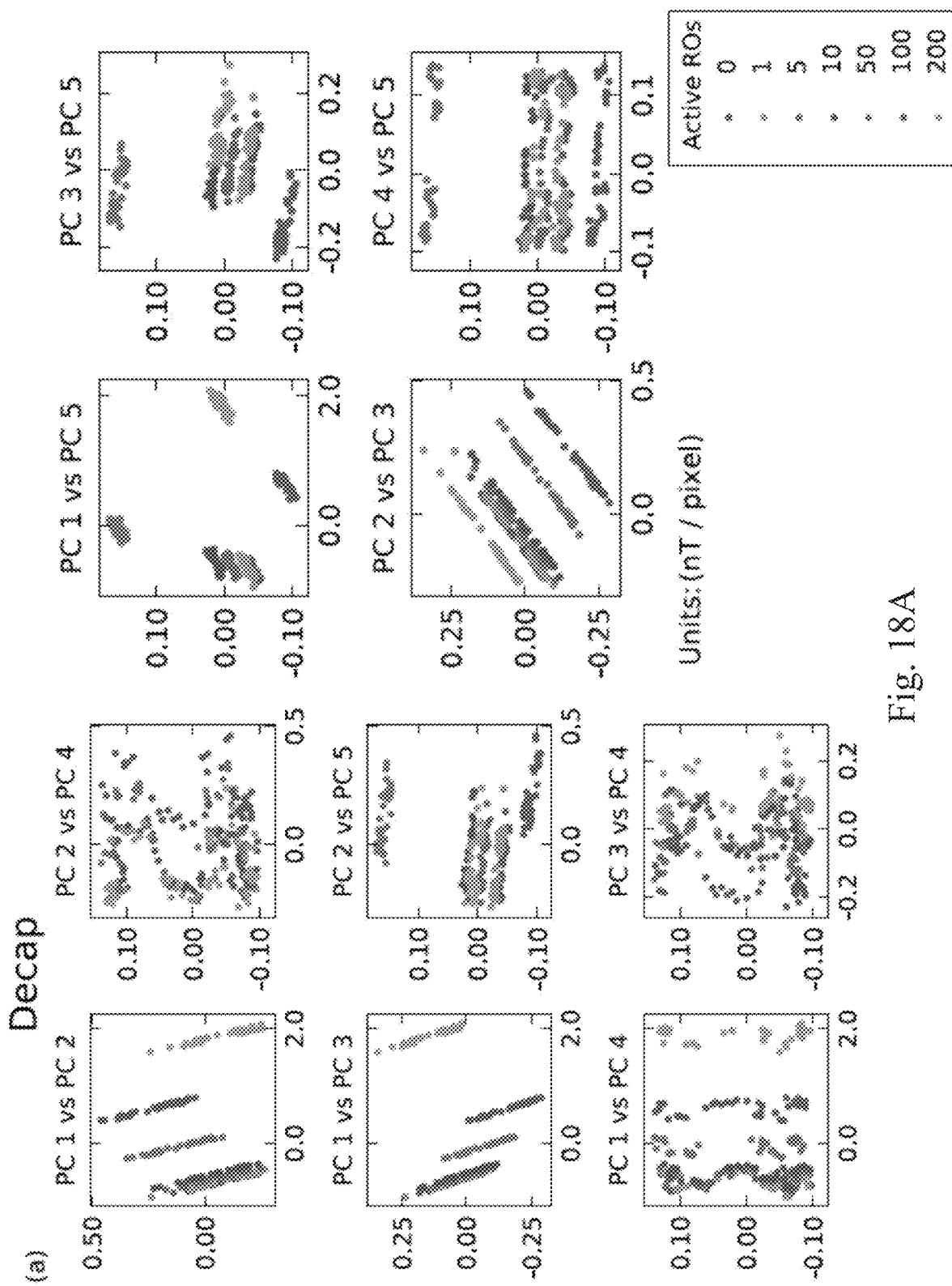
FIGS. 18A-B shows PC score plots according to embodiments of the present disclosure.
Figure 18B:
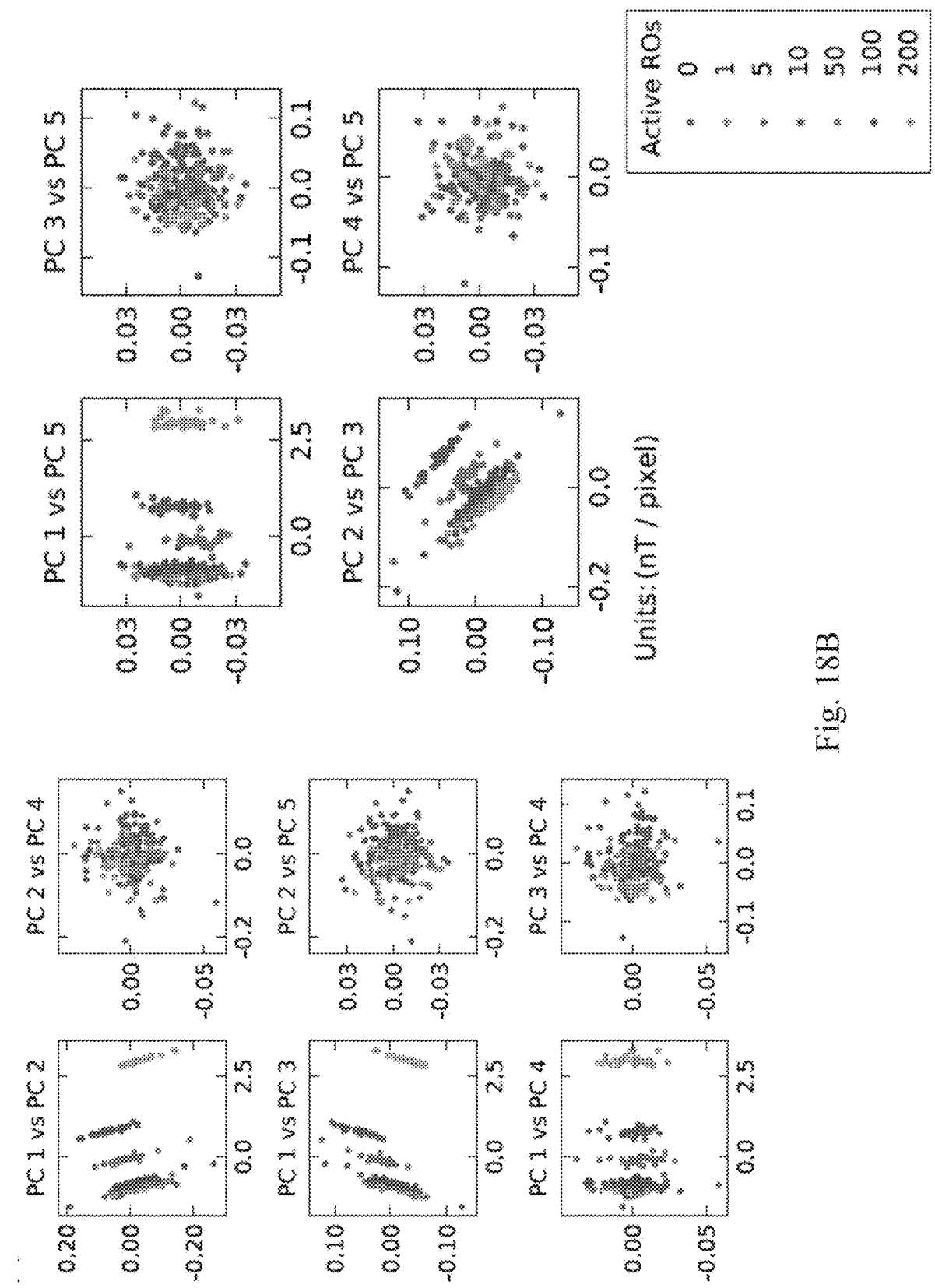

Referring to FIG. 18, additional PC score plots are provided according to embodiments of the present disclosure. FIG. 18A shows airs of PC scores plotted against each other for PCs 1 through 5 in the decapsulated (decap) dataset. Units are nT/pixel and active number of ring oscillators is color coded according to the legend. FIG. 18B provides the analogous plot for the intact dataset. Unlike the analogous plot in the main text, these plots are not on an equal aspect ratio and thus the slopes of groups of points carry less meaning.

In addition to the PC 1 score versus PC 2 score plot discussed above, FIG. 18 shows all 10 pairs of scores for PCs 1 through 5 in both the decapsulated and intact datasets. The scores are normalized by the number of pixels in each image (different for the decapsulated and intact datasets) so as to give an idea of the contribution of each PC to the magnetic field images.

PCs that are useful in chip state classification are distinguishable from those that are not. For example, in the decapsulated dataset, PC 4 does not well separate differing numbers of ring oscillators (ROs) which is expected as it had the lowest importance factor of the first 5 PCs. Furthermore, PC 5 is useful in separating 1, 5, and 10 ROs, while PCs 1 and 2 are useful in separating 50, 100, and 200 ROs. In the intact dataset, PCs 1 and 2 are the most useful and PCs 4 and 5 are the least useful as expected from their high and low importance factors, respectively.

When a training dataset contains outliers or is not linearly separable, the linear SVM classifier will struggle or even fail to find a hyperplane that will generalize well to predictions on the test set. To address this problem, implementations of SVM such as the scikit-learn class svm.SVC( ) used in this analysis will allow for some training samples to be misclassified in order to generalize well to the test set. The degree to which this is allowed is controlled by a regularization parameter, C. More precisely, a higher value of C attempts to correctly classify every training sample while a lower value of C will allow for more misclassifications of the training data. The regularization parameter thus represents a delicate balance between obtaining a good fit to the training set and generalizing well to the test set.

In order to determine the optimal value of C, a 10-fold cross validation (CV) procedure is employed. The training set is divided into 10 equal parts (folds). The first fold is used as a validation set and the remaining 9 folds are used as a new training set. A value of C is chosen and the PCA+SVM model is fit using the new training set. The model is then evaluated on the validation set and the accuracy is recorded. This process is repeated until each of the 10 folds have been used as the validation set. The CV accuracy for this value of C is then recorded as the average of the 10 validation accuracies. The entire process is repeated while varying C. Finally, the value of C that maximizes the CV accuracy is selected and the model is refitted using all 10 folds as the training set. The test set containing as yet unseen data is then used to estimate the model accuracy by evaluating the final fitted model to this dataset.

Figure 19:
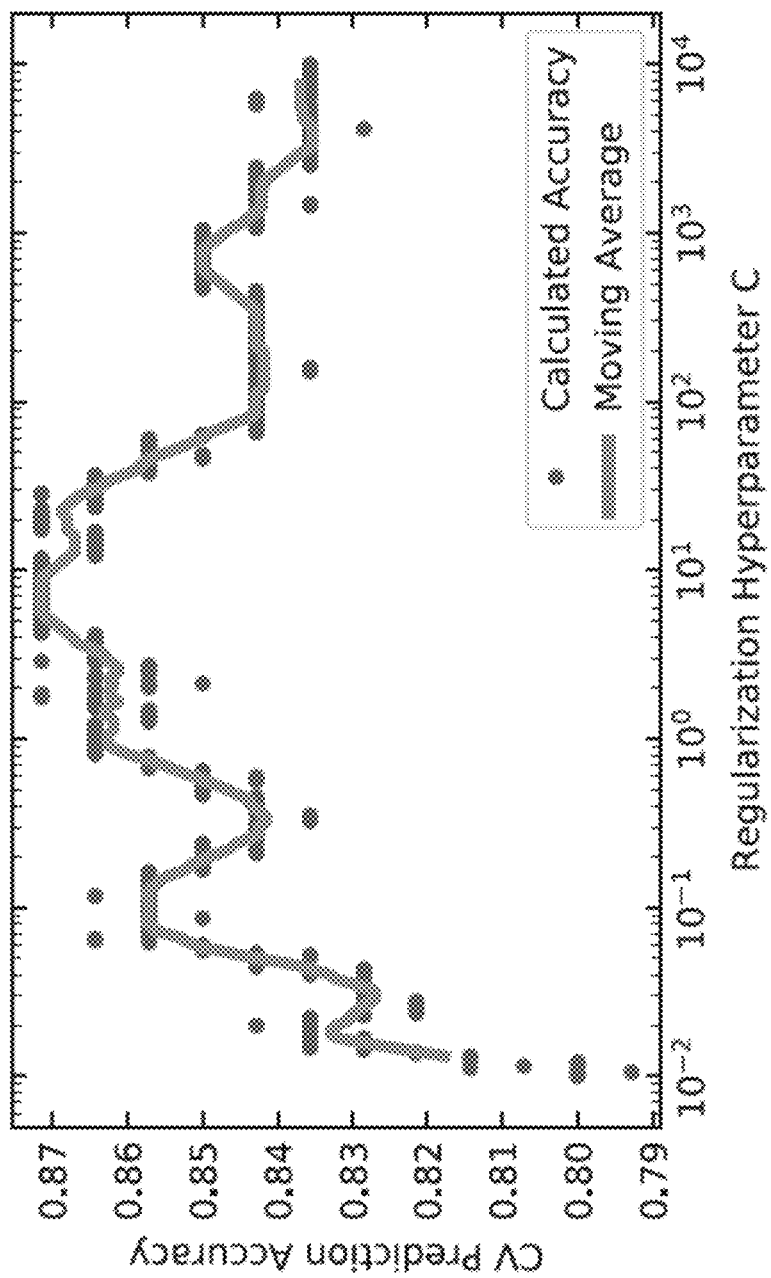
FIG. 19 is a graph of prediction accuracy against to a SVM regularization hyperparameter according to embodiments of the present disclosure.

The decapsulated dataset is easily separated by SVM and thus does not require CV of the regularization parameter. On the contrary, the intact dataset is not as easily separated and thus does require CV. FIG. 19 shows the results of this procedure. This discretization of the accuracies results from the relatively small training/validation sets (each jump in accuracy corresponds to one more correct prediction in the validation set). A 21 point moving average is included to smooth out the CV prediction accuracy. It is evident from this curve that the optimal value of C occurs at about C=6 and hence this value is chosen for the final model in the intact dataset.

FIG. 19 shows cross validation of the SVM regularization hyperparameter, C. A 21 point moving average is included to aid the eye. The optimal value is selected at C=6.

A better intuition for the spread of datapoints in the PC score plots is obtained from looking at the impact of two simple sources of extraneous variation on the value of the PC score. These sources are spatially uniform offsets, and Gaussian noise. As defined above, the PC score is $$S^{i,j} = \frac{1}{MN}\sum_{m=1}^{M}\sum_{n=1}^{N} W_{m,n}^{i} B_{m,n}^{j} \qquad \text{Equation 19}$$

where each image is composed of M×N pixels, $B^j$ is the magnetic field image, and $W^i$ is the $i^{th}$ principal component.

A spatially uniform offset, $\Delta$, is a constant value added to every pixel of an image, and can propagate through to the principal component analysis. The first two principal components of the decapsulated and intact chip analysis are used to explicitly determine the nature of $\Delta$ propagation through the PC analysis. The addition of $\Delta$ to a magnetic field image will result in an additional contribution, $\delta_\Delta S^{i,j}$, to the PC score giving $$S^{i,j} + \delta_\Delta S^{i,j} = \frac{1}{MN}\sum_{m=1}^{M}\sum_{n=1}^{N} W_{m,n}^{i}(B_{m,n}^{j} + \Delta) \qquad \text{Equation 20}$$

$$= \frac{1}{MN}\sum_{m=1}^{M}\sum_{n=1}^{N} W_{m,n}^{i} B_{m,n}^{j} +$$

$$\frac{1}{MN}\sum_{m=1}^{M}\sum_{n=1}^{N} W_{m,n}^{i}\Delta$$

The first term is just the original score, for the magnetic field $B_{m,n}^{j}$, so $\delta_\Delta S^{i,j}$ can be solved for directly. Since $\Delta$ is a spatially uniform offset, it can be pulled out of the summation $$\delta_\Delta S^{i,j} = \frac{\Delta}{MN}\sum_{m=1}^{M}\sum_{n=1}^{N} W_{m,n}^{i} \qquad \text{Equation 21}$$

Each PC score will have a different value $\delta_\Delta S^{i,j}$ from the offset $\Delta$ due to the summation. The expected slope of the line for the PC2 versus PC1 plotted in FIG. 5 of the main text is determined by $\delta_\Delta S_1/\delta_\Delta S_2$; this ratio gives a slope −0.99, consistent with the slope in the figure. Any spatially uniform variations for a given state between different images will fall on a line with this slope. For the intact dataset, the principal components are different and the expected slope of variation is $\delta_\Delta S_1/\delta_\Delta S_2 \sim -3.03$, which is consistent with FIG. 7, above.

The addition of spatial Gaussian noise ($X_{m,n}$) with zero mean and standard deviation $\alpha$ to a magnetic field image will result in an additional contribution to the PC score giving $$S^{i,j} + \delta_{\alpha X} S^{i,j} = \frac{1}{MN} \sum_{m=1}^{M} \sum_{n=1}^{N} W_{m,n}^{i}(B_{m,n}^{j} + \alpha X_{m,n}) \quad \text{Equation 22}$$

$$= \frac{1}{MN} \sum_{m=1}^{M} \sum_{n=1}^{N} W_{m,n}^{i} B_{m,n}^{j} +$$

$$\frac{1}{MN} \sum_{m=1}^{M} \sum_{n=1}^{N} W_{m,n}^{i} \alpha X_{m,n}$$

Similar to Equation 21, the contribution due to Gaussian noise can be separated, yielding $$\delta_{\alpha X} S^{i,j} = \frac{\alpha}{MN} \sum_{m=1}^{M} \sum_{n=1}^{N} W_{m,n}^{i} X_{m,n} \quad \text{Equation 23}$$

The value and properties of this term depend on the precise spatial distribution of $W_{m,n}^{i} X_{m,n}$, so no general statement can be made on the impact of Gaussian noise.

Figure 20:
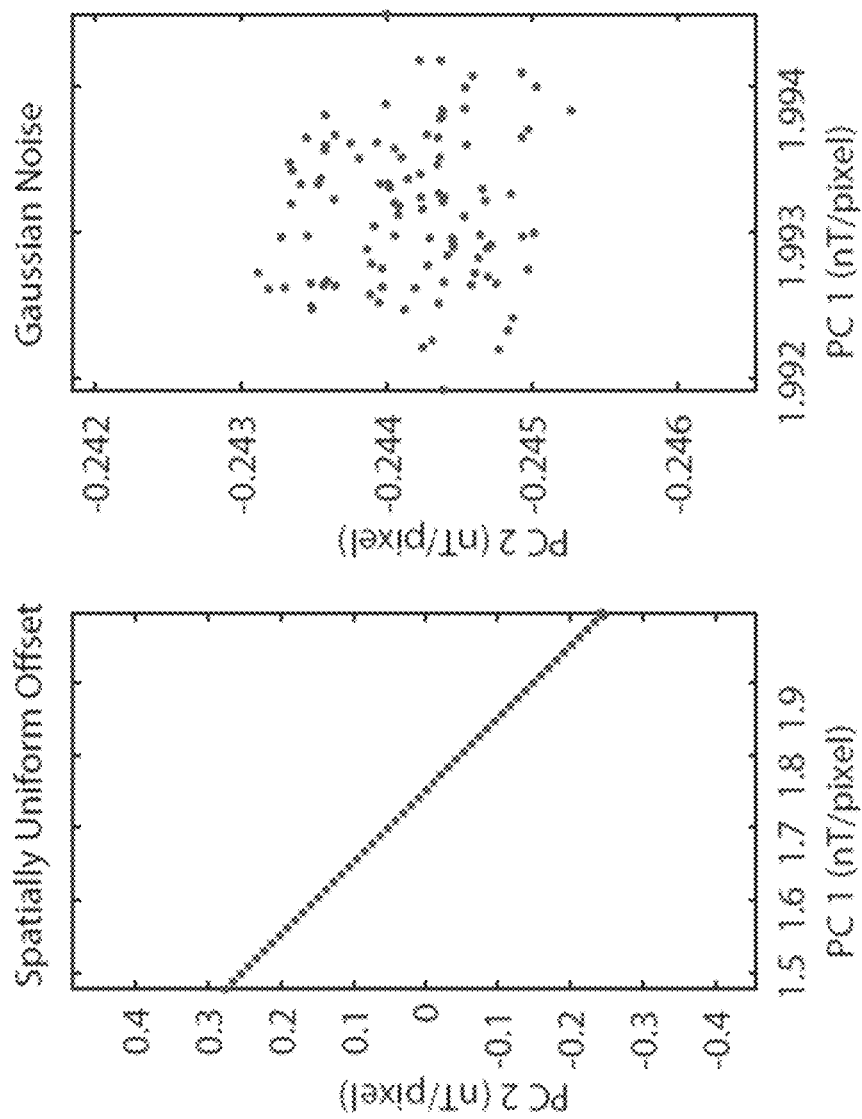
FIG. 20 shows numerical simulations for sources of variation according to embodiments of the present disclosure.

FIG. 20 shows numerical simulations for these two different possible sources of variation, spatially uniform offsets, and Gaussian noise. The plots confirm the general intuition from the results of the above derivations. In the specific case of PC1 and PC2 for the decapsulated and intact chips with $\alpha \approx \Delta$, then $\delta_\Delta S^{i,j} \gg \delta_{\alpha X} S^{i,j}$.

In particular, FIG. 20 shows the impact of different noise sources on PCA, shown for an example of the magnetic image for 200 ROs on the decapsulated chip. In FIG. 20A, a spatially uniform offset of 10 nT is added between each point along the line. In FIG. 20B, Gaussian noise with standard deviation of 100 nT is added. Note the dramatically different scales between the two plots.

As set out above, the present disclosure provides the ability to extract quantitative vector magnetic field information at the frequency being sensed. Alternative imaging approaches, such as contrast imaging, do not allow for the extraction of vector magnetic field information.

In particular, contrast imaging works by using external high frequency radio frequency (RF) or microwave (MW) fields to directly drive the ground electronic spin transitions between the $m_s=0$ and the $m_s=\pm 1$ spin states following optical initialization into the $m_s=0$ state with a green laser pulse. Green laser light (532 nm in most embodiments) will pump the NV spin state into the excited state. The spin will decay back down into the ground state through either a radiative or nonradiative pathway. This decay pathway is dependent on the initial spin state. If the NV was initially in the $m_s=0$ spin state, then the electron will preferentially decay along the radiative pathway emitting red photons. If the NV was initially in the $m_s=\pm 1$ spin state, then the electron will preferentially decay through the non-radiative singlet state. The resulting pathway-dependent fluorescence is the basis of the ability to sense external fields that couple to the NV spins for most NV embodiments.

The objective of contrast imaging is to sense an external RF or MW field that drives the spin state transition. An applied, static bias magnetic field can be used to tune the NV spin transition energy via the Zeeman interaction to be resonant with a given external RF or MW field. Given the scenario where the NV spin transition is on resonance with this external field, the expected contrast (change in fluorescence when in the ms=0 vs ms=±1 spin state) can be described through Equation 24 where Equation 25 is approximately the optical polarization rate that characterizes the influence of the laser power on initializing and pumping the spin state.

$$C_0 = \frac{(1-\beta)\xi_1 G_{op}}{(1+\beta)\gamma_1 + G_{op}} \frac{2\zeta_{01}^2}{4\zeta_{01}^2 + \gamma_2(2\gamma_1 + G_{op})/(\hbar^2 B_{mw}^2)} \quad \text{Equation 24}$$

$$G_{op} = G_{op,sat} \frac{P}{P + P_{sat}} \quad \text{Equation 25}$$

Equation 26 Is the native spin relaxation time of the NV. Equation 27 characterizes the spin dephasing rate. Equation 28 characterizes the split between different NV axes. Equation 29 is a measure of the magnetic dipole element.

$$y_1 = 1/T_1 \quad \text{Equation 26}$$

$$y_2 \quad \text{Equation 27}$$

$$\xi_1 \quad \text{Equation 28}$$

$$\xi_{01}^2 \quad \text{Equation 29}$$

The contrast is sensitive to the square of the magnetic field, so it is a power sensor and is thus not able to directly sense the amplitude of the field. This immediately limits the ability for contrast imaging to be used to characterize the vector field because of the intrinsic insensitivity to the sign (direction) of a magnetic field projection.

The contrast relation is dependent on a wide variety of factors that are specific to the sample and experimental preparation. For example, the contrast depends on laser illumination properties, diamond properties, and bias magnetic field properties. As such, spatial variations of these parameters will adversely influence the contrast and the ability to extract magnetic field information. For example, natural inhomogeneities in the diamond lattice stress/strain leads to dramatic changes in the contrast over a measurement field of view. This degrades any magnetic field information from an external magnetic source extracted via contrast measurements.

Various exemplary contrast imaging techniques are only directly applicable to measuring the projection of $B_{mw}^2$ onto an NV axis for a given measurement configuration. Accordingly, a magnetic field needs to be applied such that a given NV axis is resonant with the sample frequency of interest and restricts sampling the projection of the magnetic field along this single axis. Thus, such contrast imaging methods are inherently projective, and do not allow for extraction of the vector field.

In contrast to contrast imaging techniques, the approaches described herein are not as confined by bias field choice and are able to apply a bias magnetic field such that all NV axes (4 for the 4 crystal lattice directions) are addressable through the 4 NV directions. This simultaneous addressing of multiple NV axes enables extraction of the full Cartesian vector magnetic field from a single measurement.

Figure 21:
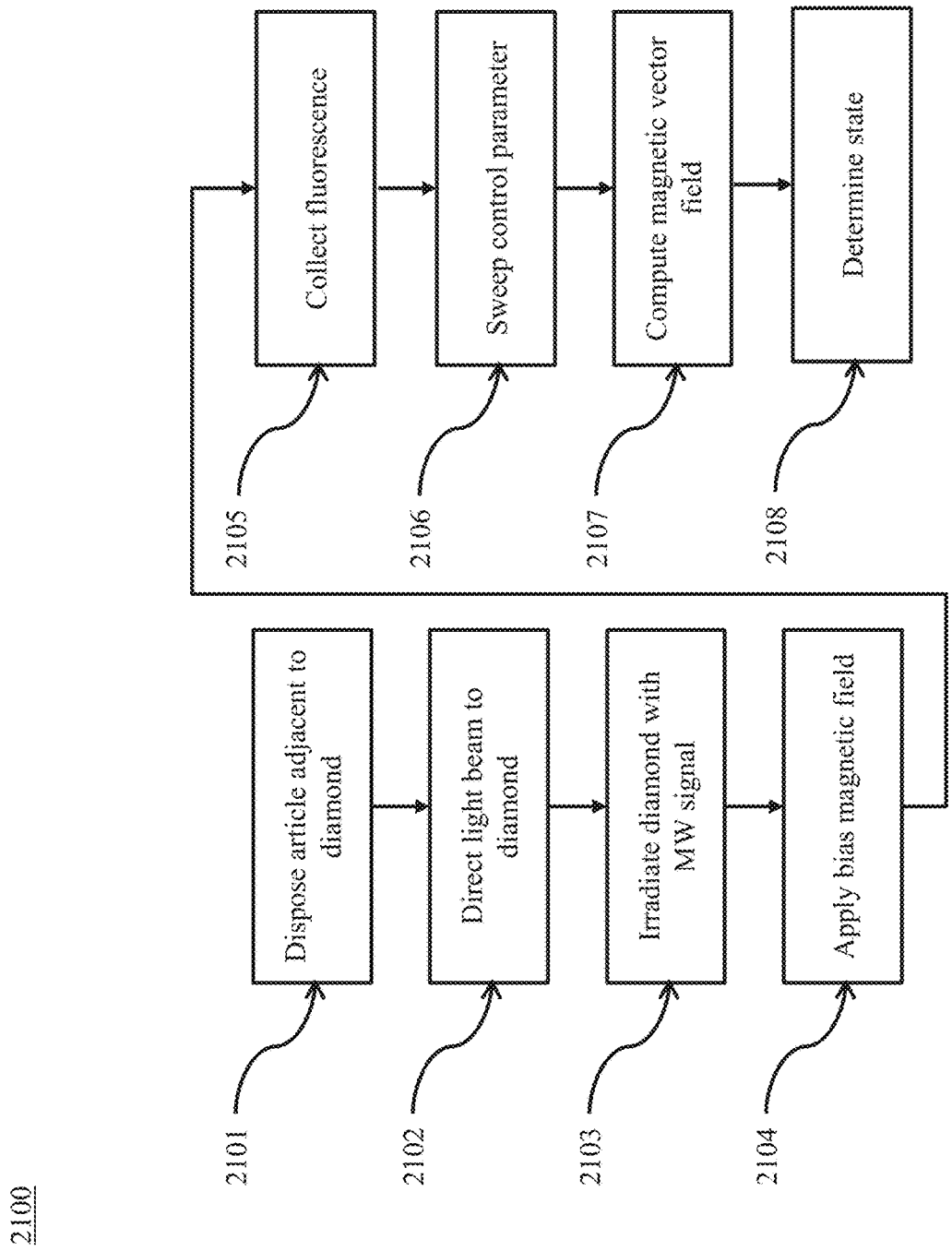
FIG. 21 is a flowchart illustrating a method for determining a state of a magnetic field-generating article according to embodiments of the present disclosure.

Referring to FIG. 21, a method for determining a state of a magnetic field-generating article is illustrated. At 2101, a single crystal diamond having a plurality of NV centers is disposed adjacent to a magnetic field-generating article, the single crystal diamond being configured to generate a fluorescent signal in response to being illuminated by a light source, wherein the magnetic field-generating article comprises an integrated circuit. At 2102, a light beam is directed from a coherent light source to the single crystal diamond. At 2103, the single crystal diamond is irradiated with a microwave (MW) signal from a MW radiation source. At 2104, a bias magnetic field is applied to the single crystal diamond from a magnetic field source. At 2105, the fluorescent signal generated by the single crystal diamond is collected by a photosensor. At 2106, at least one control parameter is swept (e.g., varied or otherwise controlled by the system), selected from: the MW signal power, MW signal frequency, MW signal duration, the strength of the bias magnetic field, or any one or more of the parameters discussed elsewhere herein. At 2107, based on the control parameters and the fluorescent signal generated by the single crystal diamond, the magnetic vector field of the magnetic field-generating article is computed. At 2108, the magnetic vector field is provided to a trained classifier and a state of the magnetic field-generating article is received therefrom.

Figure 22:
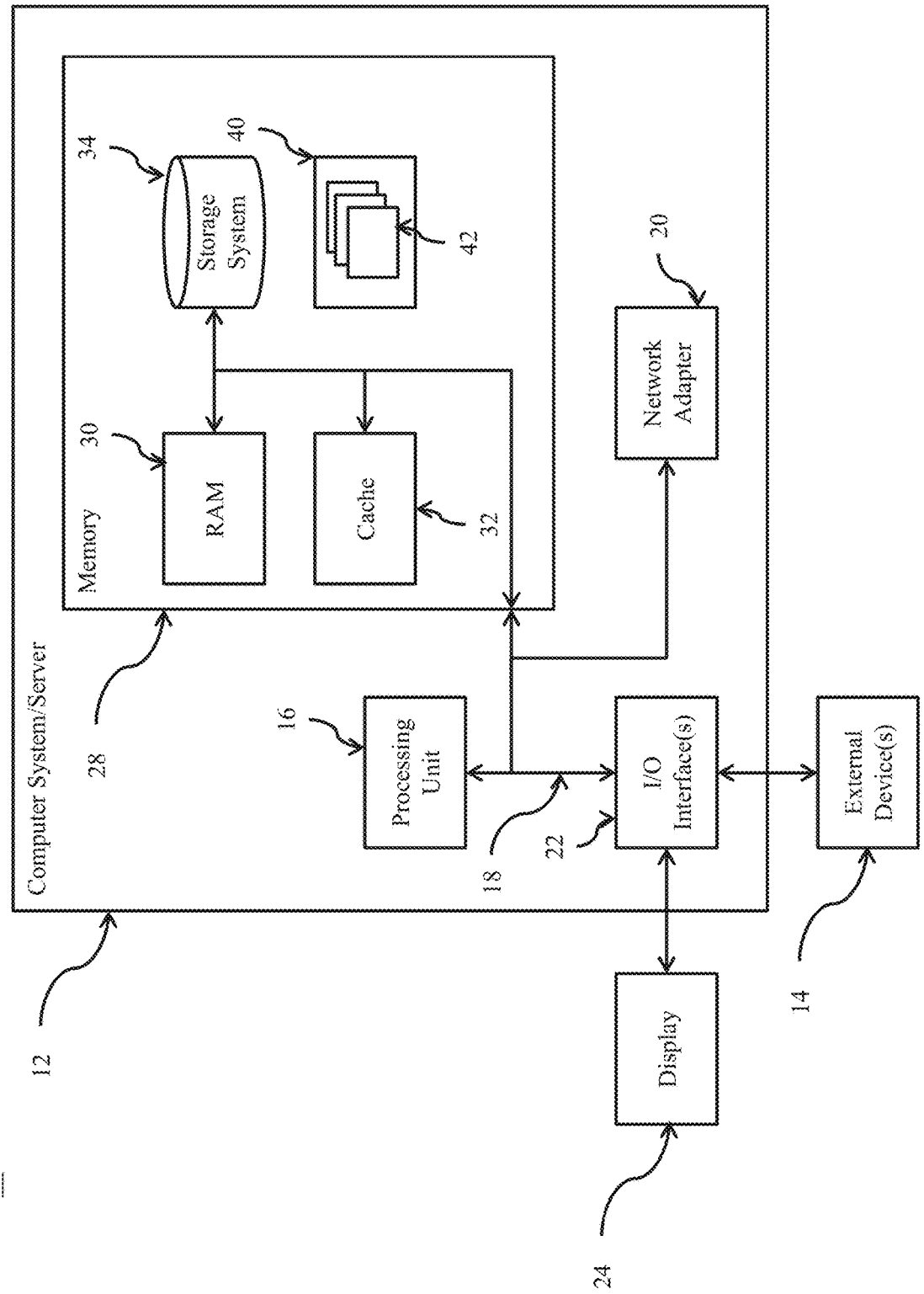
FIG. 22 depicts a computing node according to embodiments of the present disclosure.

Referring now to FIG. 22, a schematic of an example of a computing node is shown. Computing node 10 is only one example of a suitable computing node and is not intended to suggest any limitation as to the scope of use or functionality of embodiments described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 22, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, Peripheral Component Interconnect Express (PCIe), and Advanced Microcontroller Bus Architecture (AMBA).

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The present disclosure may be embodied as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a single crystal diamond having a plurality of NV centers, the single crystal diamond configured to be disposed adjacent to a magnetic field-generating article, and configured to generate a fluorescent signal in response to being illuminated by a light source;
a coherent light source configured to generate a light beam directed at the single crystal diamond;
a microwave (MW) radiation source configured to irradiate the single crystal diamond with a MW signal;
a magnetic field source configured to apply a bias magnetic field to the single crystal diamond;
a photosensor configured to collect the fluorescent signal generated by the single crystal diamond;
a computing node operatively coupled to each of the coherent light source, the MW radiation source, the magnetic field source, and the photosensor, the computing node configured to:
sweep at least one control parameter selected from: the MW signal power, MW signal frequency, MW signal duration, or the strength of the bias magnetic field, and
based on the control parameters and the fluorescent signal generated by the single crystal diamond, compute the magnetic vector field of the magnetic field-generating article.

2. The device of claim 1, wherein the coherent light source is pulsed, and the computing node is configured to vary the coherent source pulse duration.

3. The device of claim 1, wherein the magnetic field-generating article comprises an integrated circuit.

4. The device of claim 3, wherein the integrated circuit is decapsulated.

5. The device of claim 1 wherein the computing node is further configured to perform dimensionality reduction of the magnetic vector field.

6. The device of claim 5 wherein performing dimensionality reduction comprises PCA.

7. The device of claim 3, wherein the state comprises a number of active ring oscillators of the integrated circuit.

8. The device of claim 1, wherein an incidence angle of the light beam on the single crystal diamond causes total internal reflection of the light beam within the single crystal diamond.

9. The device of claim 1, wherein a power of the coherent light source is selected so as to saturate the photosensor.

10. The device of claim 1, wherein:
a polarization of the coherent light source is aligned with a predefined NV crystal axis of the single crystal diamond; and
the computing node is configured to monitor a single resonance.

11. The device of claim 1, wherein:
a polarization of the coherent light source is configured to be equalized across a plurality of crystal axes of the single crystal diamond; and
the computing node is configured to monitor the plurality of crystal axes for vector measurements.

12. The device of claim 1, wherein the light beam is shaped by a flat-top beam shaper.

13. The device of claim 1, wherein the microwave radiation source is configured to modulate the MW signal to provide robustness to external noise.

14. The device of claim 1, wherein the microwave radiation source is configured to simultaneously drive multiple MW frequencies.

15. The device of claim 14 wherein the multiple MW frequencies are selected based on spacing of NV resonances of the single crystal diamond.

16. The device of claim 1, wherein the MW signal has a frequency of greater than or equal to 2 GHz and less than or equal to 4 GHz.

17. The device of claim 1, wherein the magnetic field source comprises a permanent magnet.

18. The device of claim 1, wherein the permanent magnet is configured to project the bias magnetic field onto each of a plurality of NV axes of the single crystal diamond in a different respective direction for each of the NV axes.

19. The device of claim 1, wherein the bias magnetic field has a strength of greater than or equal to 1 mT and less than or equal to 100 mT.

20. The device of claim 1, wherein the magnetic field source comprises a Helmholtz coil.

21. The device of claim 20 wherein the computing node is configured to differentiate a ferromagnetic component of the magnetic vector field of the magnetic field-generating article from a paramagnetic component of the magnetic vector field of the magnetic field-generating article.

22. The device of claim 1, wherein the photosensor is configured to detect wavelengths in a range of greater than or equal to 600 nm and less than or equal to 800 nm.

23. The device of claim 1, wherein the photosensor has a sampling rate of greater than or equal to 10 MHz and less than or equal to 100 MHz.

24. The device of claim 1, wherein the photosensor comprises one or more selected from the group of: a CMOS, a CCD, a photodiode array, and a single photodiode.

25. The device of claim 1, wherein the single crystal diamond comprises an NV layer having a thickness of less than or equal to 100 nm.

26. The device of claim 1, wherein the single crystal diamond has a footprint of greater than or equal to 4 mm by 4 mm.

27. The device of claim 1, wherein the single crystal diamond has a footprint of less than or equal to 100 μm by 100 μm.

28. The device of claim 1, wherein the single crystal diamond comprises an NV layer comprising Nitrogen-15.

29. The device of claim 1, wherein the single crystal diamond comprises Carbon-12.

30. The device of claim 1, wherein the single crystal diamond is configured to be disposed in contact with the magnetic field-generating article.

31. The device of claim 1, wherein the single crystal diamond is configured to be disposed spaced apart from the magnetic field-generating article.

32. The device of claim 1, wherein the single crystal diamond is disposed in a movable mount configured to move the single crystal diamond through a plurality of positions adjacent the magnetic field-generating article.

33. The device of claim 1, wherein the single crystal diamond has a ppm of NV of greater than or equal to 0.1 and less than or equal to 10.

34. The device of claim 1, wherein the single crystal diamond has a fractional lattice strain of less than or equal to 0.000001.

35. The device of claim 1, wherein the computing node is configured to sweep at least one of the control parameters selected from the group: environmental temperature of the device and environmental humidity of the device.

36. The device of claim 1, wherein the computing node is configured to sweep one or more control parameters selected from the group: a position of the single crystal diamond relative to the magnetic field-generating article and an orientation of the single crystal diamond relative to the magnetic field-generating article.

37. The device of claim 1, wherein the computing node is configured to sweep one or more control parameters selected from the group: an intensity of the light beam, a wavelength of the light beam, a beam shape of the light beam, a spot size of the light beam, a duration of the light beam, and an angle of incidence of the light beam.

38. The device of claim 1, wherein the computing node is configured to sweep one or more control parameters selected from the group: a direction of the bias magnetic field a temporal pattern of the bias magnetic field.

39. The device of claim 1, wherein the computing node is configured to sweep one or more control parameters selected from the group: photosensor gain, photosensor position, photosensor orientation, photosensor exposure time, photosensor temporal exposure pattern, photosensor sensitivity, and photosensor spectral range.

40. The device of claim 1, wherein:
the magnetic field-generating article comprises an integrated circuit; and
the computing node is configured to cause the integrated circuit to execute a computer program.

41. The device of claim 1, wherein the computing node is configured to cause a predefined current to be passed through one or more wires of the magnetic field-generating article.

42. The device of claim 1, wherein the sweeping of at least one of the control parameters by the computing node is performed in accordance with one or more measurement protocols selected from the group: CW ODMR, pulsed ODMR, Ramsey, Hahn echo, Dynamical decoupling, Rabi, and T1 relaxometry.

43. The device of claim 1, wherein the computing node is further configured to provide to the magnetic vector field of the magnetic field-generating article to an algorithm and receive therefrom a state of the magnetic field-generating article.

44. The device of claim 43 wherein the state of the magnetic field-generating article comprises an indication of one or more selected from the group: whether the magnetic field-generating article was in an operating state during the time the fluorescent signal was collected, an identity of the magnetic field-generating article, whether the magnetic field-generating article has been tampered with following fabrication, whether the magnetic field-generating article matches a predetermined profile within a predefined tolerance; information processed by the magnetic field-generating article during the time the time the fluorescent signal was collected, materials with which the magnetic field-generating article is fabricated, and whether one or more defects are present in the magnetic field-generating article.

45. The device of claim 43 wherein the algorithm comprises one or more selected from the group: a trained classifier, a convolutional neural network, a principal component analysis algorithm, and a support vector machine model.

46. The device of claim 43 wherein the computing node is further configured to provide temperature data pertaining to the magnetic field-generating article to the algorithm.

47. The device of claim 43 wherein the computing node is further configured to provide data representing the fluorescent signal to the algorithm.

48. The device of claim 43 wherein the computing node is further configured to provide data representing the structure of the magnetic field-generating article to the algorithm.

49. The device of claim 43 wherein determining the state of the integrated circuit further comprises providing linewidth, contrast, and/or temperature of the integrated circuit to the algorithm.

50. A method comprising:
directing a light beam from a coherent light source at a single crystal diamond, wherein the a single crystal diamond comprises a plurality of NV centers and is disposed adjacent to a magnetic field-generating article, wherein the single crystal diamond is configured generate a fluorescent signal in response to being illuminated;
irradiating the single crystal diamond with a MW signal generated by a microwave (MW) radiation source;
applying a bias magnetic field to the single crystal diamond by a magnetic field source;
collecting the fluorescent signal generated by the single crystal diamond by a photosensor;
sweeping, by a computing node operatively coupled to each of the coherent light source, the MW radiation source, the magnetic field source, and the photosensor, at least one control parameters selected from the group: the MW signal power, MW signal frequency, MW signal duration, and strength of the bias magnetic field, and
based on the control parameters and the fluorescent signal generated by the single crystal diamond, computing, by the computing node, a magnetic vector field of the magnetic field-generating article.

51. A non-transitory computer-readable storage medium storing instructions that, when executed by a system comprising a computing node operatively coupled to each of a coherent light source, a microwave (MW) radiation source, and a magnetic field source, cause the system to:
directing a light beam from the coherent light source at a single crystal diamond, wherein the a single crystal diamond comprises a plurality of NV centers and is disposed adjacent to a magnetic field-generating article, wherein the single crystal diamond is configured generate a fluorescent signal in response to being illuminated;
irradiate the single crystal diamond with a MW signal generated by the MW radiation source;
apply a bias magnetic field to the single crystal diamond by the magnetic field source;
collect the fluorescent signal generated by the single crystal diamond by a photosensor;
sweep at least one control parameters selected from the group: the MW signal power, MW signal frequency, MW signal duration, and strength of the bias magnetic field, and
based on the control parameters and the fluorescent signal generated by the single crystal diamond, compute a magnetic vector field of the magnetic field-generating article.

52. A method comprising:
receiving fluorescence data representing a fluorescent signal generated by a single crystal diamond comprising a plurality of NV centers and disposed adjacent a magnetic field-generating article;
receiving parameter data representing one or more of a plurality of parameters, wherein the plurality of parameters characterize one or more selected from: a microwave signal irradiating the single crystal diamond, a bias magnetic field applied to the single crystal diamond, a light beam incident on the single crystal diamond, and a photosensor used to collect the fluorescent signal; and processing the received fluorescence data and the received parameter data to generate magnetic vector field data representing a magnetic vector field of the magnetic field-generating article.

53. The method of claim 52, further comprising applying one or more algorithms to generate, based the magnetic vector field data, state data representing a state of the magnetic field-generating article.

54. The method of claim 53, wherein generating the state data is further based on temperature data pertaining to the magnetic field-generating article.

55. The method of claim 53, wherein generating the state data is further based on the fluorescence data.

56. The method of claim 53, wherein generating the state data is further based on data representing a structure of the magnetic field-generating article.

57. The method of claim 53, wherein the one or more algorithms comprise one or more selected from the group: a trained classifier, a convolutional neural network, a principal component analysis algorithm, and a support vector machine model.

58. The method of claim 53, wherein the generated state data indicates whether the magnetic field-generating article was in an operating state during a predetermined time period.

59. The method of claim 53, wherein the generated state data indicates an identity of the magnetic field-generating article.

60. The method of claim 53, wherein the generated state data indicates whether the magnetic field-generating article has been tampered with following fabrication.

61. The method of claim 53, wherein the generated state data indicates whether the magnetic field-generating article matches a predetermined profile within a predefined tolerance.

62. The method of claim 53, wherein the generated state data indicates information processed by the magnetic field-generating article during a predetermined time period.

63. The method of claim 53, wherein the generated state data indicates materials with which the magnetic field-generating article is fabricated.

64. The method of claim 53, wherein the generated state data indicates whether one or more defects are present in the magnetic field-generating article.

* * * * *